US008501499B2

(12) United States Patent (10) Patent No.: US 8,501,499 B2
Sundararajan et al. (45) Date of Patent: Aug. 6, 2013

(54) ADAPTIVE RECIPE SELECTOR

(75) Inventors: Radha Sundararajan, Dripping Springs, TX (US); Merritt Funk, Austin, TX (US); Lee Chen, Austin, TX (US); Barton Lane, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 252 days.

(21) Appl. No.: 13/073,237

(22) Filed: Mar. 28, 2011

(65) Prior Publication Data

US 2012/0252141 A1    Oct. 4, 2012

(51) Int. Cl.
*H01L 21/00* (2006.01)
*H01L 21/461* (2006.01)
*H01L 21/302* (2006.01)

(52) U.S. Cl.
USPC ............... 438/5; 438/706; 438/710; 438/712; 438/716; 438/907; 257/E21.218; 257/E21.314; 257/E21.528

(58) Field of Classification Search
USPC .................. 257/E21.218, E21.314, E21.528; 438/5, 706, 710, 712, 716, 907
See application file for complete search history.

(56) References Cited

U.S. PATENT DOCUMENTS

| | | | |
|---|---|---|---|
| 4,509,248 A * | 4/1985 | Spitzer et al. | 438/64 |
| 6,972,524 B1 | 12/2005 | Marakhtanov et al. | |
| 7,777,179 B2 | 8/2010 | Chen et al. | |
| 7,875,859 B2 | 1/2011 | Chen et al. | |
| 7,894,927 B2 | 2/2011 | Funk et al. | |
| 2009/0162950 A1 | 6/2009 | Kuboi et al. | |
| 2009/0242513 A1 | 10/2009 | Funk et al. | |
| 2010/0036514 A1 | 2/2010 | Funk et al. | |
| 2010/0036518 A1 * | 2/2010 | Funk et al. | 700/121 |

OTHER PUBLICATIONS

Skogestad, S. & Postlethwaite I., "Multivariable Feedback Control: Analysis and Design"; (2nd edition), (2005) Wiley, Chichester, UK. (ISBN 0-470-01168-8); {pp. 75-86 and 431-450}.

* cited by examiner

*Primary Examiner* — Mohsen Ahmadi
(74) *Attorney, Agent, or Firm* — Manuel Madriaga

(57) ABSTRACT

The invention provides a method of processing a wafer using Ion Energy (IE)-related multilayer process sequences and Ion Energy Controlled Multi-Input/Multi-Output (IEC-MIMO) models and libraries that can include one or more measurement procedures, one or more IEC-etch sequences, and one or more Ion Energy Optimized (IEO) etch procedures. The IEC-MIMO process control uses dynamically interacting behavioral modeling between multiple layers and/or multiple IEC etch sequences. The multiple layers and/or the multiple IEC etch sequence can be associated with the creation of lines, trenches, vias, spacers, contacts, and gate structures that can be created using IEO etch procedures.

18 Claims, 26 Drawing Sheets

200A

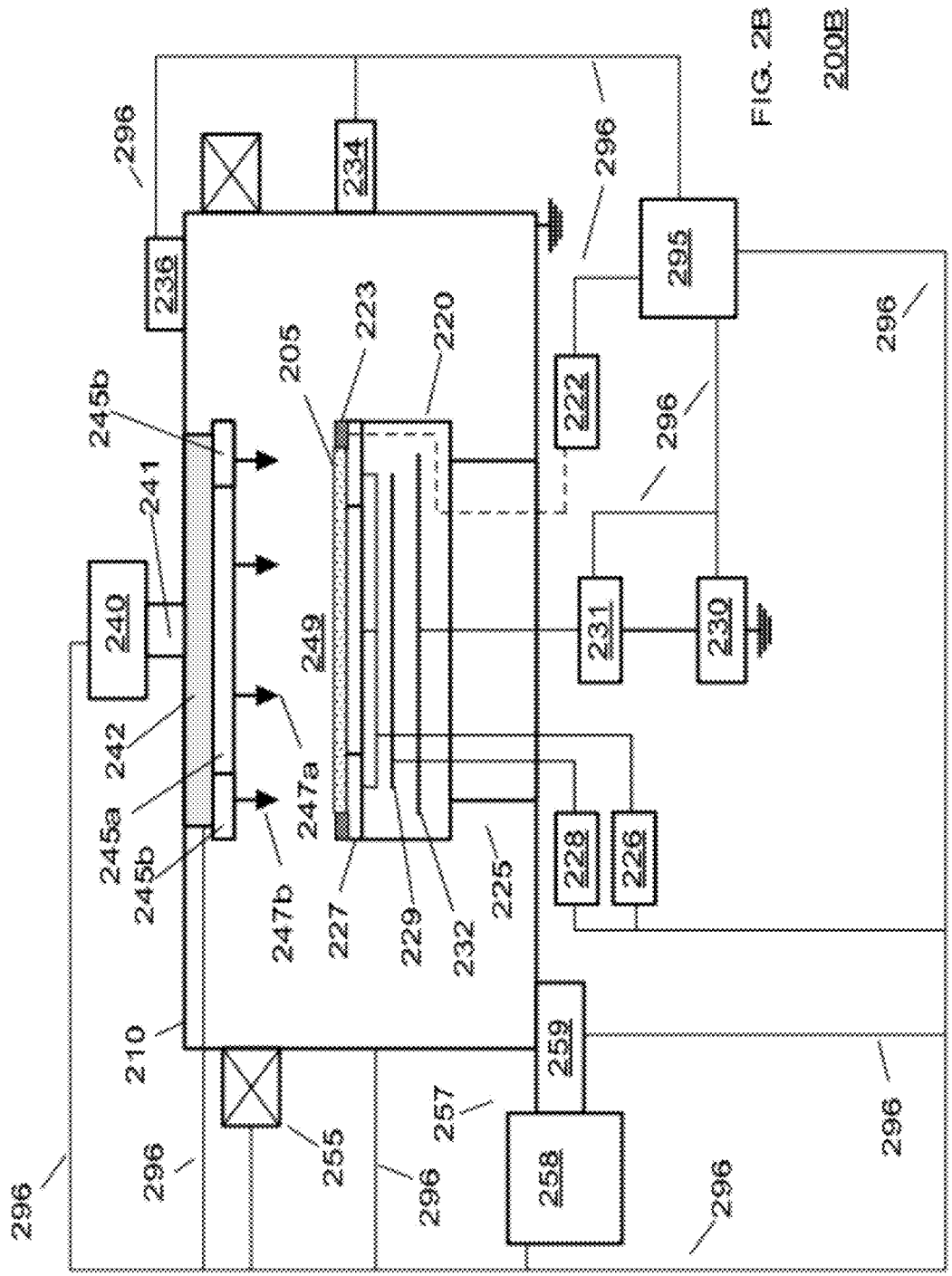

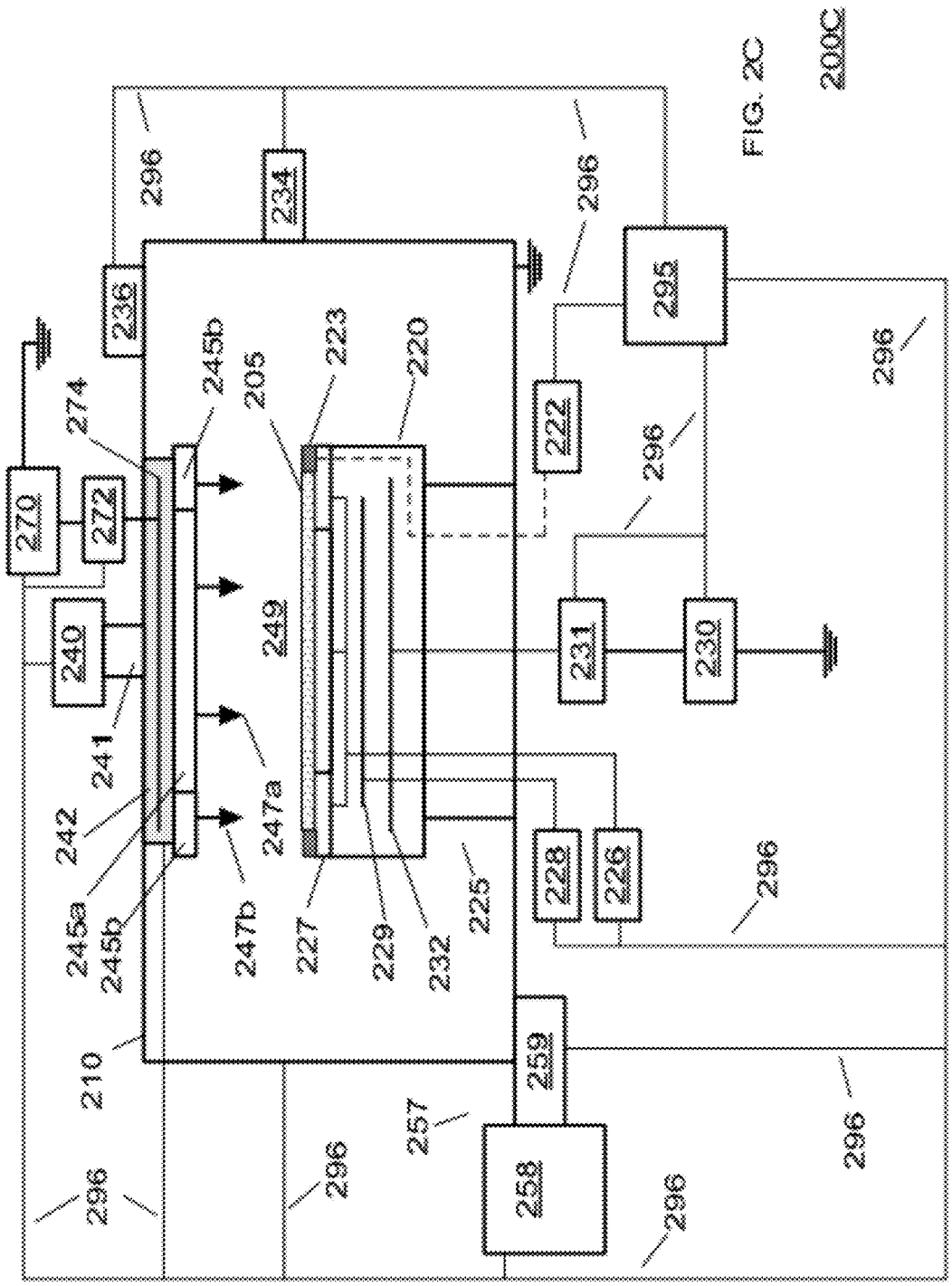

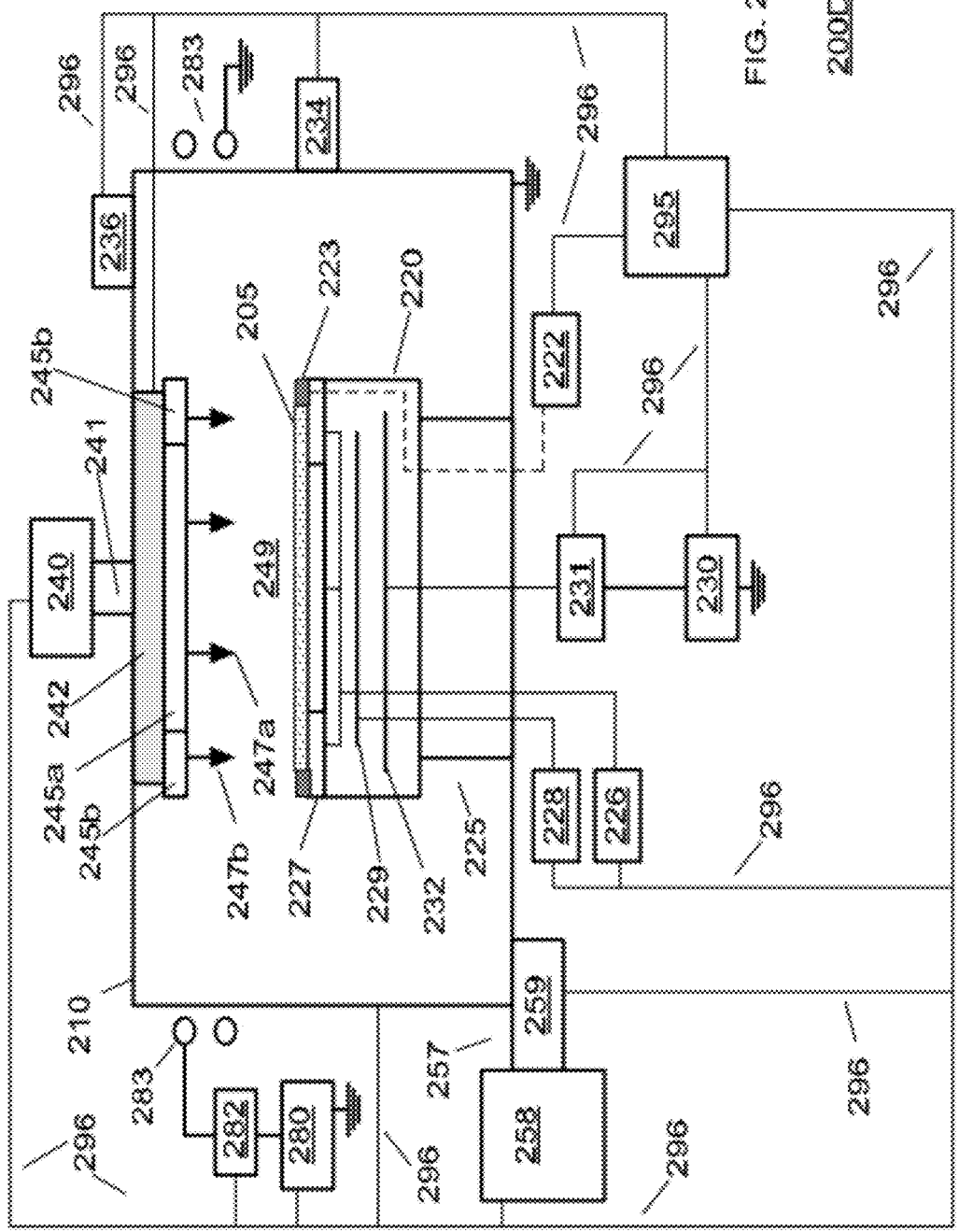

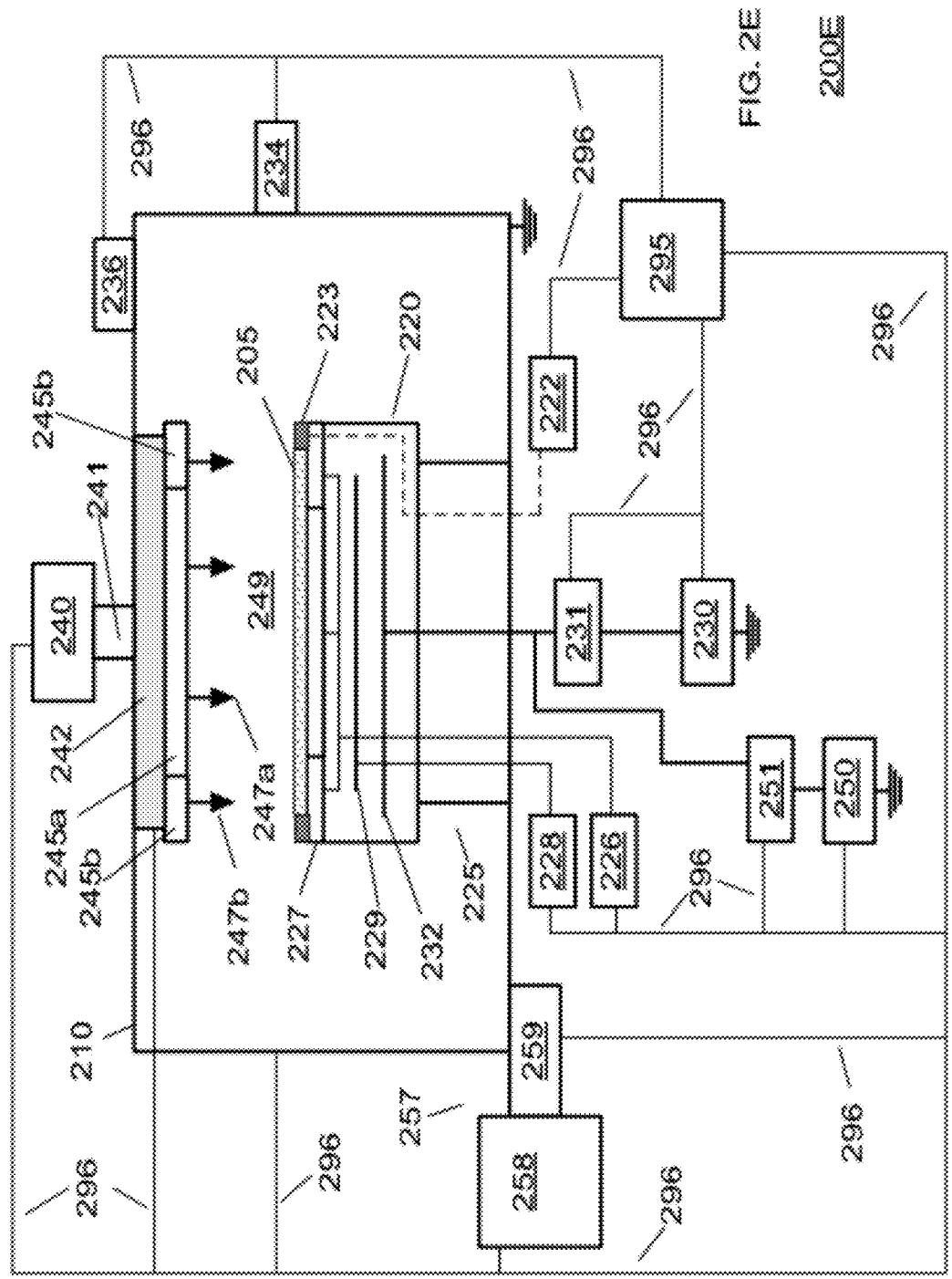

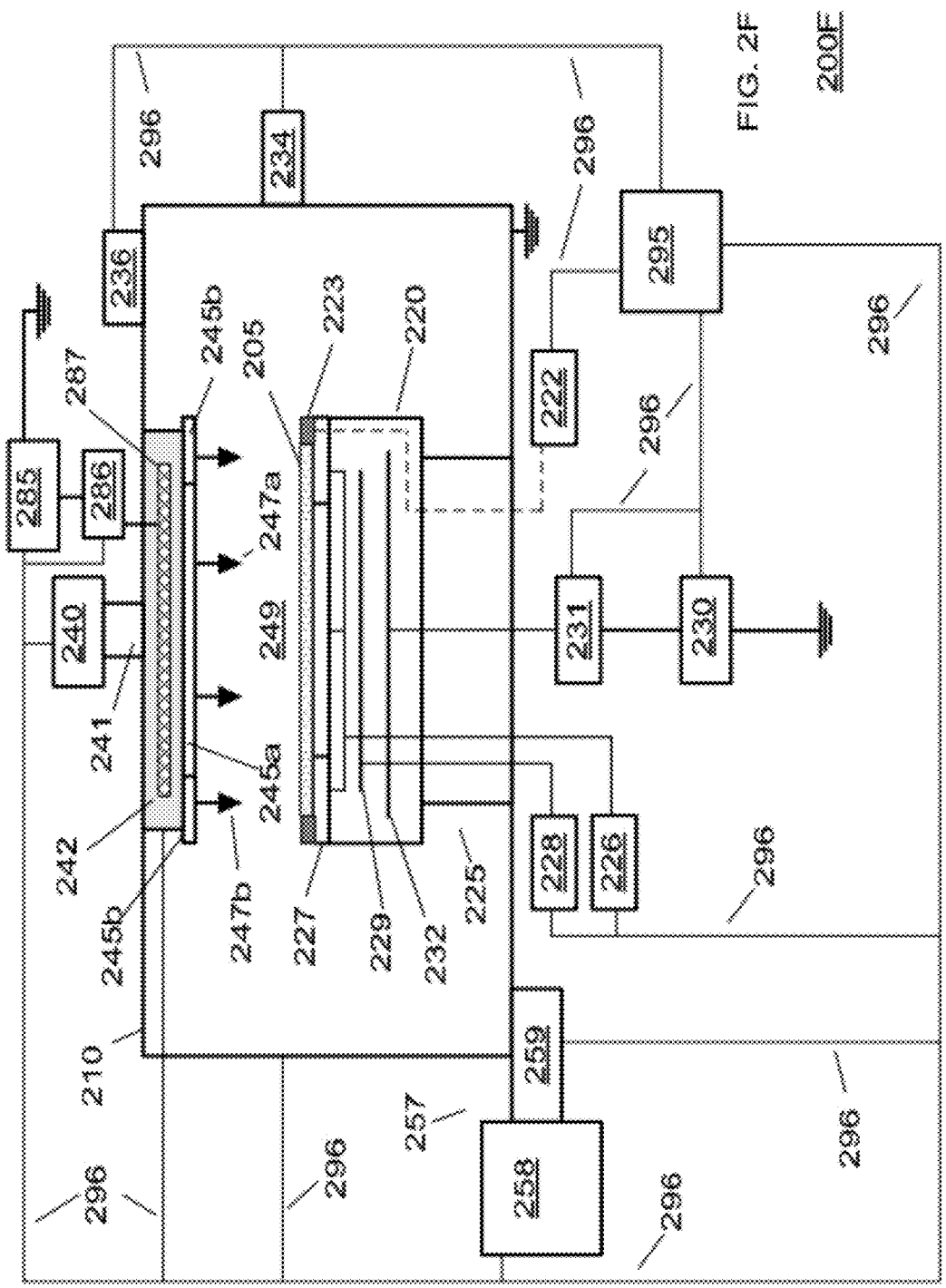

200G

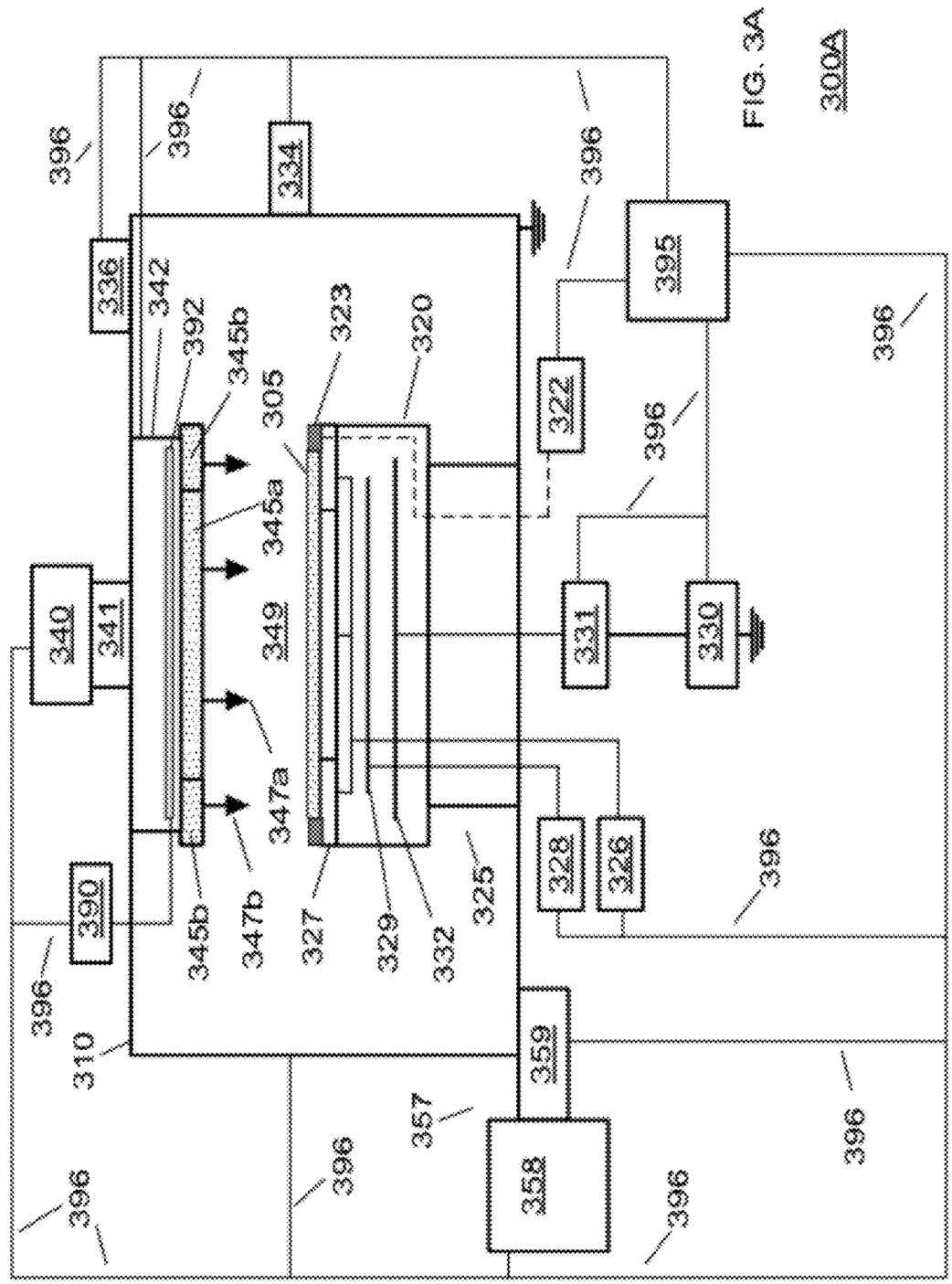

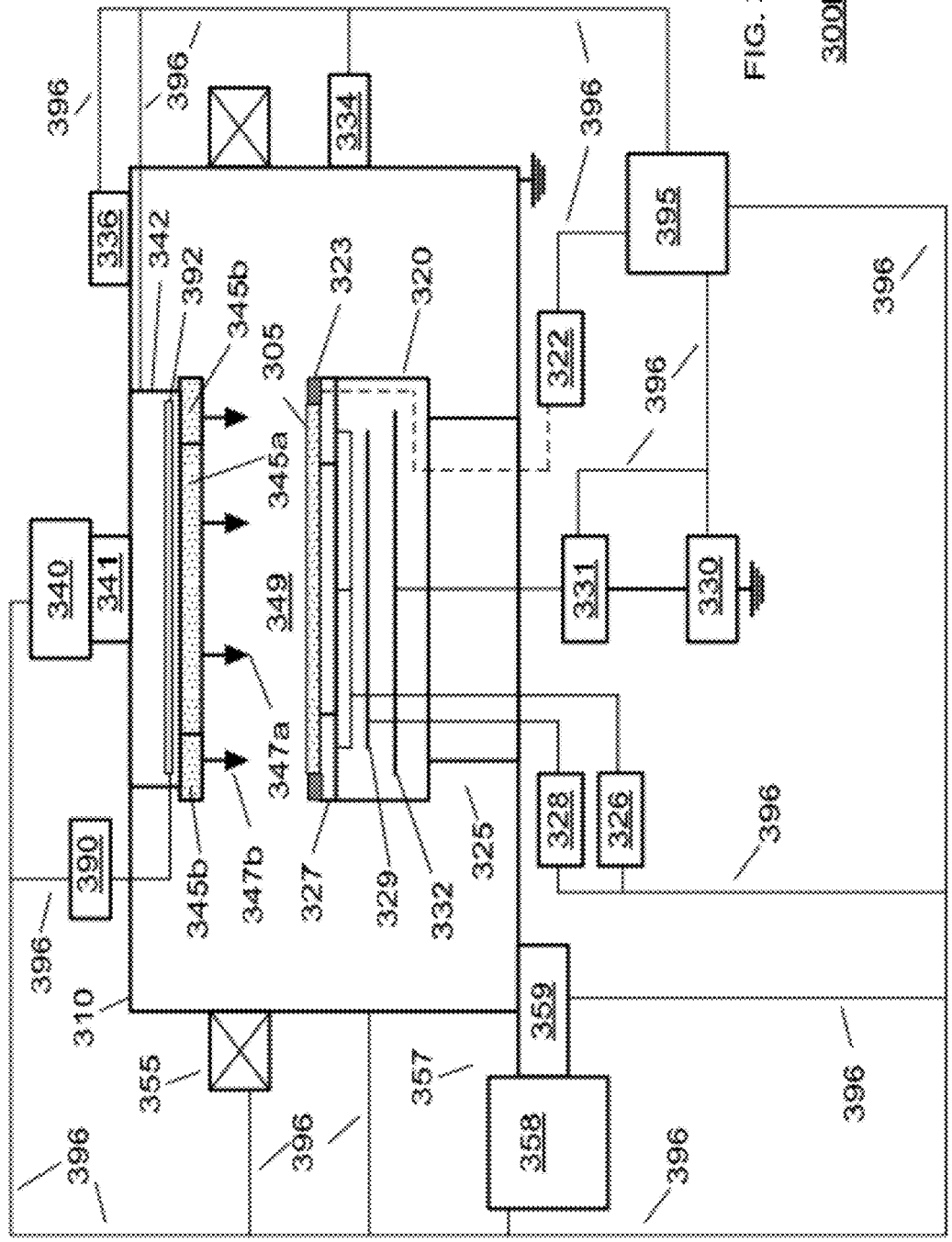

300C

300D

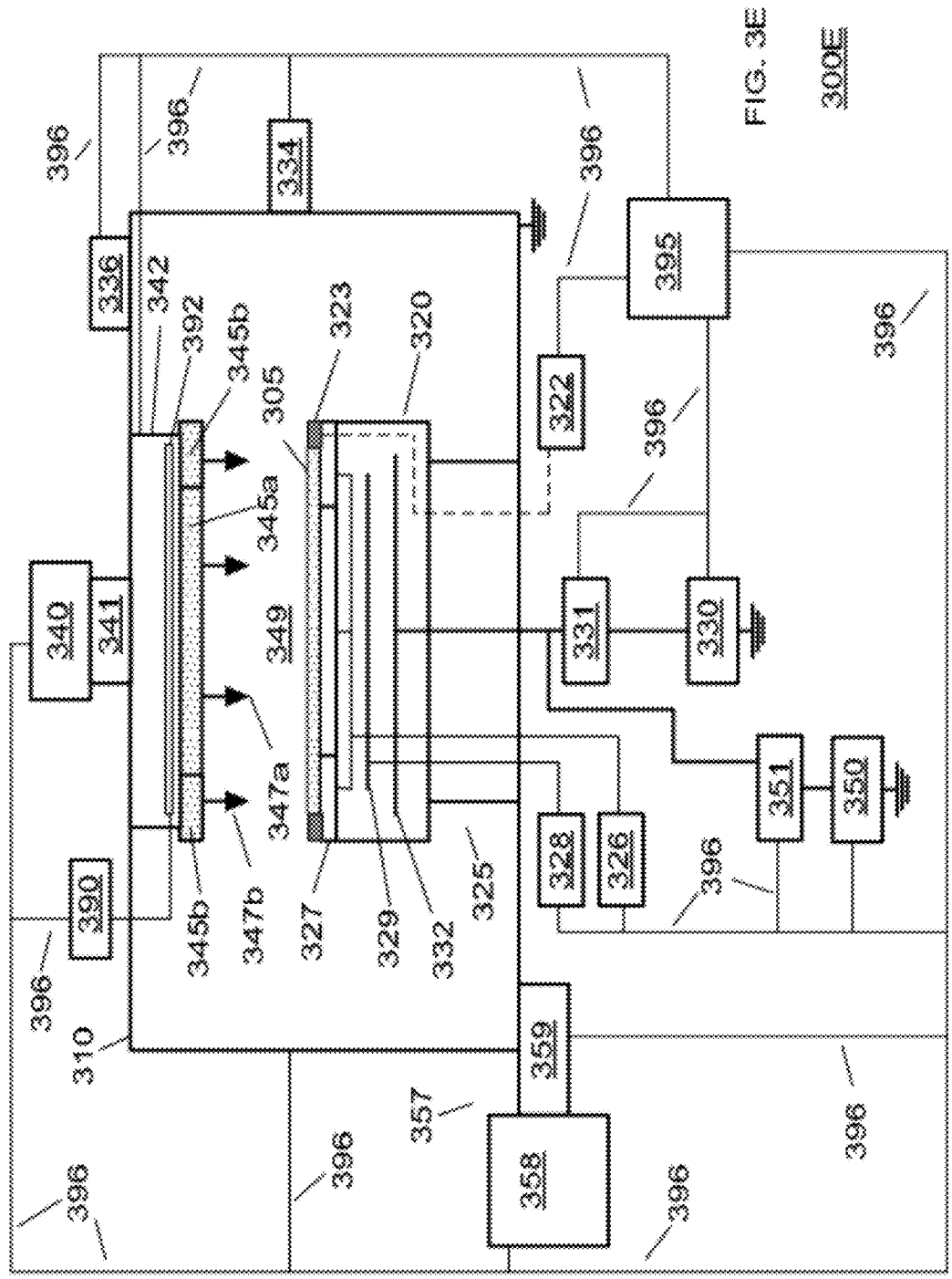

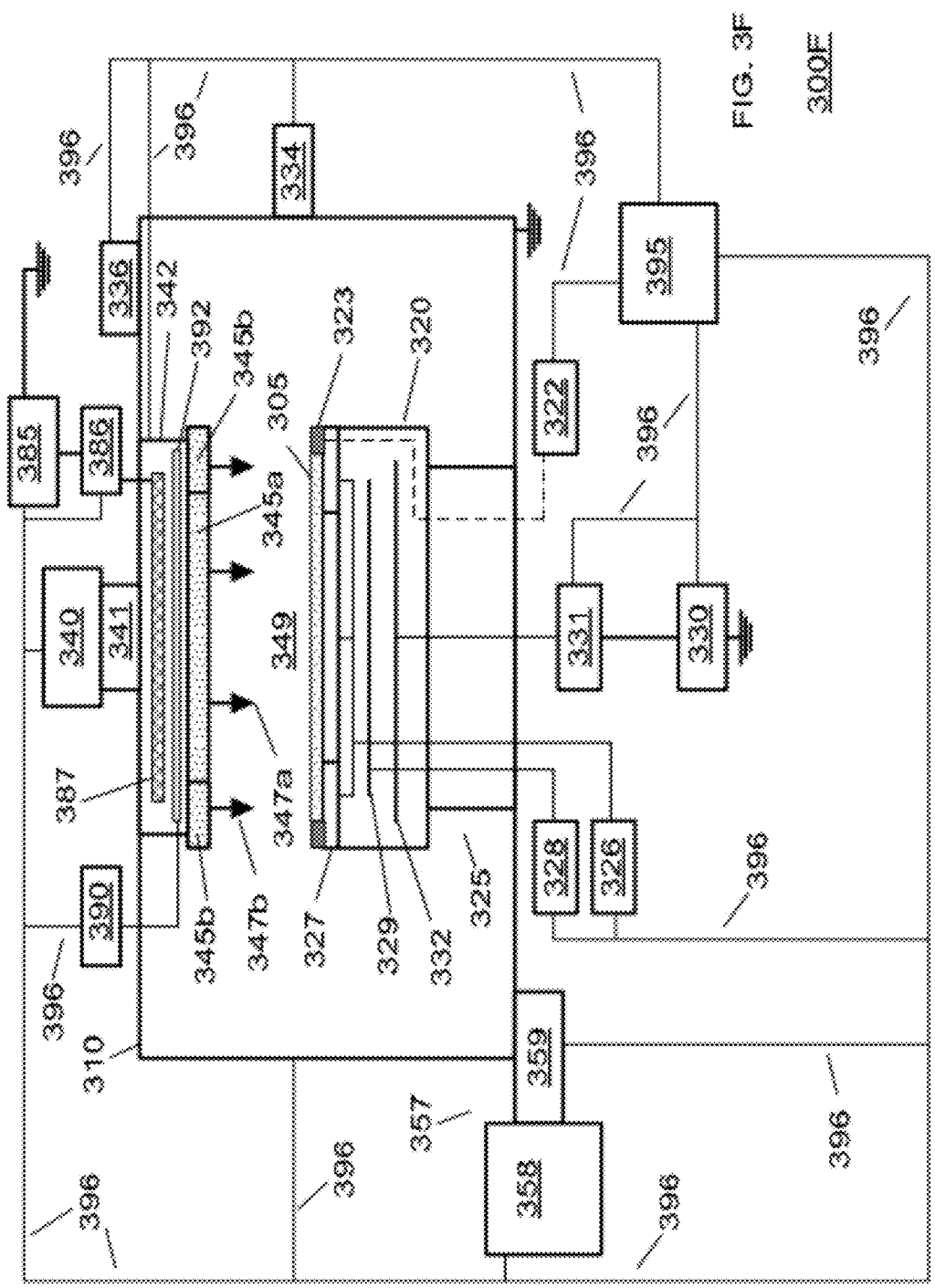

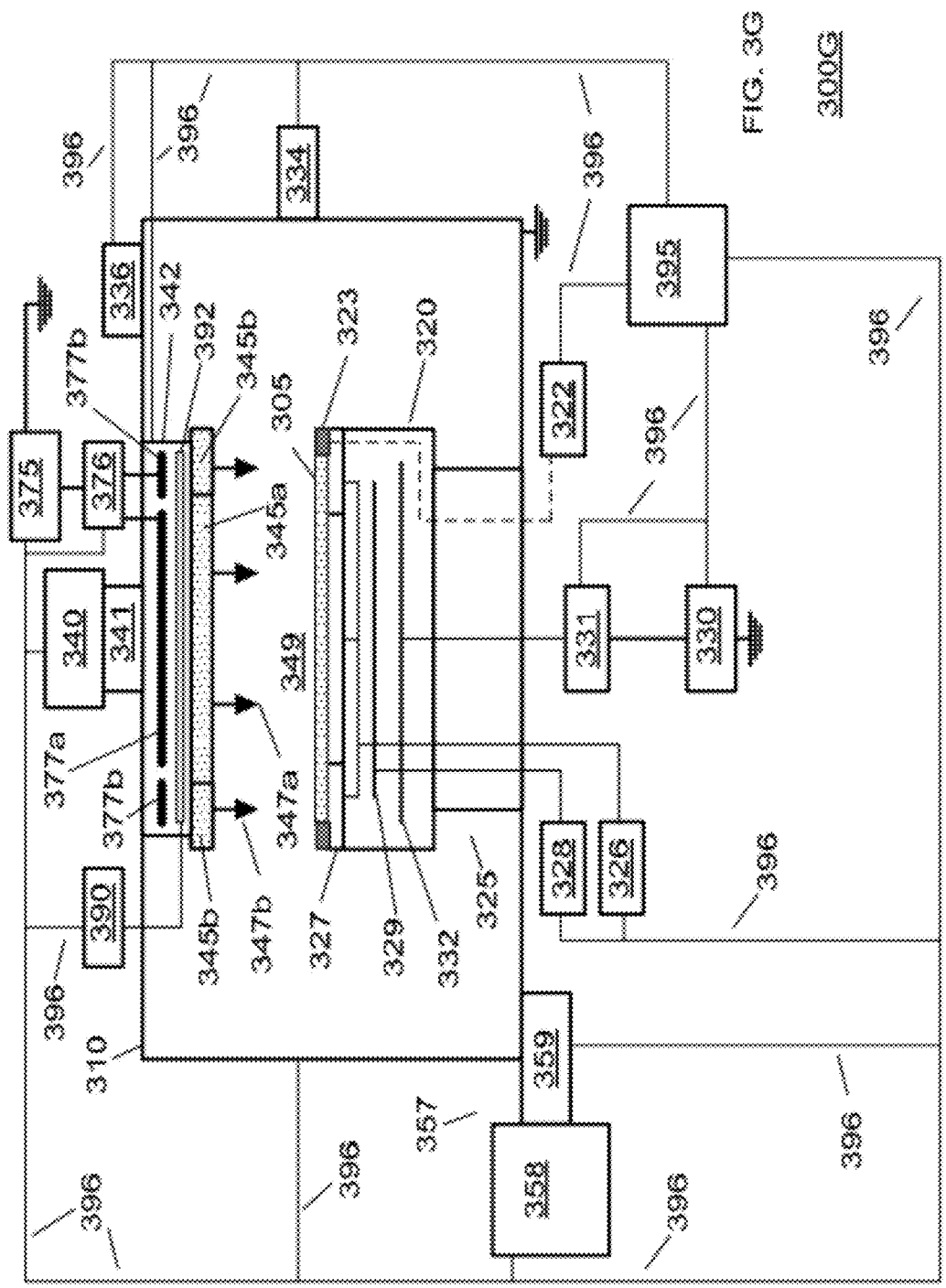

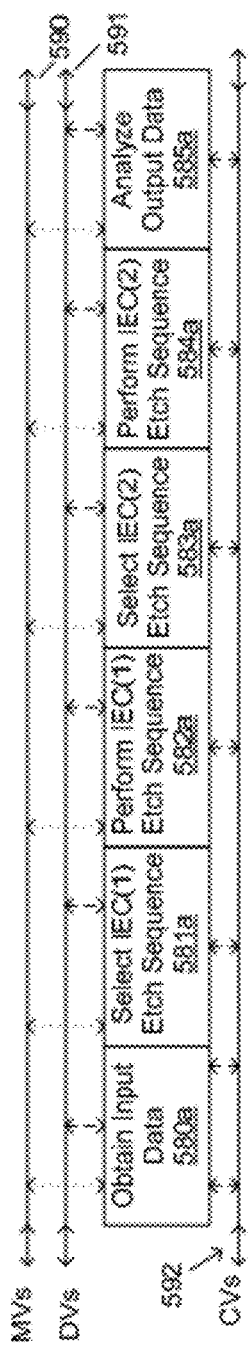
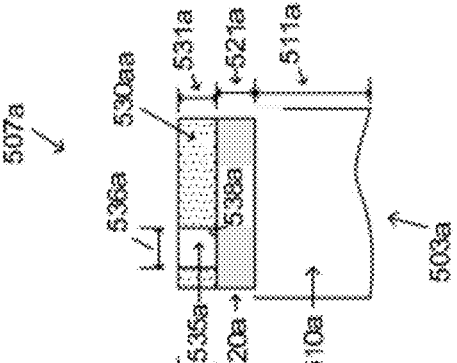
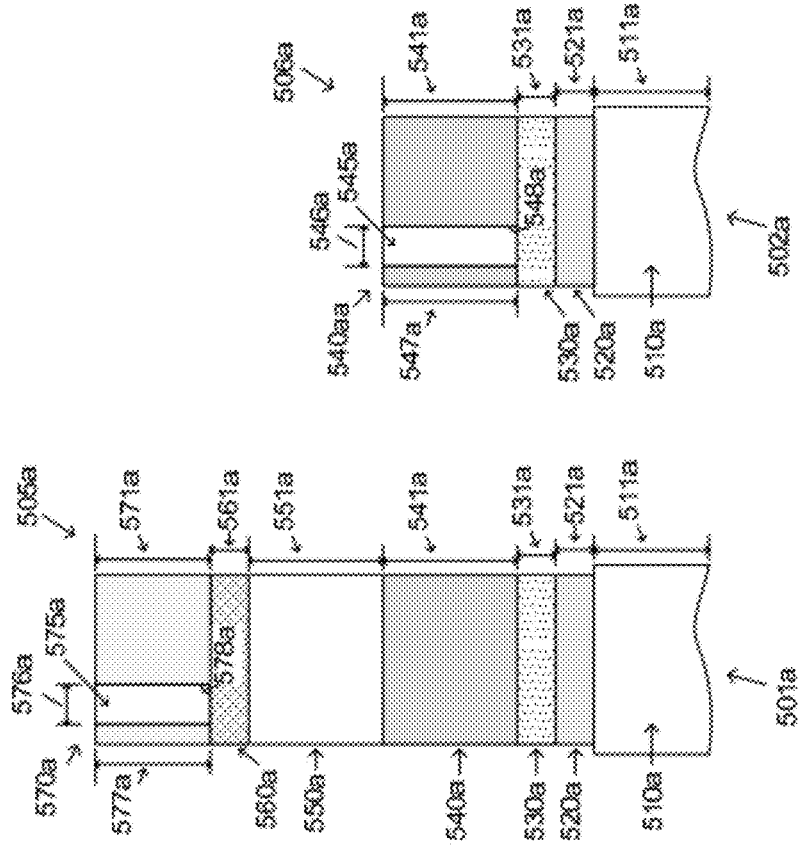
FIG. 5A
FIG. 5A'

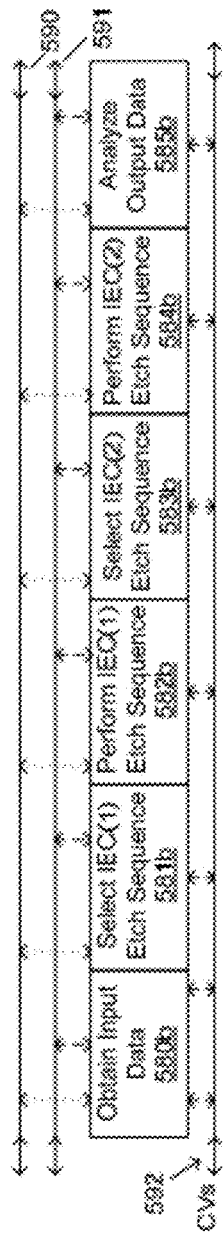
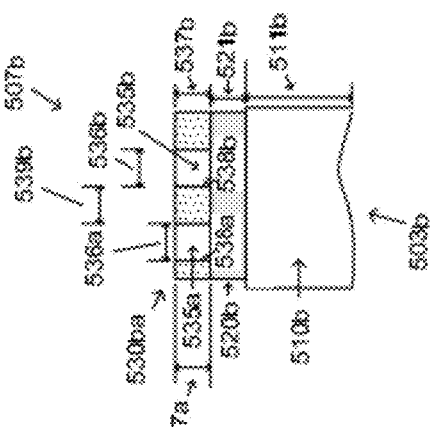
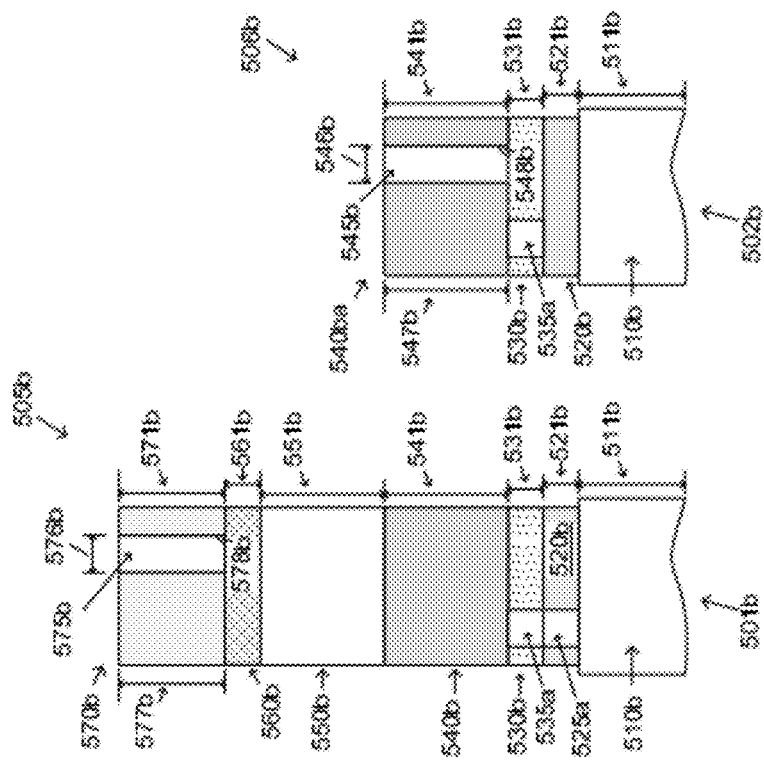
FIG. 5B
FIG. 5B'

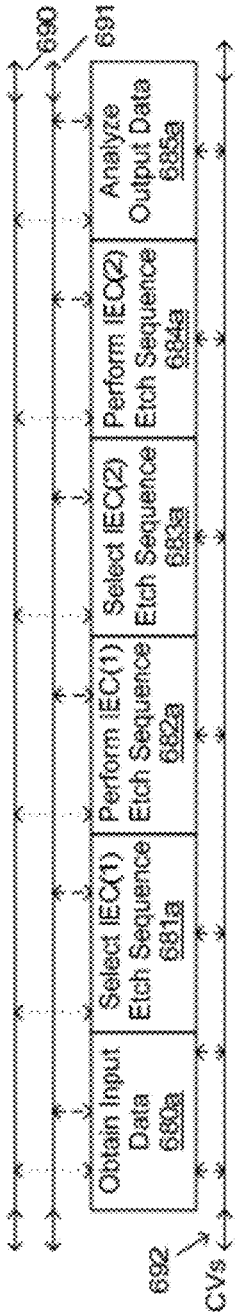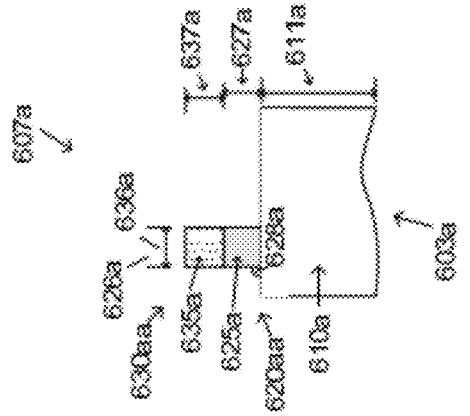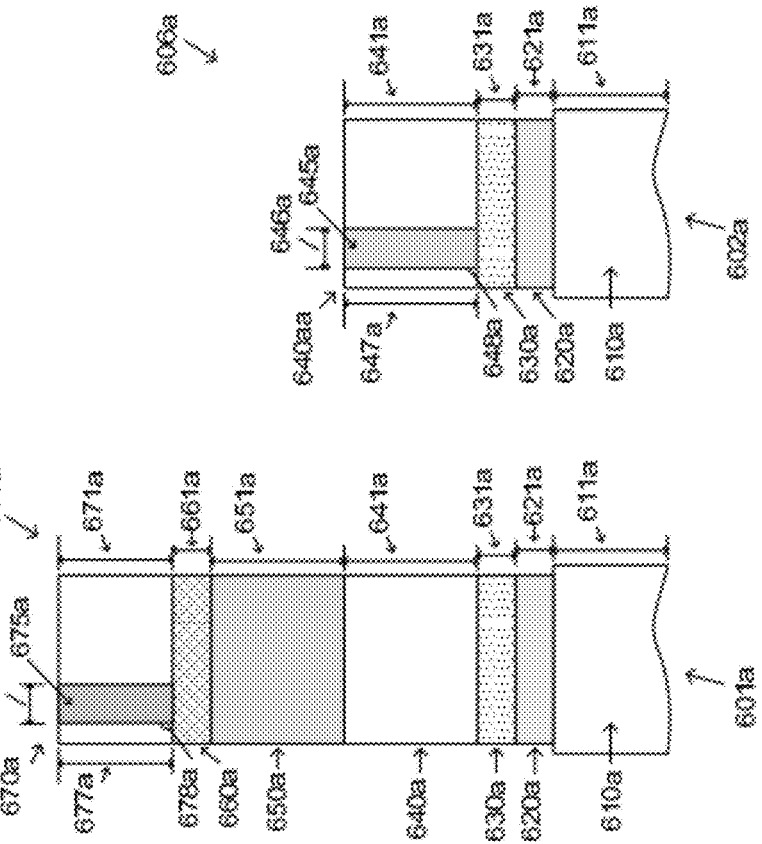
FIG. 6A

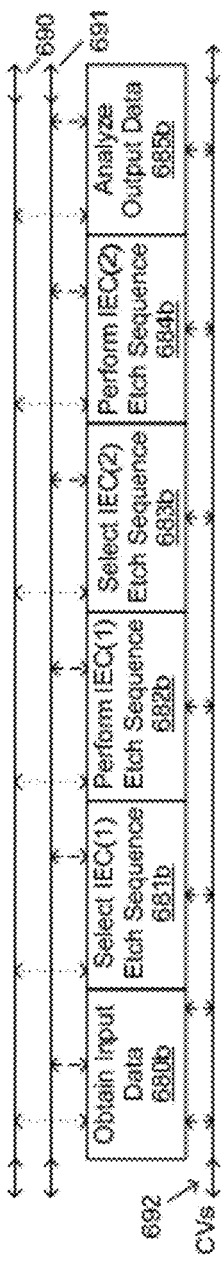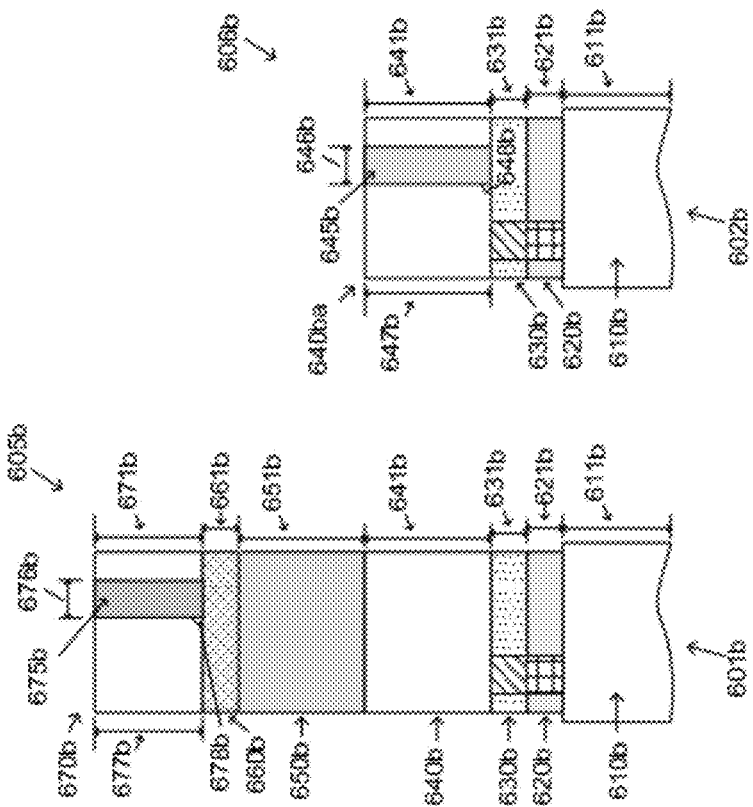

1100

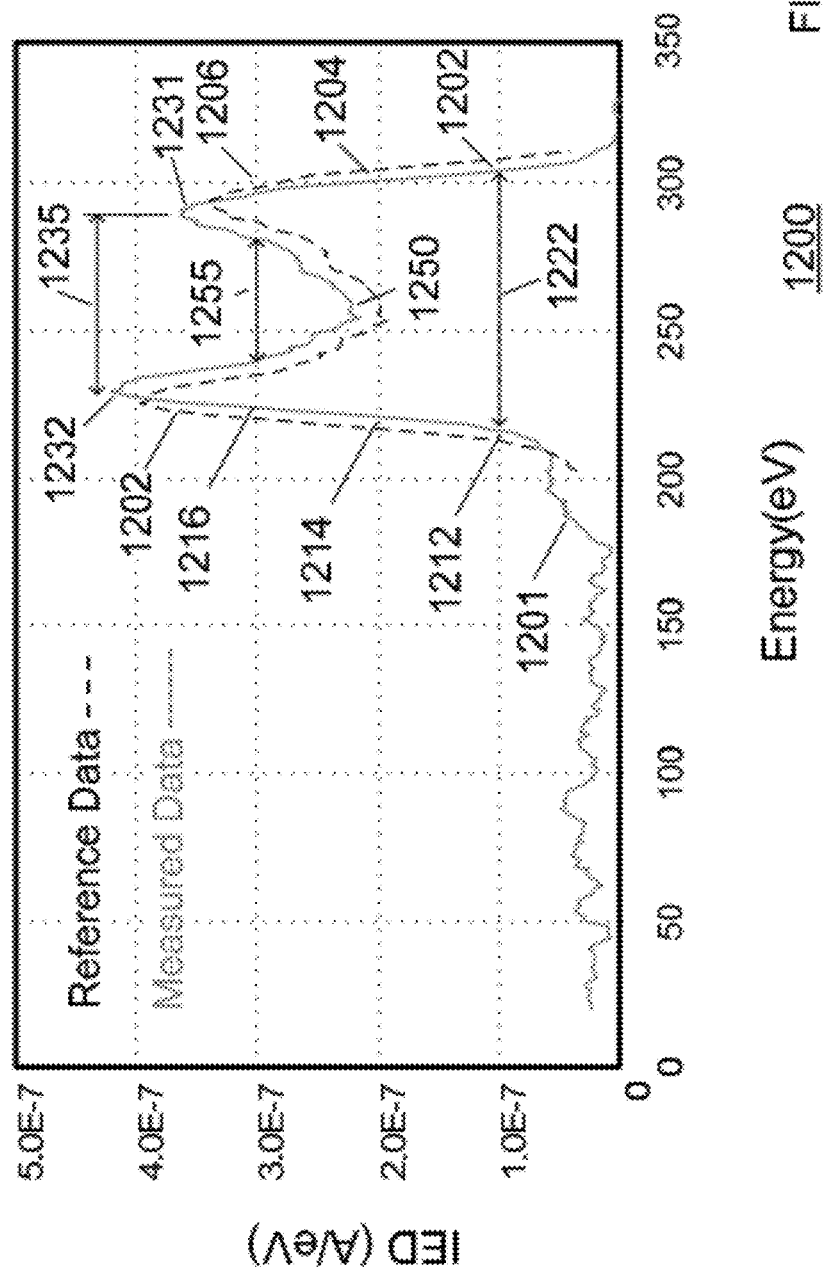

us 8,501,499 B2

ADAPTIVE RECIPE SELECTOR

CROSS-REFERENCE TO RELATED APPLICATIONS

This application is related to co-pending U.S. patent application Ser. No. 12/186,668, entitled "Creating Multi-Layer/Multi-Input/Multi-Output (MLMIMO) Models for Metal-Gate Structures", published as 2010/0036514 on Feb. 11, 2010; and co-pending U.S. patent application Ser. No. 12/059,624, entitled "Multi-Layer/Multi-Input/Multi-Output (MLMIMO) Models and Method for Using", published as 2009/0242513 on Oct. 1, 2009; and co-pending U.S. Provisional Patent application Ser. No. 61/468,187, entitled "Ion Energy Analyzer and Methods of Manufacturing and Operating", filed on even date herewith. The contents of each of these applications are herein incorporated by reference in their entireties. This application is also related to U.S. Pat. No. 7,777,179, entitled "Two-Grid Ion Energy Analyzer and Methods of Manufacturing and Operating", by Chen, et al., issued on Aug. 17, 2010, and this patent is incorporated in its entirety herein by reference. In addition, this application is also related to U.S. Pat. No. 7,875,859, entitled "Ion Energy Analyzer and Methods of Manufacturing and Operating", by Chen, et al., issued on Jan. 25, 2011, and this patent is incorporated in its entirety herein by reference. In addition, this application is also related to U.S. Pat. No. 7,894,927, entitled "Using Multi-Layer/Multi-Input/Multi-Output (MLMIMO) Models For Metal-Gate Structures", by Funk, et al., issued on Jan. 25, 2011, and this patent is incorporated in its entirety herein by reference.

BACKGROUND OF THE INVENTION

1. Field of the Invention

The present invention relates to wafer processing, and more particularly to apparatus and methods for creating metal-gate structures on a wafer in real-time using Ion Energy Controlled (IEC) etch sequences and associated Ion Energy Controlled Multi-Input/Multi-Output (IEC-MIMO) models.

2. Description of the Related Art

Etch process behavior is inherently non-linear and interacting step-to-step (layers) or as process stacks are compiled (etch/cvd/implant). With the knowledge of the process interactions based on physical modeling of Tokyo Electron Limited (TEL) chambers and base processes and empirical data and measurements from process refinement and tuning the control of Critical Dimension (CD), Sidewall Angle (SWA), depths, film thicknesses, over etching, undercuts, surface cleaning and damage control can be recursively calculated and optimized using multi-input multi-output non-linear models. Current low cost products use a bulk silicon technology. As the transistor continues to shrink, the impact of the channel depth is becoming critical (ultra-shallow source/drain extensions). As the Silicon on Insulator (SOI) film shrinks, smaller variations in the gate and/or spacer thickness and thickness of the SOI film can affect the transistor's performance. When etch procedures are not controlled, the removal of the material near the gate affects the electrical performance. Current high performance microprocessors use PD SOI (partially depleted Silicon-on-Insulator film—giving a threshold voltage of 0.2 volts. PD SOI films are around 50 nm while the gate and/or spacer reduction amount can be a large percentage (10%) of the total gate and/or spacer thickness. Future generations of SOI films are called FD SOI (fully depleted giving a threshold voltage 0.08 volts and a thickness of ~25 nm). Currently theses films are not in production due to limitations in thickness control uniformity and defects. Channel mobility degrades with decreasing SOI thickness. With thinner films, the control of the metal-gate structures becomes more critical.

SUMMARY OF THE INVENTION

The invention can provide apparatus and methods of creating gate structures and target features on a patterned wafer in real-time using Ion Energy Controlled (IEC) etch sequences and associated (IE) Multi-Input/Multi-Output (MIMO) models. Other aspects of the invention will be made apparent from the description that follows and from the drawings appended hereto.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2A-2G show exemplary block diagrams of Ion Energy Controlled (IEC) etching subsystems in accordance with embodiments of the invention;

FIGS. 3A-3G show exemplary block diagrams of additional Ion Energy Controlled (IEC) etching subsystems in accordance with embodiments of the invention;

FIGS. 5A, 5A', 5B, and 5B' illustrate an exemplary view of a first Ion Energy (IE)-related process sequence for creating metal gate structures in accordance with embodiments of the invention;

FIGS. 6A, 6A', 6B, and 6B' illustrate an exemplary view of a second Ion Energy (IE)-related process sequence for creating features in a target layer in accordance with embodiments of the invention;

FIG. 12 illustrates a first set of Ion Energy Distribution (IED) data in accordance with embodiments of the invention.

DETAILED DESCRIPTION

Figure 1:
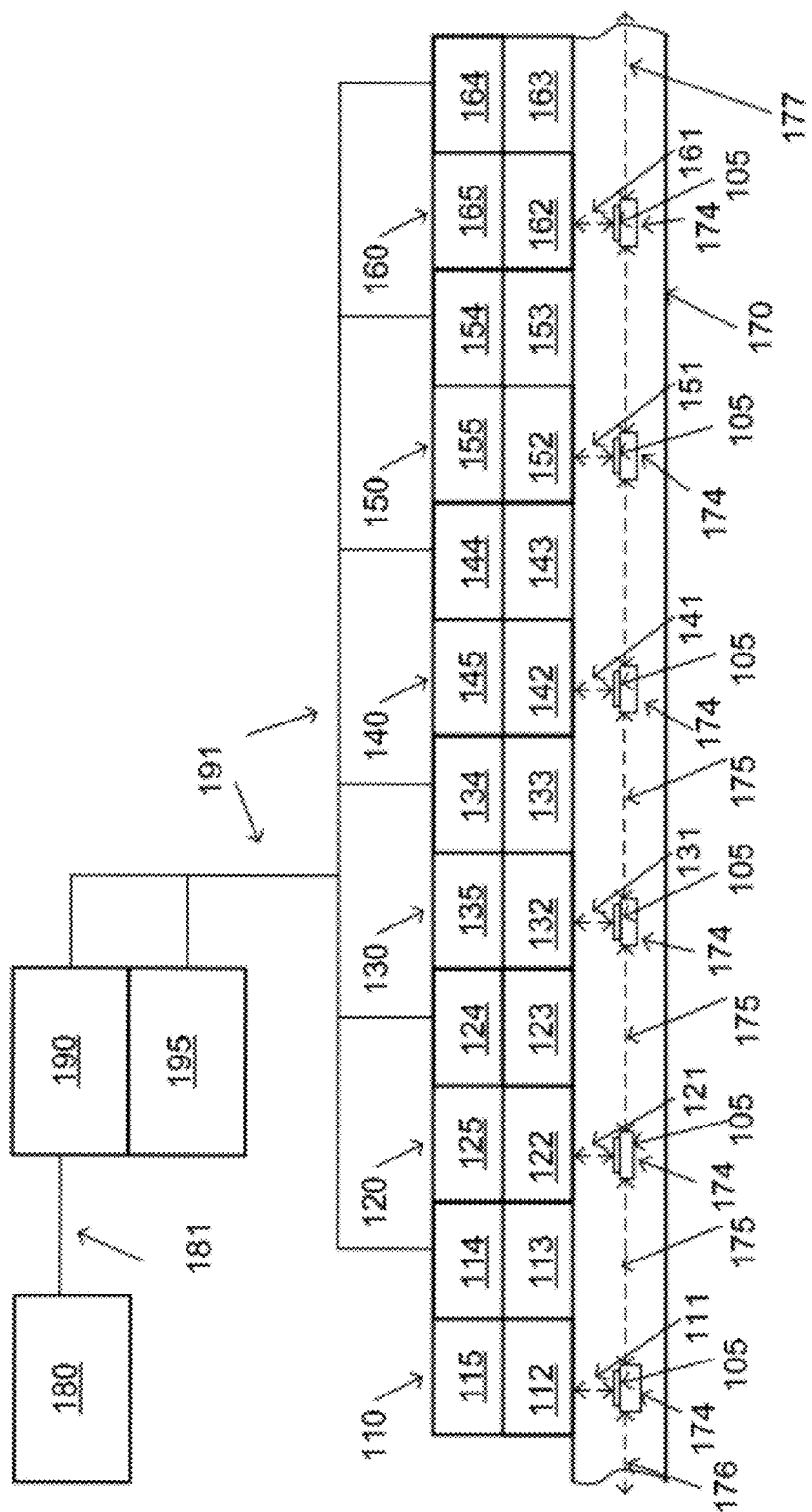
FIG. 1 shows an exemplary block diagram of a processing system in accordance with embodiments of the invention.

The (Ion Energy Controlled) IEC-MIMO models can be subdivided into layers of a finite granularity based on the application need. Each layer can be a physical material, with layer separation denoted by material changes or dimensional layer boundaries. Layers can include masking layers, metal gate stack layers, spacer deposition layers, and etched metal gate stack layers. Layers can be mapped to (Ion Energy Controlled) IEC-etch sequences or (Ion Energy Optimized) IEO-etch procedures with time or End Point Detection (EPD) being used to separate the steps. Additionally, a continuous real-time controller can run with real-time updates from a combination of metrology data, sensors, and etch models.

DOEs can be run to model the process gain of each potential control knob and the interactions of the inputs and outputs associated with each layer, and the interactions and gains of process control loops layer to layer. A method of determining interaction between each control knob and output can be used to evaluate and optimize the model stability, such as a Relative Gain Array (RGA) analysis. This information can also drive setup of individual feedback loops that are non-interacting.

The IEC-MIMO models can be used to calculate the optimum inputs for a set of goals (or targeted outputs). Constraints can be ranges of process parameters such as time, gas flows, and temperature by layer. During IEC-MIMO model development, a set of weightings can be applied to guide the optimizer to prioritize the outputs with most value to the current process calculations at a given time. Target weightings can be used where an equation is applied to the weighting calculation given a target and gain constants that effectively penalizes as the optimizer moves away from target in a linear or non-linear way. Targets can be a center target or a limit target (above a given value—for example with SWA).

Feedback can take the form of multiple loops, one for each targeted output with a calculation of the feedback error based on the actual less the predicted error. When using an IEC-MIMO model, each predicted output error can be calculated and matched with the feedback measurements to determine the real error. Feedback filtering methods such as Exponentially Weighted Moving Averages (EWMA) filters or Kalman filters can be used to filter noise. Outputs from a controller associated with an IEC-etch sequence or an IEO-etch procedure can include a goodness of fit (GOF) value, and this GOF value can then be used as the input to a cascaded controller.

MIMO controllers can calculate updates at different times as the processing steps are performed allowing the controller to make new updates based on past calculations, errors of calculations, changes in tool state or material state then incorporated into the most recent update.

In some IEC-etch sequences, when the resist parameters are measured, they can be used for feed forward, and can be weighted based on previous wafers feedback and chamber state information. At the beginning of a Lot, the IEC-MIMO model can be configured to use the best known values for the patterned soft mask layer, and these can be weighted to the center of the previous lot's distribution, During the lot processing, the parameters for the Width Control Layer (WCL) or the hard mask layers can be measured and filtered using a weighting method such as EWMA to smooth wafer-to-wafer (W2W) variations and can be fed back to update the current feed forward SWA value. The SWA pattern analysis function can group bimodal patterns so two threads can be managed to feedback and/or feed forward data. In one example, the SWA W2W variation is more commonly driven by scanner stage so two feed forward/feedback threads can be maintained to optimize performance. In a second example, the W2W CD variation from the lithography tool can be dominated by the hot plates, so a two, three, or four-variation pattern can be observed. When IM measurements are made after the lithography processes, the pattern across the wafer can be established before wafer processing and the wafer CD and SWA patterns can be established before the wafers are sent to the etcher. When more than one processing threads are used, the thread number can be added as a context item for the wafer. In addition, when the scanner and/or track cell number, scanner module number, and hot plate number are available, they can also be used to group wafers and establish feed forward threads from the Lithography tool to the Etch Tool. Alternatively, other combinations of coater/developers may also be used.

When the wafers are sorted based on context groups, the wafers can be processed based on their group or IEC-etch sequence. When processing order in the etch tool is the same as the processing order in the lithography tool, the current feedback (FB) controller can be programmed to adjust W2W for incoming drift inside the lithography tool and for drift inside the etch tool.

The invention provides an apparatus and methods for processing wafers having a large number of semiconductor devices thereon and an even larger number of transistor gate and/or spacer structures. In various embodiments, apparatus and methods are provided for creating and/or using an IEC-MIMO evaluation library, for performing IE-related process sequences that can include one or more IEC metal gate etch sequences, one or more IEC target layer etch sequences, one or more measurement procedures, one or more cleaning procedures, and/or one or more verification procedures.

One or more periodic structures can be provided at various locations on a wafer and can be used to evaluate and/or verify IEC-MIMO models and associated IE-related process sequences. Wafers can have wafer data associated with them, and the wafer data can include real-time and historical IE-related data. In addition, the wafer can have other data associated with them, and the other data can include gate structure data, the number of required sites, the number of visited sites, confidence data and/or risk data for one or more of the sites, site ranking data, transferring sequence data, or process-related data, or evaluation/verification-related data, or any combination thereof. The data associated with IE-related process sequences can include transfer sequence data that can be used to establish when and where to transfer the wafers, and IE-related process sequences can be change using operational state data.

The IEC-MIMO model can be subdivided into layers of a finite granularity based on the application need. Each layer can be a physical material, with layer separation denoted by material changes or dimensional layer boundaries. Layers can include masking layers, metal gate stack layers, spacer deposition layers, and etched metal gate stack layers.

Layers can be mapped to etch steps with time or End Point Data (EPD) being used to separate the steps. Additionally a continuous real-time controller can run with real-time updates from a combination of metrology data, sensors, and etch models.

An analytical device used in process control multivariable applications, based on the comparison of single-loop control to multivariable control; expressed as an array (for all possible input-output pairs) of the ratios of a measure of the single-loop behavior between an input-output variable pair, to a related measure of the behavior of the same input-output pair under some idealization of multivariable control.

MIMO modeling is used to calculate the optimum inputs for a set of goals (or targeted outputs). Constraints can be ranges of process parameters such as time, gas flows, and temperature by layer. With MIMO, a set of weightings can be applied to guide the optimizer to prioritize the outputs with most value to the current process calculations at a given time. Target weightings can be used where an equation is applied to the weighting calculation given a target and gain constants that effectively penalizes as the optimizer moves away from target in a linear or non-linear way. Targets can be a center target and/or a limit target (above a given value—for example with SWA).

Feedback can take the form of multiple loops, one for each targeted output with a calculation of the feedback error based on the actual less predicted error. With MIMO, each prediction output error needs to be calculated and matched with the feedback measurements to determine the real error. Feedback filtering methods such as EWMA or Kalman filters can be used to filter noise. Outputs of a layer controller can include a goodness of fit and this GOF value can then be used as the input of a cascading layer controller.

The wafer can be partitioned into one or more upper edge regions, one or more center regions, and one or more lower edge regions.

Layer controllers can contain updates at different times as the processing steps are performed allowing for the controller to make new updates based on past calculations, errors of calculations, changes in tool state or material state then incorporated into the updates.

As feature sizes decrease below the 65 nm node, accurate processing and/or measurement data becomes more important and more difficult to obtain. IEC-MIMO models and associated IE-related process sequences can be used to more accurately process and/or measure these ultra-small devices and features. The data from an IEO-etch procedure can be compared with the warning and/or control limits, when a run-rule is violated, an alarm can be generated indicating a processing problem, and correction procedures can be performed in real time.

FIG. 1 shows an exemplary block diagram of a processing system in accordance with embodiments of the invention. In the illustrated embodiment, processing system 100 comprises a lithography subsystem 110, a scanner subsystem 120, an etch subsystem 130, a deposition subsystem 140, an inspection subsystem 150, a metrology subsystem 160, a transfer subsystem 170, a manufacturing execution system (MES) 180, a system controller 190, and a memory/database 195. Single subsystems (110, 120, 130, 140, 150, 160, and 170) are shown in the illustrated embodiment, but this is not required for the invention. In some embodiments, multiple subsystems (110, 120, 130, 140, 150, 160, and 170) can be used in a processing system 100. In addition, one or more of the subsystems (110, 120, 130, 140, 150, 160, and 170) can comprise one or more processing elements that can be used in IEC-MIMO models and associated IE-related process sequences.

The system controller 190 can be coupled to the lithography subsystem 110, the scanner subsystem 120, the etch subsystem 130, the deposition subsystem 140, the inspection subsystem 150, the metrology subsystem 160, and the transfer subsystem 170 using a data transfer subsystem 191. The system controller 190 can be coupled to the MES 180 using the data transfer subsystem 181. Alternatively, other configurations may be used. For example, the etch subsystem 130, the deposition subsystem 140, the metrology subsystem 160, and a portion of the transfer subsystem 170 can be part of a Tactras™ System available from Tokyo Electron Limited.

The lithography subsystem 110 can comprise one or more transfer/storage elements 112, one or more processing elements 113, one or more controllers 114, and one or more evaluation elements 115. One or more of the transfer/storage elements 112 can be coupled to one or more of the processing elements 113 and/or to one or more of the evaluation elements 115 and can be coupled 111 to the transfer subsystem 170. The transfer subsystem 170 can be coupled 111 to the lithography subsystem 110, and one or more wafers 105 can be transferred 111 between the transfer subsystem 170 and the lithography subsystem 110 in real time. For example, the transfer subsystem 170 can be coupled to one or more of the transfer/storage elements 112, to one or more of the processing elements 113, and/or to one or more of the evaluation elements 115. One or more of the controllers 114 can be coupled to one or more of the transfer/storage elements 112, to the one or more of the processing elements 113, and/or to one or more of the evaluation elements 115.

In some embodiments, the lithography subsystem 110 can perform coating procedures, thermal procedures, measurement procedures, inspection procedures, alignment procedures, and/or storage procedures on one or more wafers using procedures and/or procedures. For example, one or more lithography-related processes can be used to deposit one or more masking layers that can include photoresist material, and/or anti-reflective coating (ARC) material, and can be used to thermally process (bake) one or more of the masking layers. In addition, lithography subsystem 110 can be used to develop, measure, and/or inspect one or more of the patterned masking layers on one or more of the wafers.

The scanner subsystem 120 can comprise one or more transfer/storage elements 122, one or more processing elements 123, one or more controllers 124, and one or more evaluation elements 125. One or more of the transfer/storage elements 122 can be coupled to one or more of the processing elements 123 and/or to one or more of the evaluation elements 125 and can be coupled using link 121 to the transfer subsystem 170. The transfer subsystem 170 can be coupled using link 121 to the scanner subsystem 120, and one or more wafers 105 can be transferred 121 between the transfer subsystem 170 and the scanner subsystem 120 in real time. For example, the transfer subsystem 170 can be coupled to one or more of the transfer/storage elements 122, to one or more of the processing elements 123, and/or to one or more of the evaluation elements 125. One or more of the controllers 124 can be coupled to one or more of the transfer/storage elements 122, to the one or more of the processing elements 123, and/or to one or more of the evaluation elements 125.

In some embodiments, the scanner subsystem 120 can be used to perform wet and/or dry exposure procedures, and in other cases, the scanner subsystem 120 can be used to perform extreme ultraviolet (EUV) exposure procedures.

The etch subsystem 130 can comprise one or more transfer/storage elements 132, one or more processing elements 133, one or more controllers 134, and one or more evaluation elements 135. One or more of the transfer/storage elements 132 can be coupled to one or more of the processing elements 133 and/or to one or more of the evaluation elements 135 and can be coupled using link 131 to the transfer subsystem 170. The transfer subsystem 170 can be coupled using link 131 to the etch subsystem 130, and one or more wafers 105 can be transferred 131 between the transfer subsystem 170 and the etch subsystem 130 in real time. For example, the transfer subsystem 170 can be coupled to one or more of the transfer/ storage elements 132, to one or more of the processing elements 133, and/or to one or more of the evaluation elements 135. One or more of the controllers 134 can be coupled to one or more of the transfer/storage elements 132, to the one or more of the processing elements 133, and/or to one or more of the evaluation elements 135. For example, one or more of the processing elements 133 can be used to perform plasma or non-plasma etching, ashing, trimming, and cleaning procedures. Evaluation procedures and/or inspection procedures can be used to measure and/or inspect one or more surfaces and/or layers of the wafers. The etch subsystem 130 can be configured as described herein in FIGS. 2A-2G and FIGS. 3A-3G.

The deposition subsystem 140 can comprise one or more transfer/storage elements 142, one or more processing elements 143, one or more controllers 144, and one or more evaluation elements 145. One or more of the transfer/storage elements 142 can be coupled to one or more of the processing elements 143 and/or to one or more of the evaluation elements 145 and can be coupled using link 141 to the transfer subsystem 170. The transfer subsystem 170 can be coupled using link 141 to the deposition subsystem 140, and one or more wafers 105 can be transferred 141 between the transfer subsystem 170 and the deposition subsystem 140 in real time. For example, the transfer subsystem 170 can be coupled to one or more of the transfer/storage elements 142, to one or more of the processing elements 143, and/or to one or more of the evaluation elements 145. One or more of the controllers 144 can be coupled to one or more of the transfer/storage elements 142, to the one or more of the processing elements 143, and/or to one or more of the evaluation elements 145. For example, one or more of the processing elements 143 can be used to perform physical vapor deposition (PVD) procedures, chemical vapor deposition (CVD) procedures, ionized physical vapor deposition (iPVD) procedures, atomic layer deposition (ALD) procedures, plasma enhanced atomic layer deposition (PEALD) procedures, and/or plasma enhanced chemical vapor deposition (PECVD) procedures. Evaluation procedures and/or inspection procedures can be used to measure and/or inspect one or more surfaces of the wafers.

The inspection subsystem 150 can comprise one or more transfer/storage elements 152, one or more processing elements 153, one or more controllers 154, and one or more evaluation elements 155. One or more of the transfer/storage elements 152 can be coupled to one or more of the processing elements 153 and/or to one or more of the evaluation elements 155 and can be coupled using link 151 to the transfer subsystem 170. The transfer subsystem 170 can be coupled using link 151 to the inspection subsystem 150, and one or more wafers 105 can be transferred 151 between the transfer subsystem 170 and the inspection subsystem 150 in real time. For example, the transfer subsystem 170 can be coupled to one or more of the transfer/storage elements 152, to one or more of the processing elements 153, and/or to one or more of the evaluation elements 155. One or more of the controllers 154 can be coupled to one or more of the transfer/storage elements 152, to the one or more of the processing elements 153, and/or to one or more of the evaluation elements 155.

The metrology subsystem 160 can comprise one or more transfer/storage elements 162, one or more processing elements 163, one or more controllers 164, and one or more evaluation elements 165. One or more of the transfer/storage elements 162 can be coupled to one or more of the processing elements 163 and/or to one or more of the evaluation elements 165 and can be coupled using link 161 to the transfer subsystem 170. The transfer subsystem 170 can be coupled using link 161 to the metrology subsystem 160, and one or more wafers 105 can be transferred 161 between the transfer subsystem 170 and the metrology subsystem 160 in real time. For example, the transfer subsystem 170 can be coupled to one or more of the transfer/storage elements 162, to one or more of the processing elements 163, and/or to one or more of the evaluation elements 165. One or more of the controllers 164 can be coupled to one or more of the transfer/storage elements 162, to the one or more of the processing elements 163, and/or to one or more of the evaluation elements 165. The metrology subsystem 160 can comprise one or more processing elements 163 that can be used to perform real-time optical metrology procedures that can be used to measure target structures at one or more sites on a wafer using library-based or regression-based techniques. For example, the sites on wafer can include MIMO sites, target sites, overlay sites, alignment sites, measurement sites, verification sites, inspection sites, or damage-assessment sites, or any combination thereof. For example, one or more "golden wafers" or reference chips can be stored and used periodically to verify the performance of one or more of the processing elements 163, and/or one or more of the evaluation elements 165.

In some embodiments, the metrology subsystem 160 can include an integrated Optical Digital Profilometry (iODP) elements (not shown), and iODP elements/systems are available from Timbre Technologies Inc. (a TEL company). Alternatively, other metrology systems may be used. For example, iODP techniques can be used to obtain real-time data that can include critical dimension (CD) data, gate structure data, and thickness data, and the wavelength ranges for the iODP data can range from less than approximately 200 nm to greater than approximately 900 nm. Exemplary iODP elements can include ODP Profiler Library elements, Profiler Application Server (PAS) elements, and ODP Profiler Software elements. The ODP Profiler Library elements can comprise application specific database elements of optical spectra and its corresponding semiconductor profiles, CDs, and film thicknesses. The PAS elements can comprise at least one computer that connects with optical hardware and computer network. The PAS elements can be configured to provide the data communication, ODP library operation, measurement process, results generation, results analysis, and results output. The ODP Profiler Software elements can include the software installed on PAS elements to manage measurement recipe, ODP Profiler library elements, ODP Profiler data, ODP Profiler search/match results, ODP Profiler calculation/analysis results, data communication, and PAS interface to various metrology elements and computer network.

The metrology subsystem 160 can use polarizing reflectometry, spectroscopic ellipsometry, reflectometry, or other optical measurement techniques to measure accurate device profiles, accurate CDs, and multiple layer film thickness of a wafer. The integrated metrology process (iODP) can be executed as an integrated process in an integrated group of subsystems. In addition, the integrated process eliminates the need to break the wafer for performing the analyses or waiting for long periods for data from external systems. IODP techniques can be used with the existing thin film metrology systems for inline profile and CD measurement, and can be integrated with TEL processing systems and/or lithography systems to provide real-time process monitoring and control. Simulated metrology data can be generated by applying Maxwell's equations and using a numerical analysis technique to solve Maxwell's equations. Alternatively, a trained machine learning system can be used to generate simulated metrology data.

The transfer subsystem 170 can comprise transfer elements 174 coupled to transfer tracks (175, 176, and 177) that can be used to receive wafers, transfer wafers, align wafers, store wafers, and/or delay wafers. For example, the transfer elements 174 can support two or more wafers. Alternatively, other transferring means may be used. The transfer subsystem 170 can load, transfer, store, and/or unload wafers based on an IEC-MIMO model, an IE-related process sequence, a transfer sequence, operational states, the wafer and/or processing states, the processing time, the current time, the wafer data, the number of sites on the wafer, the type of sites on the wafers, the number of required sites, the number of completed sites, the number of remaining sites, or confidence data, or any combination thereof.

In some examples, transfer subsystem 170 can use loading data to determine where and when to transfer a wafer. In other examples, a transfer system can use MIMO modeling data to determine where and when to transfer a wafer. Alternatively, other procedures may be used. For example, when the first number of wafers is less than or equal to the first number of available processing elements, the first number of wafers can be transferred to the first number of available processing elements in the one or more of the subsystems using the transfer subsystem 170. When the first number of wafers is greater than the first number of available processing elements, some of the wafers can be stored and/or delayed using one or more of the transfer/storage elements (112, 122, 132, 142, 152, and 162) and/or the transfer subsystem 170.

In addition, the one or more subsystems (110, 120, 130, 140, 150, 160, and 170) can be used when performing lithography-related procedures, scanner-related procedures, inspection-related procedures, measurement-related procedures, evaluation-related procedures, etch-related procedures, deposition-related procedures, thermal processing procedures, coating-related procedures, alignment-related procedures, polishing-related procedures, storage-related procedures, transfer procedures, cleaning-related procedures, rework-related procedures, oxidation-related procedures, nitridation-related procedures, or external processing elements, or any combination thereof.

Operational state data can be established for the subsystems (110, 120, 130, 140, 150, 160, and 170) and can be used and/or updated by IE-related sequences. In addition, operational state data can be established for the transfer/storage elements (112, 122, 132, 142, 152, and 162), processing elements (113, 123, 133, 143, 153, and 163), and evaluation elements (115, 125, 135, 145, 155, and 165), and can be updated by IE-related sequences. For example, the operational state data for the processing elements can include availability data, matching data for the processing elements, expected processing times for some process steps and/or sites, yield data, confidence data and/or risk data for the processing elements, or confidence data and/or risk data for one or more IE-related sequences. Updated operational states can be obtained by querying in real-time one or more processing elements, and/or one or more subsystems. Updated loading data can be obtained by querying in real-time one or more transfer elements, and/or one or more transfer subsystems.

One or more of the controllers (114, 124, 134, 144, 154, and 164) can be coupled to the system controller 190 and/or to each other using a data transfer subsystem 191. Alternatively, other coupling configurations may be used. The controllers can be coupled in series and/or in parallel and can have one or more input ports and/or one or more output ports. For example, the controllers may include microprocessors having one or more core processing elements.

In addition, subsystems (110, 120, 130, 140, 150, 160, and 170) can be coupled to each other and to other devices using intranet, internet, wired, and/or wireless connections. The controllers (114, 124, 134, 144, and 190) can be coupled to external devices as required.

One or more of the controllers (114, 124, 134, 144, 154, 164, and 190) can be used when performing real-time IE-related sequences. A controller can receive real-time data from an Ion Energy (IE)-MIMO model to update subsystem, processing element, process, recipe, profile, image, pattern, simulation, sequence data, and/or model data. One or more of the controllers (114, 124, 134, 144, 154, 164, and 190) can be used to exchange one or more Semiconductor Equipment Communications Standard (SECS) messages with the Manufacturing Execution Systems (MES) 180 or other systems (not shown), read and/or remove information, feed forward, and/or feedback the information, and/or send information as a SECS message. One or more of the formatted messages can be exchanged between controllers, and the controllers can process messages and extract new data in real-time. When new data is available, the new data can be used in real-time to update a model and/or procedure currently being used for the wafer and/or lot. For example, the current layout can be examined using the updated model and/or procedure when the model and/or procedure can be updated before the current layout is examined. The current layout can be examined using a non-updated model and/or procedure when an update cannot be performed before the current layout is processed. In addition, formatted messages can be used when resists are changed, when resist models are changed, when IE-related process sequences are changed, when design rules are changed, or when layouts are changed.

In some examples, the MES 180 may be configured to monitor some subsystem and/or system processes in real-time, and factory level intervention and/or judgment rules can be used to determine which processes are monitored and which data can be used. For example, factory level intervention and/or judgment rules can be used to determine how to manage the data when a MIMO-related error condition occurs. The MES 180 can also provide modeling data, sequence data, process data, and/or wafer data.

In addition, controllers (114, 124, 134, 144, 154, 164, and 190) can include memory (not shown) as required. For example, the memory (not shown) can be used for storing information and instructions to be executed by the controllers, and may be used for storing temporary variables or other intermediate information during the execution of instructions by the various computers/processors in the processing system 100. One or more of the controllers (114, 124, 134, 144, 154, 164, and 190), or other system components can comprise the means for reading data and/or instructions from a computer readable medium and can comprise the means for writing data and/or instructions to a computer readable medium.

The processing system 100 can perform a portion of or all of the processing steps of the invention in response to the computers/processors in the processing system 100 executing one or more sequences of one or more instructions contained in a memory and/or received in a message. Such instructions may be received from another computer, a computer readable medium, or a network connection.

In some embodiments, an integrated system can be configured using system components from Tokyo Electron Limited (TEL), and external subsystems and/or tools may be included. For example, measurement elements can be provided that can include a CD-Scanning Electron Microscopy (CDSEM) system, a Transmission Electron Microscopy (TEM) system, a focused ion beam (FIB) system, an Optical Digital Profilometry (ODP) system, an Atomic Force Microscope (AFM) system, or another optical metrology system. The subsystems and/or processing elements can have different interface requirements, and the controllers can be configured to satisfy these different interface requirements.

One or more of the subsystems (110, 120, 130, 140, 150, 160, and 170) can perform control applications, Graphical User Interface (GUI) applications, and/or database applications. In addition, one or more of the subsystems (110, 120, 130, 140, 150, 160, and 170) and/or controllers (114, 124, 134, 144, 154, 164, and 190) can include Design of Experiment (DOE) applications, Advanced Process Control (APC) applications, Fault Detection and Classification (FDC) applications, and/or Run-to-Run (R2R) applications.

Output data and/or messages from IE-related sequences or modeling procedures can be used in subsequent sequences and/or procedures to optimize the process accuracy and precision. Data can be passed to IEC-etch sequences or IEO-etch procedures in real-time as real-time variable parameters, overriding current model values, and reducing DOE tables. Real-time data can be used with a library-based system, or regression-based system, or any combination thereof to optimize the IEC-etch sequences or the IEO-etch procedures.

When a regression-based library creation procedure is used, measured IEC-MIMO model data can be compared to simulated IEC-MIMO model data. The simulated IEC-MIMO model data can be iteratively generated, based on sets of IEO-process parameters, to obtain a convergence value for the set of IEO-process parameters that generates the closest match simulated IEC-MIMO model data compared to the measured IEC-MIMO model data. When a library-based process is used, an IEC-MIMO model library can be generated and/or enhanced using IEC-MIMO model procedures, recipes, profiles, and/or models. For example, an IEC-MIMO model library can comprise simulated and/or measured IEC-MIMO data and corresponding sets of IEC-etch sequence data. The regression-based and/or the library-based processes can be performed in real-time. An alternative procedure for generating data for an IEC-MIMO library can include using a machine learning system (MLS). For example, prior to generating the IEC-MIMO library data, the MLS can be trained using known input and output data, and the MLS may be trained with a subset of the IEC-MIMO library data.

The IEC-MIMO models can include intervention and/or judgment rules that can be executed whenever a matching context is encountered. Intervention and/or judgment rules and/or limits can be established based on historical procedures, on the customer's experience, or process knowledge, or obtained from a host computer. Rules can be used in Fault Detection and Classification (FDC) procedures to determine how to respond to alarm conditions, error conditions, fault conditions, and/or warning conditions. The rule-based FDC procedures can prioritize and/or classify faults, predict system performance, predict preventative maintenance schedules, decrease maintenance downtime, and extend the service life of consumable parts in the system. Various actions can take place in response to an alarm/fault, and the actions taken on the alarm/fault can be context-based, and the context data can be specified by a rule, a system/process recipe, a chamber type, identification number, load port number, cassette number, lot number, control job ID, process job ID, slot number and/or the type of data.

Unsuccessful IEO-etch procedures or IEC-etch sequences can report a failure when a limit is exceeded, and successful IEO-etch procedures or IEC-etch sequences can create warning messages when limits are being approached. Pre-specified failure actions for known errors can be stored in a database, and can be retrieved from the database when an error occurs. For example, IEO-etch procedures or IEC-etch sequences can reject the IE-related data at one or more of the process times when an IE-data collection or validation procedure fails. In addition, IEO-etch procedures or IEC-etch sequences can reject the data at one or more of the sites for a wafer when a measurement procedure fails.

IEO-etch procedures, IEC-etch sequences, and/or IEC-MIMO models can be used to create, modify, and/or evaluate isolated and/or nested structures at different times and/or sites. For example, gate stack dimensions and wafer thickness data can be different near isolated and/or nested structures, and gate stack dimensions and wafer thickness data can be different near open areas and/or trench array areas. An IEC-MIMO model can create optimized data for isolated and/or nested structures to update and/or optimize a process recipe and/or process time.

IEO-etch procedures, IEC-etch sequences, and/or IEC-MIMO models can use end-point detection (EPD) data and process time data to improve the accuracy. When EPD data is used to stop an etching procedure, the EPD time data and the process rate data can be used to estimate the amount of etch and/or to estimate a thickness.

In various examples, IE-related data limits can be obtained by performing the IEO-etch procedure in a test processing chamber using an IE-sensor wafer, can be historical data that is stored in a library, can be obtained by performing a verified IEC-etch sequence, can be obtained from the MES 180, can be simulation data, and can be predicted data. In addition, IE-related procedure limits can be obtained by performing the IE-related etch procedure in a "reference/golden" processing chamber.

FIGS. 2A-2G show exemplary block diagrams of Ion Energy Controlled (IEC) etching subsystems in accordance with embodiments of the invention.

Figure 2A:
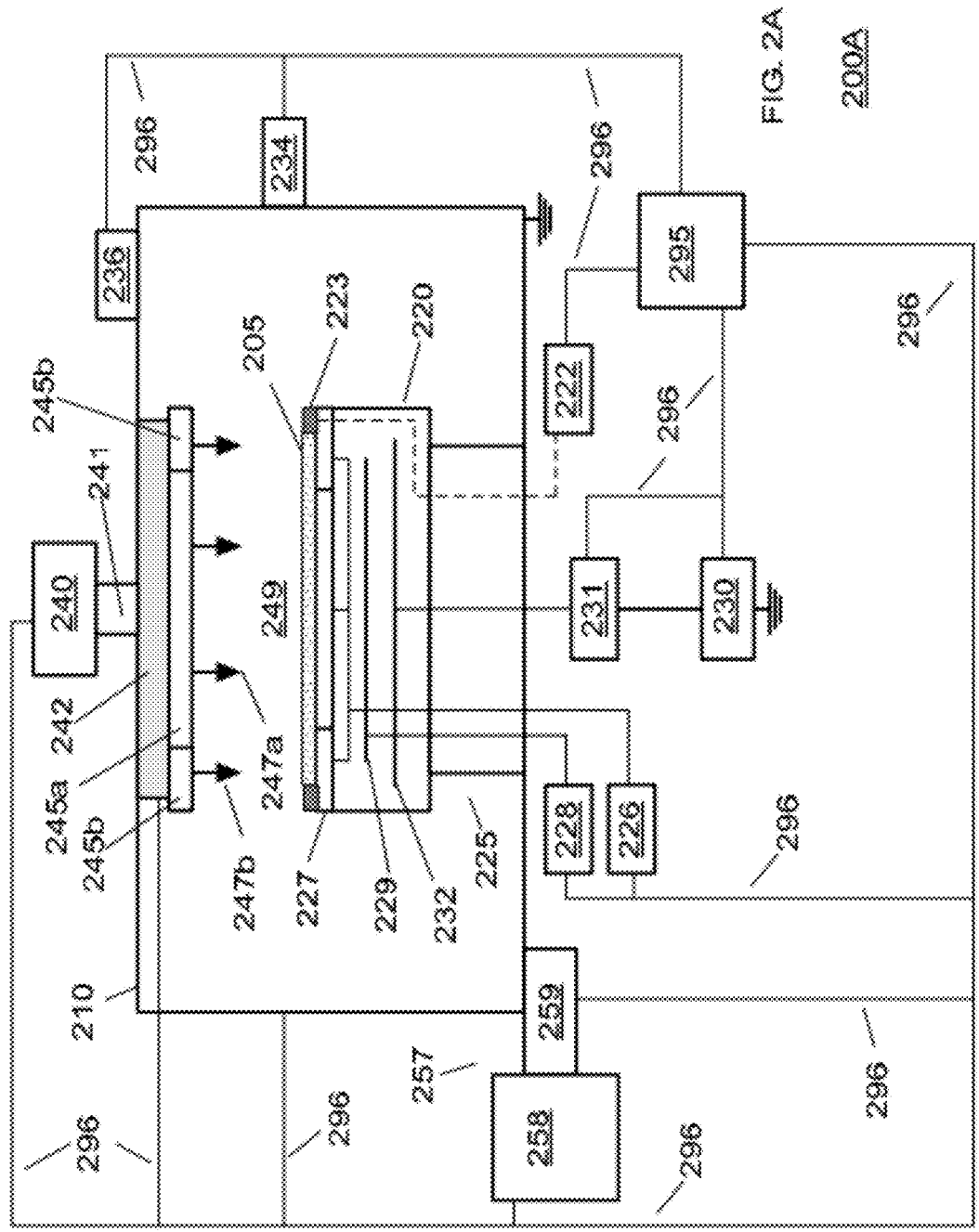

A first exemplary IEC etching subsystem 200A is shown in FIG. 2A, and the illustrated IEC etching subsystem 200A includes an Ion Energy Controlled (IEC) process chamber 210, wafer holder 220, upon which a wafer 205 to be processed is affixed, gas supply system 240, and vacuum pumping system 257. For example, wafer holder 220 can be coupled to and insulated from IEC process chamber 210 using base 225. Wafer 205 can be, for example, a semiconductor wafer, a work piece, or a liquid crystal display (LCD). For example, IEC process chamber 210 can be configured to facilitate the generation of Ion Energy Optimized (IEO) plasma in processing region 249 adjacent a surface of wafer 205, and the IEO plasma is formed via collisions between heated electrons and an ionizable gas. An ionizable gas or mixture of gases can be introduced from the gas supply system 240, and process pressure is adjusted using vacuum pumping system 257. Desirably, the IEO plasma can be used to create materials specific to a predetermined material process, and to aid either the deposition of material to wafer 205 or the removal of material from the exposed surfaces of wafer 205. For example, controller 295 can be used to control vacuum pumping system 257 and gas supply system 240.

Wafer 205 can be, for example, transferred into and out of the IEC process chamber 210 through a slot valve (not shown) and chamber feed-through (not shown) via robotic transfer system where it is received by wafer lift pins (not shown) housed within wafer holder 220 and mechanically translated by devices housed therein. After the wafer 205 is received from transfer system, it is lowered to an upper surface of wafer holder 220.

For example, wafer 205 can be affixed to the wafer holder 220 via an electrostatic clamping system (not shown). The wafer holder 220 can include temperature control elements 229 that can be coupled to a temperature control system 228. For example, the temperature control elements 229 can include resistive heating elements, or thermo-electric heaters/coolers. Backside gas can be delivered to the backside of the wafer via a dual (center/edge) backside gas delivery system (226 and 227) to improve the gas-gap thermal conductance between wafer 205 and wafer holder 220. A dual (center/edge) backside gas delivery system (226 and 227) can be utilized when additional temperature control of the wafer is required at elevated or reduced temperatures. For example, temperature control of the wafer can be useful at temperatures in excess of the steady-state temperature achieved due to a balance of the heat flux delivered to the wafer 205 from the plasma and the heat flux removed from wafer 205 by conduction to the wafer holder 220.

As shown in FIG. 2A, wafer holder 220 includes a lower electrode 232 through which Radio Frequency (RF) power can be coupled to plasma in processing region 249. For example, lower electrode 232 can be electrically biased at an RF voltage via the transmission of RF power from RF generator 230 through impedance match network 231 to lower electrode 232. The RF bias can serve to heat electrons to form and maintain the IEO plasma. A typical frequency for the RF bias can range from 1 MHz to 100 MHz and is preferably 13.56 MHz.

Alternatively, RF power may be applied to the lower electrode 232 at multiple frequencies. Furthermore, impedance match network 231 serves to maximize the transfer of RF power to IEO plasma in IEC process chamber 210 by minimizing the reflected power. Various match network topologies and automatic control methods can be utilized.

With continuing reference to FIG. 2A, gas supply system 240 can be coupled to gas plenum 242 using interface elements 241, and the gas plenum 242 can be coupled to gas distribution elements (245a and 245b). The gas distribution elements (245a and 245b) can provide different flows (247a and 247b) of process gases to one or more areas of the processing region 249. Process gas can, for example, include a mixture of gases such as argon, Tetrafluoromethane ($CF_4$) and Oxygen ($O_2$), or argon (Ar), $C_4F_8$ and $O_2$ for oxide etch applications, or other chemistries such as, for example, $O_2/CO/Ar/C_4F_8$, $O_2/CO/Ar/C_5F_8$, $O_2/CO/Ar/C_4F_6$, $O_2/Ar/C_4F_6$, $N_2/H_2$, hydrogen bromide (HBr). Gas distribution elements (245a and 245b) can be configured to reduce or minimize the introduction of contaminants to wafer 205 and can include a multi-orifice gas injection showerhead. For example, process gas can be supplied from the gas supply system 240. Gas distribution elements (245a and 245b) can provide different flow rates (247a and 247b) to different regions of the processing region 249. In addition, gas distribution elements (245a and 245b) can provide different process gasses to different regions of the processing region 249.

The vacuum pumping system 257 can include a turbomolecular vacuum pump (TMP) 258 capable of a pumping speed up to 5000 liters per second (and greater) and a gate valve 259 for controlling the chamber pressure. In conventional plasma processing devices utilized for dry plasma etch processes, a 1000 to 3000 liter per second TMP is generally employed. TMPs are useful for low pressure processing, typically less than 50 mTorr. At higher pressures, the TMP pumping speed falls off dramatically. For high pressure processing (i.e., greater than 100 mTorr), a mechanical booster pump and dry roughing pump can be used. Furthermore, a device for monitoring chamber pressure (not shown) may be coupled to the IEC process chamber 210. The pressure-measuring device can be, for example, a Type 628B Baratron absolute capacitance manometer commercially available from MKS Instruments, Inc. (Andover, Mass.).

As depicted in FIG. 2A, the IEC etching subsystem 200A can include one or more process sensors 236 coupled to the IEC process chamber 210 to obtain process data, and controller 295 can be coupled to the process sensors 236 to receive process data. The process sensors 236 can include both sensors that are intrinsic to the IEC process chamber 210 and sensors extrinsic to the IEC process chamber 210. Intrinsic sensors can include those sensors pertaining to the functionality of IEC process chamber 210 such as the measurement of the Helium backside gas pressure, Helium backside flow, electrostatic clamping (ESC) voltage, ESC current, wafer holder temperature (or lower electrode (LEL) temperature), coolant temperature, upper electrode (UEL) temperature, forward RF power, reflected RF power, RF self-induced DC bias, RF peak-to-peak voltage, chamber wall temperature, process gas flow rates, process gas partial pressures, chamber pressure, matching network settings, a focus ring thickness, RF hours, focus ring RF hours, and any statistic thereof. In addition, extrinsic sensors can include one or more optical devices for monitoring the light emitted from the plasma in processing region 249 as shown in FIG. 2A. The optical devices can include an optical sensor that can be used as an End Point Detector (EPD) and can provide EPD data. For example, an Optical Emissions Spectroscopy (OES) sensor may be used. The process sensors 236 can include a current and/or voltage probe, a power meter, or spectrum analyzer. For example, process sensors 236 can include a RF Impedance analyzer.

In some embodiments, the IEC etching subsystem 200A can include one or more first ion energy (IE) sensors 234 coupled to IEC process chamber 210 to obtain first IE-related performance data, and controller 295 coupled to the IE-sensors 234 to receive the first IE-related performance data. In addition, the IEC etching subsystem 200A can include one or more second ion energy (IE) sensors 223 coupled to the wafer holder 220 to obtain second IE-related performance data, and an IE control unit 222 can be coupled to the IE-sensors 223 to process the IE-related performance data. For example, the measurement of an IE signal, such as a time trace of voltage or current, permits the transformation of the IE signal into frequency domain using discrete Fourier series representation (assuming a periodic signal). Thereafter, the Fourier spectrum (or for a time varying signal, the frequency spectrum) can be monitored and analyzed to characterize the state of the IEO plasma.

Controller 295 includes a microprocessor, memory, and a digital I/O port (potentially including D/A and/or A/D converters) capable of generating control voltages sufficient to communicate and activate inputs to etching subsystem 200 as well as monitor outputs from etching subsystem 200. As shown in FIG. 2A, controller 295 can be coupled to and exchange information with IEC process chamber 210, IE control unit 222, backside gas delivery system (226 and 227), temperature control system 228, first RF generator 230, impedance match network 231, IE-sensors 234, process sensors 236, gas supply system 240, gas plenum 242, and vacuum pumping system 257 using one or more interfaces 296. Programs stored in the memory can be utilized to interact with the aforementioned components of the IEC etching subsystem 200A according to a stored IE-related process recipe.

In the exemplary embodiment shown in FIG. 2B, the IEC etching subsystem 200B can be similar to the embodiment of FIG. 2A and further comprise either a stationary, or mechanically or electrically rotating magnetic field system 255, in order to potentially increase plasma density and/or improve plasma processing uniformity, in addition to those components described with reference to FIG. 2A. Moreover, controller 295 can be coupled to magnetic field system 255 in order to regulate the speed of rotation and field strength. The design and implementation of a rotating magnetic field is known to those skilled in the art.

In the embodiment shown in FIG. 2C, the IEC etching subsystem 200C can be similar to the embodiment of FIG. 2A or FIG. 2B, and can further comprise an upper electrode 274 to which RF power can be coupled from RF generator 270 through optional impedance match network 272. A frequency for the application of RF power to the upper electrode can range from about 0.1 MHz to about 200 MHz. Additionally, a frequency for the application of power to the lower electrode 232 can range from about 0.1 MHz to about 100 MHz. Moreover, controller 295 can be coupled to RF generator 270 and impedance match network 272 in order to control the application of RF power to upper electrode 274. The design and implementation of an upper electrode is well known to those skilled in the art. The upper electrode 274 and the gas plenum 242 can be coupled to each other as shown.

In the embodiment shown in FIG. 2D, the IEC etching subsystem 200D can be similar to the embodiments of FIGS. 2A and 2B, and can further comprise an inductive coil 283 to which RF power can be coupled via RF generator 280 through optional impedance match network 282. RF power can be inductively coupled from inductive coil 283 through a dielectric window (not shown) to processing region 249. A frequency for the application of RF power to the inductive coil 283 can range from about 10 MHz to about 100 MHz. Similarly, a frequency for the application of power to the lower electrode 232 can range from about 0.1 MHz to about 100 MHz. In addition, a slotted Faraday shield (not shown) can be employed to reduce capacitive coupling between the inductive coil 283 and the IEO plasma. Moreover, controller 295 can be coupled to RF generator 280 and impedance match network 282 in order to control the application of power to inductive coil 283.

In an alternate embodiment (not shown), is a "spiral" coil or "pancake" coil configuration may be used for the inductive coil. The design and implementation of an inductively coupled plasma (ICP) source, or transformer coupled plasma (TCP) source, is well known to those skilled in the art.

In the embodiment shown in FIG. 2E, the IEC etching subsystem 200E can, for example, be similar to the embodiments of FIGS. 2A, 2B, 2C, and 2D, and can further comprise a second RF generator 250 configured to couple RF power to wafer holder 220 through another optional impedance match network 251. A typical frequency for the application of RF power to wafer holder 220 can range from about 0.1 MHz to about 200 MHz for either the first RF generator 230 or the second RF generator 250 or both. The RF frequency for the second RF generator 250 can be relatively greater than the RF frequency for the first RF generator 230. Furthermore, the RF power to the wafer holder 220 from the first RF generator 230 can be amplitude modulated, the RF power to the wafer holder 220 from the second RF generator 250 can be amplitude modulated, or both RF powers can be amplitude modulated. Desirably, the RF power at the higher RF frequency is amplitude modulated. Moreover, controller 295 can be coupled to the second RF generator 250 and impedance match network 251 in order to control the application of RF power to wafer holder 220. The design and implementation of an RF system for a wafer holder is well known to those skilled in the art.

In the embodiment shown in FIG. 2F, the IEC etching subsystem 200F can be similar to the embodiments of FIGS. 2A and 2E, and can further comprise a surface wave plasma (SWP) source. The SWP source can comprise a slot antenna 287, such as a radial line slot antenna (RLSA), to which microwave power is coupled via microwave generator 285 through optional impedance match network 286.

Figure 2G:
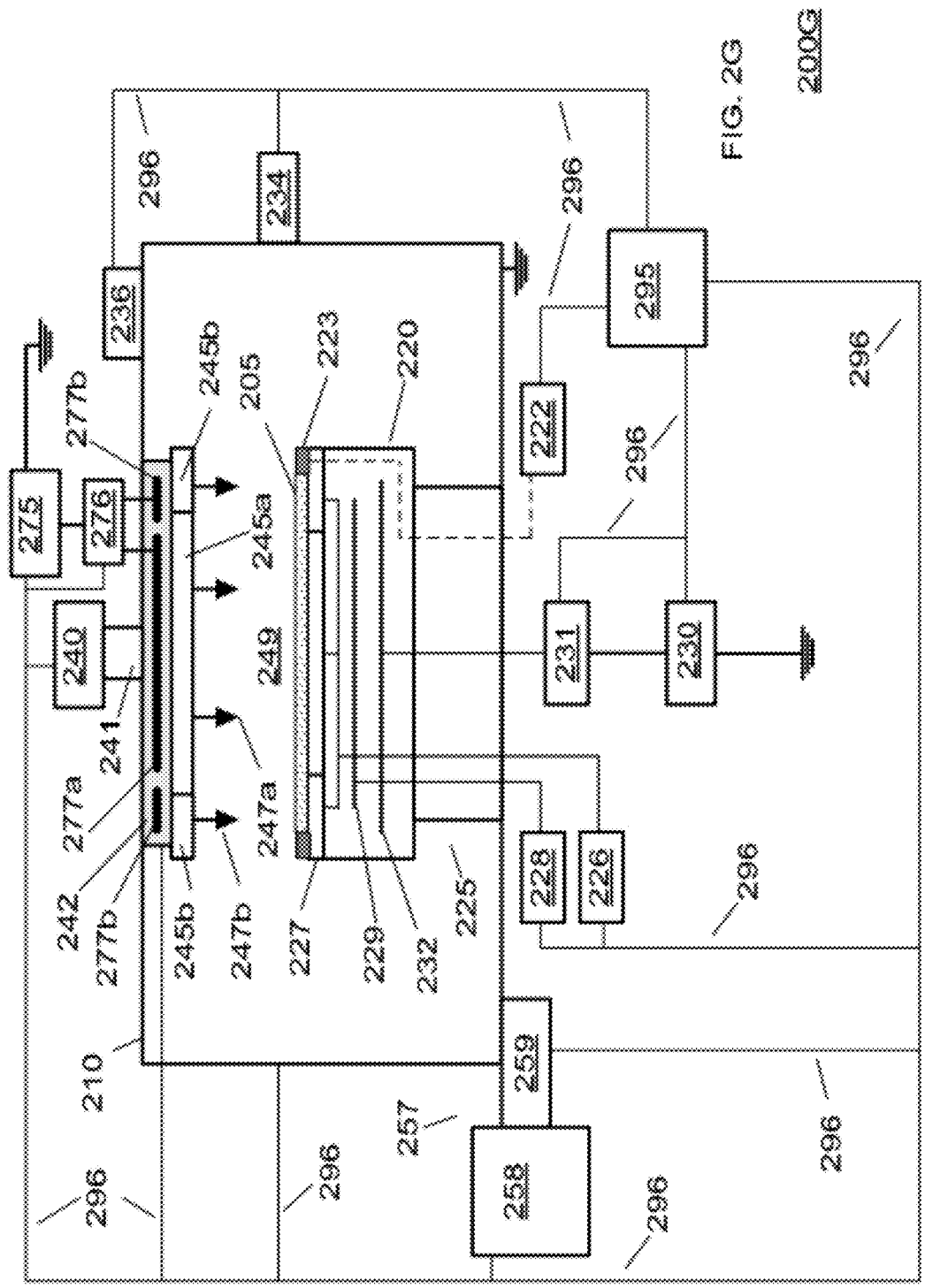

In the embodiment shown in FIG. 2G, the IEC etching subsystem 200G can be similar to the embodiment of FIG. 2C, and can further comprise a split upper electrode (277a, 277b) to which RF power can be coupled from RF generator 275 through an impedance match network/power splitter 276. A frequency for the application of RF power to the split upper electrode (277a, 277b) can range from about 0.1 MHz to about 200 MHz. Additionally, a frequency for the application of power to the lower electrode 232 can range from about 0.1 MHz to about 100 MHz. Moreover, controller 295 can be coupled to RF generator 275 and impedance match network/power splitter 276 in order to control the application of RF power to split upper electrode (277a, 277b). The power splitter and the split upper electrode can be designed and configured to provide different RF power levels to the center and the edge of the processing region 249 to facilitate the generation and control of a the IEO plasma in processing region 249 adjacent a surface of wafer 205. The split upper electrode (270a, 270b) and the gas plenum 242 can be coupled to each other as shown, or other configurations may be used.

FIGS. 3A-3G show additional embodiments for Ion Energy Controlled (IEC) etching subsystems in accordance with embodiments of the invention. FIGS. 3A-3G illustrate exemplary IEC etching subsystems 300A-300G that are similar to the exemplary etching subsystems 200A-200G shown in FIGS. 2A-2G, but IEC etching subsystems 300A-300G include at least one DC electrode 392 and at least one DC source 390.

During patterned etching, a dry plasma etching process is often utilized, and the plasma is formed from a process gas by coupling electro-magnetic (EM) energy, such as radio frequency (RF) power, to the process gas in order to heat electrons and cause subsequent ionization and dissociation of the atomic and/or molecular composition of the process gas. In addition, negative, high voltage direct current (DC) electrical power can be coupled to the plasma processing system in order to create an energetic (ballistic) electron beam that strikes the wafer surface during a fraction of the RF cycle, i.e., the positive half-cycle of the coupled RF power. It has been observed that the ballistic electron beam can enhance the properties of the dry plasma etching process by, for example, improving the etch selectivity between the underlying thin film (to be etched) and the mask layer, reducing charging damage such as electron shading damage, etc. Additional details regarding the generation of a ballistic electron beam are disclosed in pending U.S. patent application Ser. No. 11/156,559, entitled "Plasma processing apparatus and method" and published as US patent application no. 2006/0037701A1; the contents of which are herein incorporated by reference in their entirety. In general, the ballistic electron beam can be implemented within various types of plasma processing system, as shown in FIGS. 3A-3G.

A first exemplary IEC etching subsystem 300A is shown in FIG. 3A, and the illustrated IEC etching subsystem 300A includes IEC process chamber 310, wafer holder 320, upon which a wafer 305 to be processed is affixed, gas supply system 340, and vacuum pumping system 357. For example, wafer holder 320 can be coupled to and insulated from IEC process chamber 310 using base 325. Wafer 305 can be, for example, a semiconductor wafer, a work piece, or a liquid crystal display (LCD). For example, IEC process chamber 310 can be configured to facilitate the generation of IEO plasma in processing region 349 adjacent a surface of wafer 305, and the IEO plasma is formed via collisions between heated electrons and an ionizable gas. An ionizable gas or mixture of gases can be introduced from the gas supply system 340, and process pressure is adjusted using vacuum pumping system 357. Desirably, the IEO plasma can be used to create materials specific to a predetermined material process, and to aid either the deposition of material to wafer 305 or the removal of material from the exposed surfaces of wafer 305. For example, controller 395 can be used to control vacuum pumping system 357 and gas supply system 340.

Wafer 305 can be, for example, transferred into and out of IEC process chamber 310 through a slot valve (not shown) and chamber feed-through (not shown) via robotic transfer system where it is received by wafer lift pins (not shown) housed within wafer holder 320 and mechanically translated by devices housed therein. After the wafer 305 is received from transfer system, it is lowered to an upper surface of wafer holder 320.

For example, wafer 305 can be affixed to the wafer holder 320 via an electrostatic clamping system (not shown). The wafer holder 320 can include temperature control elements 329 that can be coupled to a temperature control system 328. For example, the temperature control elements 329 can include resistive heating elements, or thermo-electric heaters/coolers. Backside gas can be delivered to the backside of the wafer via a dual (center/edge) backside gas delivery system (326 and 327) to improve the gas-gap thermal conductance between wafer 305 and wafer holder 320. A dual (center/edge) backside gas delivery system (326 and 327) can be utilized when additional temperature control of the wafer is required at elevated or reduced temperatures. For example, temperature control of the wafer can be useful at temperatures in excess of the steady-state temperature achieved due to a balance of the heat flux delivered to the wafer 305 from the plasma and the heat flux removed from wafer 305 by conduction to the wafer holder 320.

As shown in FIG. 3A, wafer holder 320 includes a lower electrode 332 through which Radio Frequency (RF) power can be coupled to plasma in processing region 349. For example, lower electrode 332 can be electrically biased at an RF voltage via the transmission of RF power from RF generator 330 through impedance match network 331 to lower electrode 332. The RF bias can serve to heat electrons to form and maintain the IEO plasma. A typical frequency for the RF bias can range from 1 MHz to 100 MHz and is preferably 13.56 MHz.

Alternatively, RF power may be applied to the lower electrode 332 at multiple frequencies. Furthermore, impedance match network 331 serves to maximize the transfer of RF power to IEO plasma in IEC process chamber 310 by minimizing the reflected power. Various match network topologies and automatic control methods can be utilized.

With continuing reference to FIG. 3A, gas supply system 340 can be coupled to gas plenum 342 using interface elements 341, and the gas plenum 342 can be coupled to gas distribution elements (345a and 345b). The gas distribution elements (345a and 345b) can provide different flows (347a and 347b) of process gases to one or more areas of the processing region 349. Process gas can, for example, include a mixture of gases such as argon, Tetrafluoromethane ($CF_4$) and Oxygen ($O_2$), or argon (Ar), $C_4F_8$ and $O_2$ for oxide etch applications, or other chemistries such as, for example, $O_2/CO/Ar/C_4F_8$, $O_2/CO/Ar/C_5F_8$, $O_2/CO/Ar/C_4F_6$, $O_2/Ar/C_4F_6$, $N_2/H_2$, hydrogen bromide (HBr). Gas distribution elements (345a and 345b) can be configured to reduce or minimize the introduction of contaminants to wafer 305 and can include a multi-orifice gas injection showerhead. For example, process gas can be supplied from the gas supply system 340. Gas distribution elements (345a and 345b) can provide different flow rates (347a and 347b) to different regions of the processing region 349. In addition, gas distribution elements (345a and 345b) can provide different process gasses to different regions of the processing region 349.

The vacuum pumping system 357 can include a turbo-molecular vacuum pump (TMP) 358 capable of a pumping speed up to 5000 liters per second (and greater) and a gate valve 359 for controlling the chamber pressure. In conventional plasma processing devices utilized for dry plasma etch processes, a 1000 to 3000 liter per second TMP is generally employed. TMPs are useful for low pressure processing, typically less than 50 mTorr. At higher pressures, the TMP pumping speed falls off dramatically. For high pressure processing (i.e., greater than 100 mTorr), a mechanical booster pump and dry roughing pump can be used. Furthermore, a device for monitoring chamber pressure (not shown) may be coupled to the IEC process chamber 310. The pressure-measuring device can be, for example, a Type 628B Baratron absolute capacitance manometer commercially available from MKS Instruments, Inc. (Andover, Mass.).

As depicted in FIG. 3A, the IEC etching subsystem 300A can include one or more process sensors 336 coupled to IEC process chamber 310 to obtain performance data, and controller 395 coupled to the process sensors 336 to receive performance data. The process sensors 336 can include both sensors that are intrinsic to the IEC process chamber 310 and sensors extrinsic to the IEC process chamber 310. Intrinsic sensors can include those sensors pertaining to the functionality of IEC process chamber 310 such as the measurement of the Helium backside gas pressure, Helium backside flow, electrostatic clamping (ESC) voltage, ESC current, wafer holder temperature (or lower electrode (LEL) temperature), coolant temperature, upper electrode (UEL) temperature, forward RF power, reflected RF power, RF self-induced DC bias, RF peak-to-peak voltage, chamber wall temperature, process gas flow rates, process gas partial pressures, chamber pressure, matching network settings, a focus ring thickness, RF hours, focus ring RF hours, and any statistic thereof. In addition, extrinsic sensors can include one or more optical devices for monitoring the light emitted from the plasma in processing region 349 as shown in FIG. 3A. The optical devices can include an optical sensor that can be used as an End Point Detector (EPD) and can provide EPD data. For example, an Optical Emissions Spectroscopy (OES) sensor may be used. The process sensors 336 can include a current and/or voltage probe, a power meter, or spectrum analyzer. For example, process sensors 336 can include a RF Impedance analyzer.

In some embodiments, the IEC etching subsystem 300A can include one or more ion energy (IE) sensors 334 coupled to IEC process chamber 310 to obtain IE-related performance data, and controller 395 coupled to the IE-sensors 334 to receive IE-related performance data. In addition, the IEC etching subsystem 300A can include one or more ion energy (IE) sensors 323 coupled to the wafer holder 320 to obtain IE-related performance data, and an IE control unit 322 can be coupled to the IE-sensors 323 to process the IE-related performance data. For example, the measurement of an IE signal, such as a time trace of voltage or current, permits the transformation of the IE signal into frequency domain using discrete Fourier series representation (assuming a periodic signal). Thereafter, the Fourier spectrum (or for a time varying signal, the frequency spectrum) can be monitored and analyzed to characterize the state of the IEO plasma.

Controller 395 includes a microprocessor, memory, and a digital I/O port (potentially including D/A and/or A/D converters) capable of generating control voltages sufficient to communicate and activate inputs to the IEC etching subsystems (300A-300G) as well as monitor outputs from the IEC etching subsystems (300A-300G). As shown in FIG. 3A, controller 395 can be coupled to and exchange information with IEC process chamber 310, IE control unit 322, backside gas delivery system (326 and 327), temperature control system 328, first RF generator 330, impedance match network 331, IE-sensors 334, process sensors 336, gas supply system 340, gas plenum 342, and vacuum pumping system 357 using one or more interfaces 396. Programs stored in the memory can be utilized to interact with the aforementioned components of the IEC etching subsystem 300A according to a stored IE-related process recipe.

In the exemplary embodiment shown in FIG. 3B, the IEC etching subsystem 300B can be similar to the embodiment of FIG. 3A and further comprise either a stationary, or mechanically or electrically rotating magnetic field system 355, in order to potentially increase plasma density and/or improve plasma processing uniformity, in addition to those components described with reference to FIG. 3A. Moreover, controller 395 can be coupled to magnetic field system 355 in order to regulate the speed of rotation and field strength. The design and implementation of a rotating magnetic field is known to those skilled in the art.

Figure 3C:
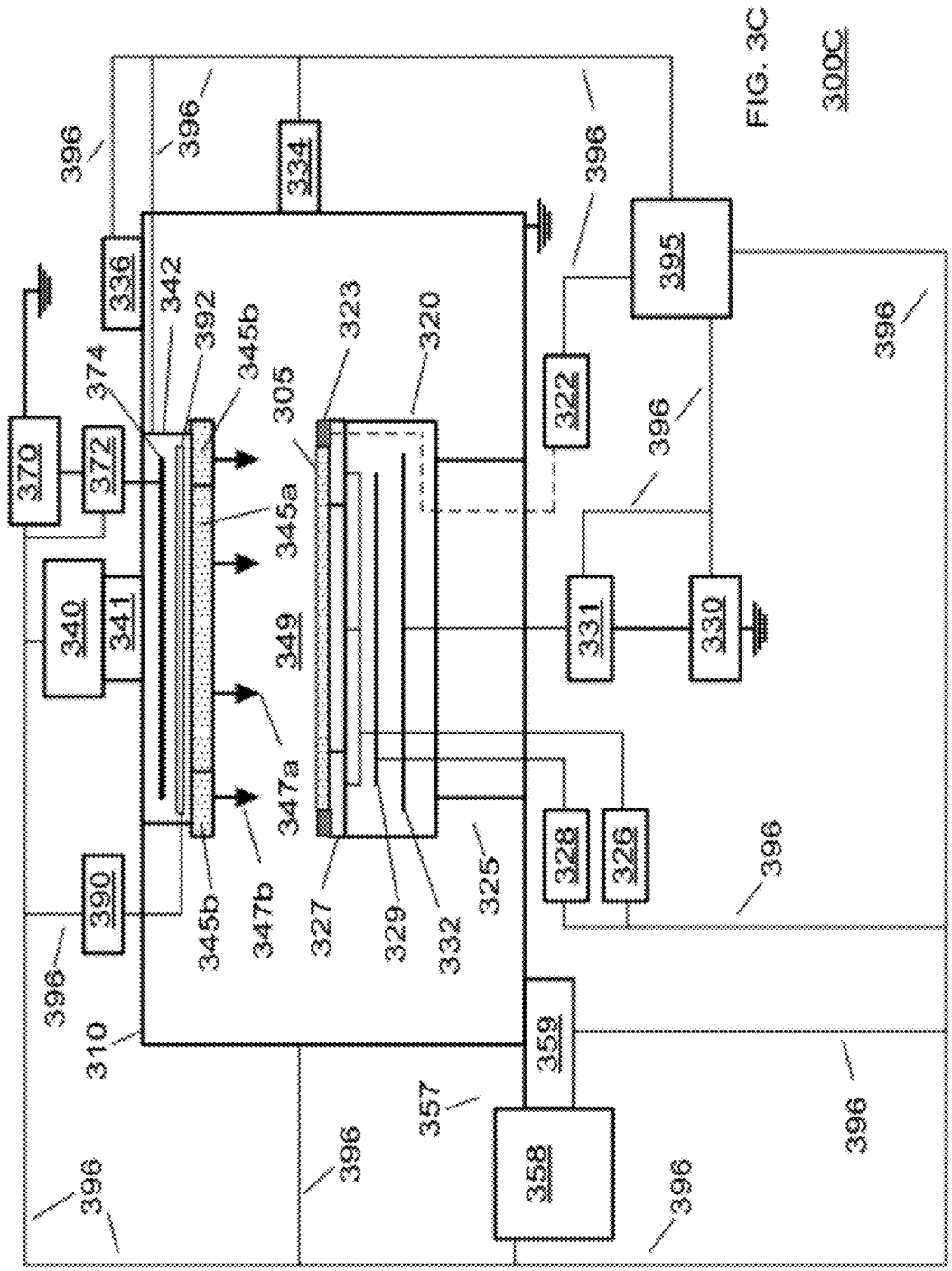

In the embodiment shown in FIG. 3C, the IEC etching subsystem 300C can be similar to the embodiment of FIG. 3A or FIG. 3B, and can further comprise an upper electrode 374 to which RF power can be coupled from RF generator 370 through optional impedance match network 372. A frequency for the application of RF power to the upper electrode can range from about 0.1 MHz to about 200 MHz. Additionally, a frequency for the application of power to the lower electrode 332 can range from about 0.1 MHz to about 100 MHz. Moreover, controller 395 can be coupled to RF generator 370 and impedance match network 372 in order to control the application of RF power to upper electrode 374. The design and implementation of an upper electrode is well known to those skilled in the art. The upper electrode 374 and the gas plenum 342 can be coupled to each other as shown.

Figure 3D:
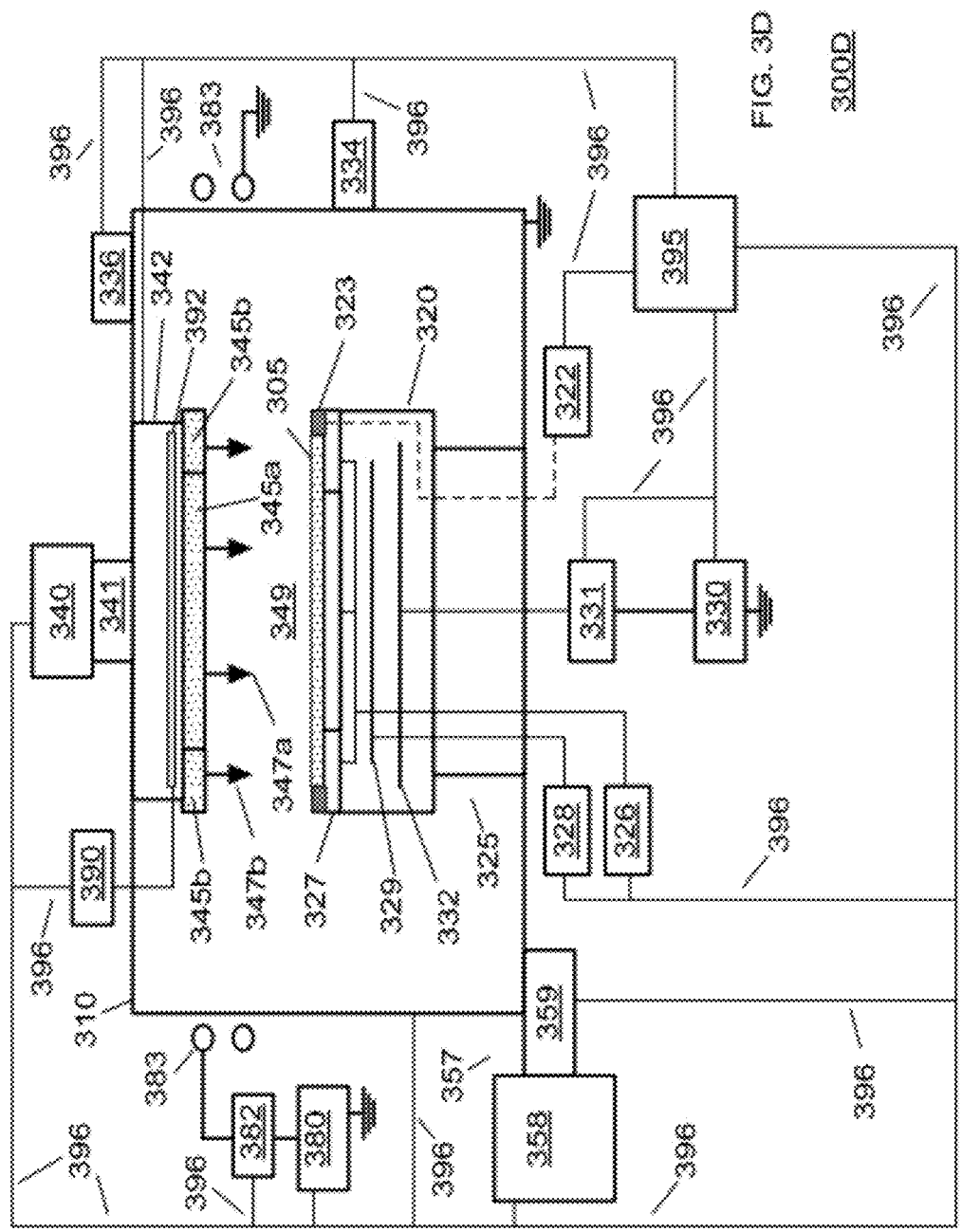

In the embodiment shown in FIG. 3D, the IEC etching subsystem 300D can be similar to the embodiments of FIGS. 3A and 3B, and can further comprise an inductive coil 383 to which RF power can be coupled via RF generator 380 through optional impedance match network 382. RF power can be inductively coupled from inductive coil 383 through a dielectric window (not shown) to processing region 349. A frequency for the application of RF power to the inductive coil 383 can range from about 10 MHz to about 100 MHz. Similarly, a frequency for the application of power to the lower electrode 332 can range from about 0.1 MHz to about 100 MHz. In addition, a slotted Faraday shield (not shown) can be employed to reduce capacitive coupling between the inductive coil 383 and the IEO plasma. Moreover, controller 395 can be coupled to RF generator 380 and impedance match network 382 in order to control the application of power to inductive coil 383.

In an alternate embodiment (not shown), is a "spiral" coil or "pancake" coil configuration may be used for the inductive coil. The design and implementation of an inductively coupled plasma (ICP) source, or transformer coupled plasma (TCP) source, is well known to those skilled in the art.

In the embodiment shown in FIG. 3E, the IEC etching subsystem 300E can, for example, be similar to the embodiments of FIGS. 3A, 3B, 3C, and 3D, and can further comprise a second RF generator 350 configured to couple RF power to wafer holder 320 through another optional impedance match network 351. A typical frequency for the application of RF power to wafer holder 320 can range from about 0.1 MHz to about 200 MHz for either the first RF generator 330 or the second RF generator 350 or both. The RF frequency for the second RF generator 350 can be relatively greater than the RF frequency for the first RF generator 330. Furthermore, the RF power to the wafer holder 320 from the first RF generator 330 can be amplitude modulated, the RF power to the wafer holder 320 from the second RF generator 350 can be amplitude modulated, or both RF powers can be amplitude modulated. Desirably, the RF power at the higher RF frequency is amplitude modulated. Moreover, controller 395 can be coupled to the second RF generator 350 and impedance match network 351 in order to control the application of RF power to wafer holder 320. The design and implementation of an RF system for a wafer holder is well known to those skilled in the art.

In the embodiment shown in FIG. 3F, the IEC etching subsystem 300F can be similar to the embodiments of FIGS. 3A and 3E, and can further comprise a surface wave plasma (SWP) source. The SWP source can comprise a slot antenna 387, such as a radial line slot antenna (RLSA), to which microwave power is coupled via microwave generator 385 through optional impedance match network 386.

In the embodiment shown in FIG. 3G, the IEC etching subsystem 300G can be similar to the embodiment of FIG. 3C, and can further comprise a split upper electrode (377$a$, 377$b$) to which RF power can be coupled from RF generator 375 through an impedance match network/power splitter 376. A frequency for the application of RF power to the split upper electrode (377$a$, 377$b$) can range from about 0.1 MHz to about 200 MHz. Additionally, a frequency for the application of power to the lower electrode 332 can range from about 0.1 MHz to about 100 MHz. Moreover, controller 395 can be coupled to RF generator 375 and impedance match network/power splitter 376 in order to control the application of RF power to split upper electrode (377$a$, 377$b$). The power splitter and the split upper electrode can be designed and configured to provide different RF power levels to the center and the edge of the processing region 349 to facilitate the generation and control of a the IEO plasma in processing region 349 adjacent a surface of wafer 305. The split upper electrode (370$a$, 370$b$) and the gas plenum 342 can be coupled to each other as shown, or other configurations may be used.

The DC electrode 392 shown in the IEC etching subsystems (300A-300G) may comprise a silicon-containing material and/or a doped silicon-containing material. The DC source 390 can include a variable DC power supply. Additionally, the DC source 390 can include a bipolar DC power supply. The DC source 390 can further include a system configured to perform at least one of monitoring, adjusting, or controlling the polarity, current, voltage, and/or on/off state of the DC source 390. Once plasma is formed, the DC source 390 facilitates the formation of a ballistic electron beam. An electrical filter may be utilized to de-couple RF power from the DC source 390.

For example, the DC voltage applied to DC electrode 392 by DC source 390 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage.

In alternate embodiments, a Chemical Oxide Removal (COR) subsystem (not shown) can be used to remove or trim oxidized poly-Si material. In addition, the COR subsystem may be used to remove or trim an oxide masking layer. For example, a COR subsystem can comprise a chemical treatment module (not shown) for chemically treating exposed surface layers, such as oxide surface layers, on a wafer, whereby adsorption of the process chemistry on the exposed surfaces affects chemical alteration of the surface layers. Additionally, the COR subsystem can comprise thermal treatment module (not shown) for thermally treating the wafer, whereby the wafer temperature is elevated in order to desorb (or evaporate) the chemically altered exposed surface layers on the wafer.

Figure 4:
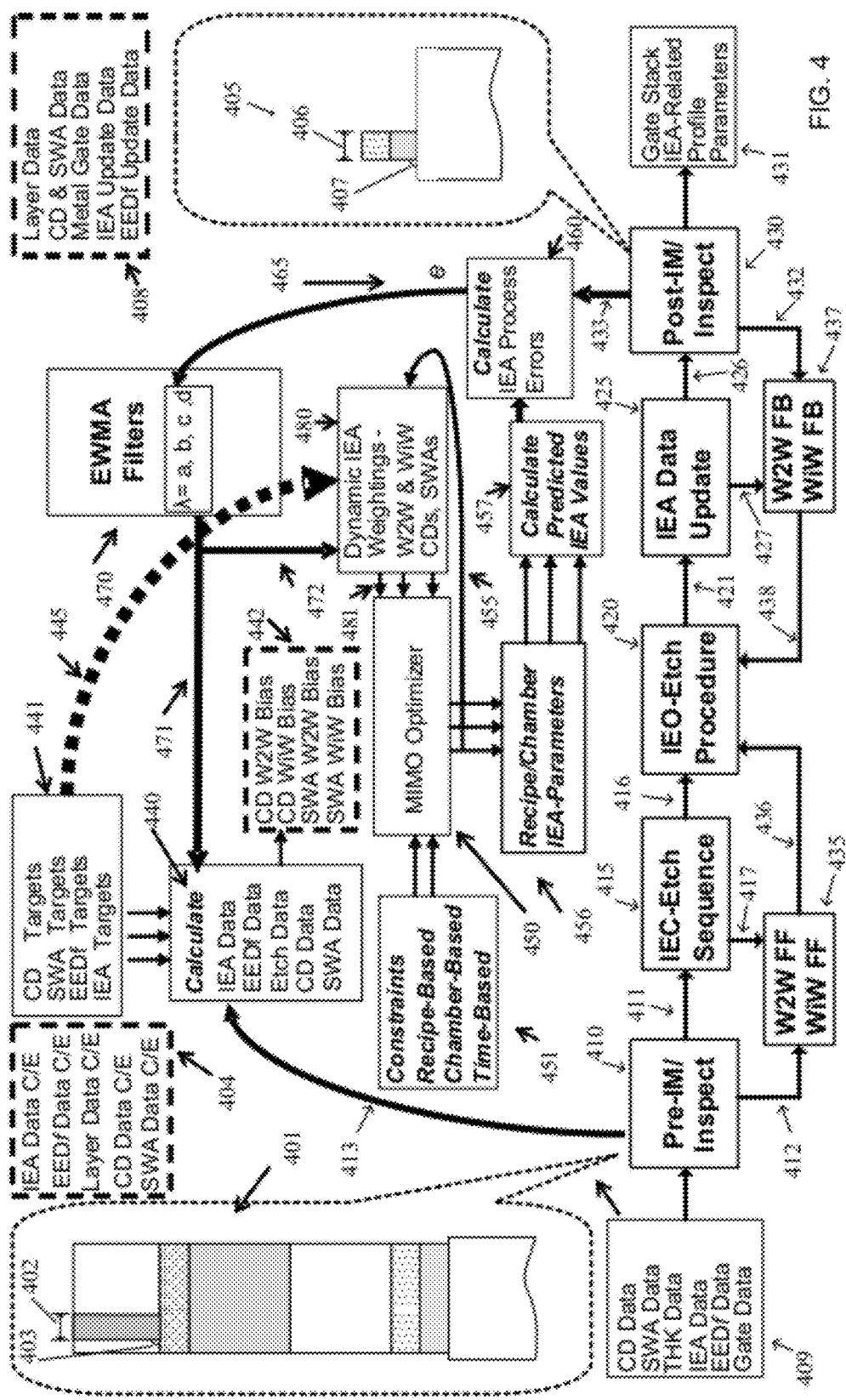
FIG. 4 shows a simplified block diagram of an exemplary Ion Energy Controlled Multi-Input/Multi-Output (IEC-MIMO) model optimization and control methodology in accordance with embodiments of the invention.

FIG. 4 shows a simplified block diagram of an exemplary Ion Energy Controlled Multi-Input/Multi-Output (IEC-MIMO) model optimization and control methodology in accordance with embodiments of the invention. In the illustrated MIMO model methodology, exemplary images of a portion of a first patterned gate stack 401 and a post-processed gate stack 405 are shown. The soft-mask layer of the first patterned gate stack 401 can include one or more soft-mask feature CDs 402 and one or more soft-mask feature sidewall angles (SWAs) 403. The first patterned gate stack 401 can be characterized using a first set of IE-related parameters 404 that can include center/edge (C/E) layer data, EEDf C/E data, IE C/E data, CD data C/E, IED data, and SWA data C/E. Alternatively, a different set of IE-related parameters may be used. The post-processed gate stack 405 can include one or more CDs 406 and one or more SWAs 407. The post-processed gate stack 405 can be characterized using a second set of parameters 408 that can include center and edge (C/E) metal gate and/or feature data, C/E target layer data, CD data C/E, SWA data C/E, IE update data C/E, and EEDf update data. Alternatively, a different set of IE-related post-processing parameters may be used.

In the illustrated methodology, a pre-processing integrated metrology (IM) and/or inspect process/tool (Pre-IM/Inspect) model 410 can be coupled to one or more IEC-etch sequence models 415. One or more of the IEC-etch sequence models 415 can be coupled to one or more IEO-Etch procedure models 420. One or more of the IEO-Etch procedure models 420 can be coupled to one or more IE data update models 425. One or more of the IE data update models 425 can be coupled to one or more post-processing integrated metrology (IM) and/or inspect process/tool (Post-IM/Inspect) model 430.

The (Pre-IM/Inspect) model 410 can receive input data 409, can provide first output data 411 to the IEC-etch sequence model 415, and can provide first feed forward data 412 to the IE-related feed forward model 435. The IEC-etch sequence models 415 can receive data 411 can provide second output data 416 to the IEO-etch procedure model 420 and can provide second feed forward data 417 to the IE-related feed forward model 435. The IEO-etch procedure model 420 can receive the second output data 416, can receive third feed forward data 436, can receive feedback data 438, and can send IE-procedure data 421 to the IE data update models 425. The IE data update model 425 can receive IE-procedure data 421, can provide update data 426 to the (Post-IM/Inspect) model 430, and can provide first feedback data 427 to the IE-related feedback model 437. The (Post-IM/Inspect) model 430 can receive the update data 426, can provide third output data 431, and can provide second feedback data 432 to the IE-related feedback model 437. The IE-related feed forward model 435 can receive first feed forward data 412, can receive second feed forward data 417, and can provide the third feed forward data 436, and the IE-related feedback model 437 can receive first feedback data 427, can receive second feedback data 432, and can provide the third feedback data 438.

In some examples, the input data 409 can include CD data, SWA data, thickness data, IE data, EEDf data, IED data, or gate data, or any combination thereof, and the first output data 411 and the first feed forward data 412 can include CD data, SWA data, ODP data, inspection data, thickness data, IE data, EEDf data, IED data, or gate data, or any combination thereof. The second output data 416 and the second feed forward data 417 can include recipe data, CD data, SWA data, ODP data, inspection data, thickness data, IE data, EEDf data, or gate data, or any combination thereof, and the IE-procedure data 421 can include result data, CD data, SWA data, ODP data, inspection data, thickness data, IE data, EEDf data, or gate data, or any combination thereof. The update data 426 and the first feedback data 427 can include recipe data, IE data, EEDf data, ODP data, inspection data, thickness data, IE data, EEDf data, or gate data, or any combination thereof, and the third output data 431 and the second feedback data 432 can include result data, CD data, SWA data, ODP data, inspection data, thickness data, IE data, EEDf data, or gate data, or any combination thereof. The third feed forward data 436 can include wafer-to-wafer feed-forward data (W2W FF) and within-wafer feed-forward data (WiW FF), and the third feedback data 438 can include wafer-to-wafer feedback data (W2W FB) and within-wafer feedback data (WiW FB). In addition, one or more of the models (410, 415, 420, 425, and 430) can be used to control the IE-related post-processed gate stack 405 on a wafer-to-wafer (W2W) basis and/or to control the IE-related post-processed gate stack 405 on a Within-Wafer (WiW) basis.

Data items 413 can be sent to a first calculation element 440 that can be used to calculate some of the IE data, the EEDf data, the etch data, the CD data, the SWA data, and/or other gate stack data at the center of the wafer and at the edge of the wafer. For example, the first calculation element 440 can be used to calculate the IE-related bias at the center of the wafer and at the edge of the wafer. A first set of target parameters 441 can be provided to the first calculation element 440, and a first set of filter outputs 471 can be provided to the first calculation element 440. Output data items 442 from the first calculation element 440 can be provided to one or more MIMO model Optimizers 450.

One or more of the MIMO model Optimizers 450 can be provided with one or more IE-related constraint parameters 451 that can include tool limits, recipe limits, and/or time limits that are IE-related. For example, the IE-related constraint parameters 451 can include step-based wafer temperature limits or process gas limits during an IE etch procedure. One or more of the MIMO model Optimizers 450 can determine one or more sets of recipe/chamber parameters 456 that can be sent to one or more of the tool controller/models (410, 415, 420, 425, and 430).

One or more of the tool controller/models (410, 415, 420, 425, and 430) can be used to calculate predicted IE values 457 that can include one or more predicted etch biases, one or more predicted SWA biases, one or more predicted step times for one or more etch recipes, and one or more predicted process gas flows for one or more etch recipes.

One or more of the (Post-IM/Inspect) model 430 can provide one or more actual outputs 433 to one or more comparison elements 460, and one or more of the actual outputs 433 can be compared to one of more of the predicted data items 457. One or more of the error values 465 from one or more of the comparison elements 460 can be provided to one or more of the EWMA filters 470.

One or more of the EWMA filters 470 can provide one or more first filtered outputs 471 to the first calculation element 440, and one or more of the EWMA filters 470 can provide one or more second filtered outputs 472 to one or more of the weighting controller/models 480. Each of the EWMA filters 470 can filter and provide feedback data for a single parameter or error value. Alternatively, each of the EWMA filters 470 can filter and provide feedback data for multiple parameters or error values. One or more of the weighting controller/models 480 can receive one or more target data items 445 and one or more feedback data items 455 from one or more of the MIMO model Optimizers 450. In addition, one or more of the weighting controller/models 480 can provide one or more dynamically varying weighting inputs 481 to one or more of the MIMO model Optimizers 450. The concept of using dynamic weightings based on the feedback error is to force the optimizer to prioritize the weightings (rebalance) with a goal of better control of the most important CVs—automation of a manual tuning of a control system in runtime.

In some embodiments, the manipulated variables and/or the disturbance variables used for control can include a calculated value that can be dynamically modeled and updated during the runtime processing by the following method: 1) the modeling procedure can start with a basic model relationship that "pairs" IE-sensor data to a controlled variable (CV). For example, the amount of Atomic O or F can be calculated by using process gas data from the IE-sensor or a process sensor, and the amount of Atomic O or F that is consumed can be used to predict a CD or a SWA. This could be a feedback update loop, or a real-time adjustment during an etch step. 2) After a wet clean is performed, the first patterned gate stacks processed during conditioning or production would be used to calculate and update this trace gas model. 3) The Relative Gain Array (RGA) method can be used at run-time with production patterned wafers to evaluate when to use the IE-sensor data vs. CV feedback in place of just calculating a value, The RGA matrix for the given CV value would be re-evaluated to determine if the value of the sensor based MV is stronger than the litho incoming CV for use as a real-time CV value. 4) In addition, center to edge sensor detection using OES signal—The rate of change can also be used as an example commonly understood to adjust the over etch recipe settings to improve the uniformity (correct for the non-uniformity of the previous steps etch, by adjusting the over-etch steps center to edge knobs, such as $_{O2}$ flow, temp, top power, pressure. IM CV would be the film thickness of incoming wafers to separate incoming—such as BARC thickness from etch rate of the current chamber center to edge.

In some embodiments, the control variables associated with various patterned wafers created by the first, second, and/or third IEC-etch sequences can be center CD and SWA values, middle CD and SWA values, edge CD and SWA values, and extreme edge CD and SWA values, and this can require a total of eight IM measurements at four or more sites on the wafer. The pre- and post-IM measurements can be performed using dynamic sampling.

In other embodiments, the manipulated variables can include back-side gas flows to one or more zones in the wafer holder, and the back-side gas flows can be dynamically controlled during processing to provide dynamic backside gas temperature control for improved within-wafer process uniformity by adjusting wafer areas that are non-radial in nature based on incoming CV requirements.

In still other embodiments, the manipulated variables can include flow rates for edge gas injection flow rates. This approach could also be used to reduce the starvation problem at the wafer edge, and make the edge starvation a controllable variable based on the incoming signature and chamber state.

In some IE-related MIMO models, the interaction terms can be updated between lots during an offline triggered calculation update procedure. For example, the cross term calculation update can be triggered by checking the sensitivity of the current system to changes in the cross terms, and by running a set of pre-defined delta offsets to see if adjusting the cross terms would have improved the average control. RGA can be used in this calculation, and the trigger events can be used to perform adaptive feedback updates for the IE-related MIMO model. For example, adaptive feedback can be used when copying the IE-related MIMO model from chamber to chamber and allowing the IE-related MIMO model to adapt to the new chamber behavior. Another use arises when a new product is released and the old product equation can be used to start the model, then after so many wafers the model update is triggered and a new model is adjusted, and the resulting model can then be used and monitored for performance.

FIGS. 5A and 5A' illustrate exemplary views of a first IE-related process sequence for creating first dual patterned features in accordance with embodiments of the invention. In the illustrated embodiment, three exemplary patterned wafers (501a-503a) are shown having exemplary feature stacks (505a-507a) thereon, but this is not required for the invention. Alternatively, a different number of patterned wafers with different configurations may be used. In some embodiments, the three exemplary patterned wafers (501a, 502a, and 503a) and the associated multi-layer feature stacks (505a, 506a, and 507a) can be created using a first set of IEC-etch procedures that can be performed using one or more of the etch subsystems described herein in FIGS. 2A-2G and FIGS. 3A-3G. Alternatively, other etch subsystems and/or etching procedures may be used.

In FIG. 5A, a first input data model 580a is illustrated, and a first set of input data can be obtained when the first input data model 580a is executed. The first input data can include real-time and/or historical IE-related data.

In FIG. 5A, a first IE-select MIMO model 581a is illustrated, and a first IEC-etch sequence can be selected using the first IE-select MIMO model 581a, and the first IE-select MIMO model 581a can exchange Measured Variable (MV) data using transfer means 590, can exchange Disturbance Variable (DV) data using transfer means 591, and can exchange Controlled Variable (CV) data using transfer means 592. For example, the first IE-select MIMO model 581a can create and/or use first IE-related data associated with the first IEC-etch sequence, and the first IE-related data can be fed forward and/or fed back using transfer means (590, 591, and/or 592).

When the first IE-select MIMO model 581a is executed, a first IEC-etch sequence can be selected using controller (295 shown in FIGS. 2A-2G) and/or controller (395 shown in FIGS. 3A-3G). In some examples, the controllers (295 and/or 395) can use first IE-related library data for the first patterned wafer 501a and/or the second patterned wafer 502a. The first IE-related library data for the first patterned wafer 501a can include historical IEC-etch sequence data collected using one or more IE-sensors (223 and/or 234 shown in FIGS. 2A-2G) and/or IE-sensors (323 and/or 334 shown in FIGS. 3A-3G), when the first feature stacks 505a were being created on the first patterned wafer 501a. The first IE-related library data for the second patterned wafer 502a can include second historical IEC-etch sequence data collected using one or more IE-sensors (223 and/or 234 shown in FIGS. 2A-2G) and/or IE-sensors (323 and/or 334 shown in FIGS. 3A-3G), when the second feature stacks 506a were previously created on the previously created second patterned wafers 502a.

In FIG. 5A', a first patterned wafer 501a comprising a first feature stack 505a is shown that includes a substrate layer 510a, a target layer 520a, a third hard mask layer 530a, a second hard mask layer 540a, a feature-width control (FWC) layer 550a, a first hard mask layer 560a, and a pattern soft mask layer 570a. For example, the substrate layer 510a can include a semiconductor material; the target layer 520a can include dielectric or metallic material; the third hard mask layer 530a can include TiN; the second hard mask layer 540a can include Tetraethyl Orthosilicate, (TEOS) $[Si(OC_2H_5)_4]$; the FWC layer 550a can include width-control material; the first hard mask layer 560*a* can include Si-ARC material, and the soft mask layer 570*a* can include radiation-sensitive material, such as photoresist.

The soft mask layer 570*a* can include a plurality of soft mask features 575*a*, and the soft mask features 575*a* can have a feature width 576*a*, a feature thickness 577*a*, and a sidewall angle (SWA) 578*a*. For example, the feature width 576*a* can vary from about 10 nm to about 200 nm, the feature thickness 577*a* can vary from about 20 nm to about 4000 nm, and the SWA 578*a* can vary from about 87 degrees to about 95 degrees.

In FIG. 5A, a first IEC-MIMO model 582*a* is illustrated, and when the first IEC-MIMO model 582*a* is executed, the selected first IEC-etch sequence can be performed using one or more of IEO-etch procedures. When IEO-etch procedures are performed, one or more sets of process parameters can be determined using the first IEC-etch sequence. For example, the first IEC-MIMO model 582*a* can create and exchange first IEC-etch MV data using transfer means 590, can create and exchange first IEC-etch DV data using transfer means 591, and can create and exchange first IEC-etch CV data using transfer means 592 with the other MIMO models (581*a*, 583*a*, 584*a*, and 585*a*). In addition, the first IEC-MIMO model 582*a* can include first MV process data, first DV process data, and first CV process data associated with the first IEC-etch sequence, with the first patterned wafer 501*a*, and/or with the second patterned wafer 502*a*.

When the selected first IEC-etch sequence includes one or more IEO-etch procedures, the IEO-etch procedures can be performed using one or more of the etch subsystems described herein in FIGS. 2A-2G and FIGS. 3A-3G. In some examples, the first patterned wafer 501*a* having a plurality of first feature stacks 505*a* thereon can be etched using the first IEC-etch sequence to create a second patterned wafer 502*a* having a plurality of the second feature stacks 506*a* thereon. Alternatively, other patterned wafers may be created.

In some embodiments, when the first IEO-etch procedure is performed a first patterned wafer 501*a* can be positioned on a wafer holder (220 shown in FIGS. 2A-2G) and/or wafer holder (320 shown in FIGS. 3A-3G) and a first IEO plasma can be created in the IEC process chamber (210 shown in FIGS. 2A-2G) and/or IEC process chamber (310 shown in FIGS. 3A-3G) and a first IEO-etch procedure can be performed.

During the first IEO-etch procedure, first IEO-etch sensor data can be collected using one or more IE-sensors (223 and/or 234 shown in FIGS. 2A-2G) and/or IE-sensors (323 and/or 334 shown in FIGS. 3A-3G), and controller (295 shown in FIGS. 2A-2G) and/or controller (395 shown in FIGS. 3A-3G) can compare the first IEO-etch sensor data to historical IE-sensor data; can store the first IEO-etch sensor data. For example, the first process data can be collected using the process sensors (236 shown in FIGS. 2A-2G) and/or process sensors (336 shown in FIGS. 3A-3G) during the first IEO-etch procedure. In addition, the recipe for the first IEO-etch procedure can be dependent upon the profile data and SWA data for the soft-mask features 551 and/or profile data for the etched GWC features 541.

When the selected first IEC-etch sequence includes additional first IE-related procedures, the additional first IE-related procedures can be performed using one or more of the subsystems (110, 120, 130, 140, 150, 160, and 170) shown in FIG. 1.

In some embodiments, the first IEC-etch sequence can include a first IEO etch procedure for a first hard mask layer, second IEO etch procedure for a FWC layer, and third IEO etch procedure for a second hard mask layer. For example, the first IEO etch procedure can include a Si-ARC layer etching procedure, the second IEO etch procedure can include a width layer etching procedure, and the third IEO etch procedure can include a TEOS layer etch procedure. In some examples, the first IEC-etch sequence can also include ashing procedures, cleaning procedures, and/or CMP procedures. In other examples, the first IEC-etch sequence can include IE-related metrology procedures, IE-sensor wafer measurement procedures, and/or IE-related inspection procedures.

In FIG. 5A', a second patterned wafer 502*a* comprising a second feature stack 506*a* is shown that includes a substrate layer 510*a*, a target layer 520*a*, a third hard mask layer 530*a*, and an etched second hard mask layer 540*aa*. For example, the substrate layer 510*a* can include a semiconductor material; the target layer 520*a* can include dielectric or metallic material; the third hard mask layer 530*a* can include TiN; the etched second hard mask layer 540*aa* can include etched TEOS material.

The etched second hard mask layer 540*aa* can include a plurality of etched second hard mask features 545*a*, and the etched second hard mask features 545*a* can have a feature width 546*a*, a feature thickness 547*a*, and a SWA 548*a*. For example, the feature width 546*a* can vary from about 10 nm to about 200 nm, the feature thickness 547*a* can vary from about 20 nm to about 4000 nm, and the SWA 548*a* can vary from about 87 degrees to about 95 degrees.

During the first IEO etch procedures, the pattern of soft mask features 575*a* on the first patterned wafers 501*a* can be used to create the pattern of etched second hard mask features 545*a* on the second patterned wafers 502*a*.

In FIG. 5A, a second IE-select MIMO model 583*a* is illustrated, and a second IEC-etch sequence can be selected using the second IE-select MIMO model 583*a*, and the second IE-select MIMO model 583*a* can create and exchange second select MV data using transfer means 590, can create and exchange second select DV data using transfer means 591, and can create and exchange second select CV data using transfer means 592. For example, the second IE-select MIMO model 583*a* can create and/or use second IE-related data associated with the first and/or second IEC-etch sequence, and the second IE-related data can be fed forward and/or fed back using transfer means (590, 591, and/or 592).

When the second IE-select MIMO model 583*a* is executed, a second IEC-etch sequence can be selected using controller (295 shown in FIGS. 2A-2G) and/or controller (395 shown in FIGS. 3A-3G). In some examples, the controllers (295 and/or 395) can use second IE-related library data for the first patterned wafer 501*a*, the second patterned wafer 502*a*, and/or the third patterned wafer 503*a*. The second IE-related library data for the first patterned wafer 501*a* can include historical IE-related etch sequence data collected using one or more IE-sensors (223 and/or 234 shown in FIGS. 2A-2G) and/or IE-sensors (323 and/or 334 shown in FIGS. 3A-3G), when the first feature stacks 505*a* were being created on the first patterned wafer 501*a*. The second IE-related library data for the second patterned wafer 502*a* can include second historical IE-related etch sequence data collected using one or more IE-sensors (223 and/or 234 shown in FIGS. 2A-2G) and/or IE-sensors (323 and/or 334 shown in FIGS. 3A-3G), when the second feature stacks 506*a* were previously created on the previously created second patterned wafers 502*a*. The second IE-related library data for the third patterned wafer 503*a* can include third historical IE-related etch sequence data collected using one or more IE-sensors (223 and/or 334 shown in FIGS. 2A-2G) and/or IE-sensors (323 and/or 334 shown in FIGS. 3A-3G), when the third feature stacks 507a were previously created on the previously created third patterned wafers 503a.

In FIG. 5A, a second IEC-MIMO model 584a is illustrated, and when the second IEC-MIMO model 584a is executed, the selected second IEC-etch sequence can be performed using one or more second IEO-etch procedures. When the second IEO-etch procedures are performed, one or more sets of second process parameters can be determined using the second IEC-etch sequence. For example, the second IEC-MIMO model 584a can create and exchange second IEC-etch MV data using transfer means 590, can create and exchange second IEC-etch DV data using transfer means 591, and can create and exchange second IEC-etch CV data using transfer means 592 with the other MIMO models (581a, 582a, 583a, and 585a). In addition, the second IEC-MIMO model 584a can create and/or use second process data and/or IE-sensor data associated with the first and/or second IEC-etch sequences, and the second process data and/or IE-sensor data can be fed forward and/or fed back using transfer means (590, 591, and/or 592).

When the selected second IEC-etch sequence includes one or more second IEO-etch procedures, the second IEO-etch procedure can be performed using one or more of the etch subsystems described herein in FIGS. 2A-2G and FIGS. 3A-3G. In some examples, the second patterned wafer 502a having a plurality of second feature stacks 506a thereon can be etched using the second IEC-etch sequence to create a third patterned wafer 503a having a plurality of the third feature stacks 507a thereon. Alternatively, other patterned wafers may be created.

In FIG. 5A', a third patterned wafer 503a comprising a third feature stack 507a is shown that includes a substrate layer 510a, a target layer 520a, and an etched third hard mask layer 530aa having a plurality of etched third hard mask features 535a. For example, the substrate layer 510a can include a semiconductor material; the target layer 520a can include $HfO_2$; the etched third hard mask layer 530aa can include etched TiN material. During the second IEC-etch sequence, the pattern of etched second hard mask features 545a on the second patterned wafers 502a can be used to create the pattern of etched third hard mask features 535a on the third patterned wafers 503a.

The etched third hard mask layer 530aa can include a plurality of etched third hard mask features 535a, and the etched third hard mask features 535a can have feature widths 536a, feature thicknesses 537a, and a SWA 538a. For example, the etched second hard mask features width 536a can vary from about 10 nm to about 200 nm, and the feature thicknesses 537a can vary from about 20 nm to about 400 nm and the SWA 538a can vary from about 87 degrees to about 95 degrees.

In some embodiments, when the second IEO-etch procedure is performed a second patterned wafer 502a can be positioned on a wafer holder (220 shown in FIGS. 2A-2G) and/or wafer holder (320 shown in FIGS. 3A-3G) and a second IEO plasma can be created in the IEC process chamber (210 shown in FIGS. 2A-2G) and/or IEC process chamber (310 shown in FIGS. 3A-3G), and a second IEO-etch procedure can be performed.

During the second IEO-etch procedure, second IE-etch sensor data can be collected using one or more IE-sensors (223 and/or 234 shown in FIGS. 2A-2G) and/or IE-sensors (323 and/or 334 shown in FIGS. 3A-3G), and controller (295 shown in FIGS. 2A-2G) and/or controller (395 shown in FIGS. 3A-3G) can compare the second IE-etch sensor data to historical IE-sensor data; can store the second IE-etch sensor data. For example, second process data can be collected using the process sensors (236 shown in FIGS. 2A-2G) and/or process sensors (336 shown in FIGS. 3A-3G) during the second IE-related etch procedure. In addition, the recipe for the second IEO-etch procedure can be dependent upon the processing parameters and/or profile data for the soft-mask features 575a.

When the selected second IEC-etch sequence includes additional second IE-related procedures, the additional second IE-related procedures can be performed using one or more of the subsystems (110, 120, 130, 140, 150, 160, and 170) shown in FIG. 1.

In some embodiments, the second IEC-etch sequence can include a third hard mask layer etching procedure. For example, the second IEC-etch sequence can include a TiN layer etching procedure. In some examples, the second IEC-etch sequence can also include ashing procedures, cleaning procedure, and/or CMP procedures. In other examples, the second IEC-etch sequence can include IE-related metrology procedures and/or IE-related inspection procedures.

In FIG. 5A, a first output data model 585a is illustrated, and a first set of output data can be analyzed when the first output data model 585a is executed. The first output data can include real-time and/or historical IE-related data. For example, the first output data model 585a can create and exchange third IEC-etch MV data using transfer means 590, can create and exchange third IEC-etch DV data using transfer means 591, and can create and exchange third IEC-etch CV data using transfer means 592 with the other MIMO models (580a, 581a, 582a, 583a, and 584a). In addition, the first output data model 585a can analyze process data and/or IE-sensor data associated with the first and/or second IEC-etch sequences, and the analyzed process data and/or the analyzed IE-sensor data can be fed forward and/or fed back using transfer means (590, 591, and/or 592).

When the first output data model 585a is executed, update procedures can be performed for the first and/or second IEC-etch sequences. For example, update procedures can be performed to update the first and/or second process parameters, IE data, and process data. In addition, update procedures can be performed to update the first and/or second IE-related library data. The first output data model 585a can exchange updated IE-etch MV data using transfer means 590, can exchange updated IE-etch DV data using transfer means 591, and can exchange updated IE-etch CV data using transfer means 592 with the other MIMO models (580a, 581a, 582a, 583a, and 584a). During process development, DOE techniques can be used to examine the preliminary set of models (580a-585a) and to develop a reduced set of MIMO models.

In some embodiments, the second IE-etch sequence can be can include one or more IEO etch procedures that can include a "break through (BT) etching procedure, a Main-Etch (ME) etching procedure, an Over-Etch (OE) etching procedure, and a Titanium-Nitride (TiN) etching procedure. Alternatively, other etching, ashing, or cleaning procedures may be used.

FIGS. 5B and 5B' illustrate exemplary views of a second IE-related process sequence for creating first dual patterned features in accordance with embodiments of the invention. In the illustrated embodiment, three exemplary patterned wafers (501b-503b) are shown having exemplary feature stacks (505b-507b) thereon, but this is not required for the invention. Alternatively, a different number of patterned wafers with different configurations may be used. In some embodiments, the three exemplary patterned wafers (501b, 502b, and 503b) and the associated multi-layer feature stacks (505b, 506b, and 507b) can be created using a first set of IEC-etch procedures that can be performed using one or more of the etch subsystems described herein in FIGS. 2A-2G and FIGS. 3A-3G. Alternatively, other etch subsystems and/or etching procedures may be used.

In FIG. 5B, a first input data model 580b is illustrated, and a first set of input data can be obtained when the first input data model 580b is executed. The first input data can include real-time and/or historical IE-related data.

In FIG. 5B, a first IE-select MIMO model 581b is illustrated, and a first IEC-etch sequence can be selected using the first IE-select MIMO model 581b, and the first IE-select MIMO model 581b can exchange Measured Variable (MV) data using transfer means 590, can exchange Disturbance Variable (DV) data using transfer means 591, and can exchange Controlled Variable (CV) data using transfer means 592. For example, the first IE-select MIMO model 581b can create and/or use first IE-related data associated with the first IEC-etch sequence, and the first IE-related data can be fed forward and/or fed back using transfer means (590, 591, and/or 592).

When the first IE-select MIMO model 581b is executed, a first IEC-etch sequence can be selected using controller (295 shown in FIGS. 2A-2G) and/or controller (395 shown in FIGS. 3A-3G). In some examples, the controllers (295 and/or 395) can use first IE-related library data for the first patterned wafer 501b and/or the second patterned wafer 502b. The first IE-related library data for the first patterned wafer 501b can include historical IEC-etch sequence data collected using one or more IE-sensors (223 and/or 234 shown in FIGS. 2A-2G) and/or IE-sensors (323 and/or 334 shown in FIGS. 3A-3G), when the first feature stacks 505b were being created on the first patterned wafer 501b. The first IE-related library data for the second patterned wafer 502b can include second historical IEC-etch sequence data collected using one or more IE-sensors (223 and/or 234 shown in FIGS. 2A-2G) and/or IE-sensors (323 and/or 334 shown in FIGS. 3A-3G), when the second feature stacks 506b were previously created on the previously created second patterned wafers 502b.

In FIG. 5B', a first patterned wafer 501b comprising a first feature stack 505b is shown that includes a substrate layer 510b, a target layer 520b, a third hard mask layer 530b, a second hard mask layer 540b, a feature-width control (FWC) layer 550b, a first hard mask layer 560b, and a pattern soft mask layer 570b. For example, the substrate layer 510b can include a semiconductor material; the target layer 520b can include dielectric or metallic material; the third hard mask layer 530b can include TiN; the second hard mask layer 540b can include Tetraethyl Orthosilicate, (TEOS) [$Si(OC_2H_5)_4$]; the FWC layer 550b can include width-control material; the first hard mask layer 560b can include Si-ARC material, and the soft mask layer 570b can include radiation-sensitive material, such as photo resist.

The soft mask layer 570b can include a plurality of soft mask features 575b, and the soft mask features 575b can have a feature width 576b, a feature thickness 577b, and a sidewall angle (SWA) 578b. For example, the feature width 576b can vary from about 10 nm to about 200 nm, the feature thickness 577b can vary from about 20 nm to about 4000 nm, and the SWA 578b can vary from about 87 degrees to about 95 degrees.

In FIG. 5B, a first IEC-MIMO model 582b is illustrated, and when the first IEC-MIMO model 582b is executed, the selected first IEC-etch sequence can be performed using one or more of IEO-etch procedures. When IEO-etch procedures are performed, one or more sets of process parameters can be determined using the first IEC-etch sequence. For example, the first IEC-MIMO model 582b can create and exchange first IEC-etch MV data using transfer means 590, can create and exchange first IEC-etch DV data using transfer means 591, and can create and exchange first IEC-etch CV data using transfer means 592 with the other MIMO models (580b, 581b, 583b, 584b, and 585b). In addition, the first IEC-MIMO model 582b can include first MV process data, first DV process data, and first CV process data associated with the first IEC-etch sequence, with the first patterned wafer 501b, and/or with the second patterned wafer 502b.

When the selected first IEC-etch sequence includes one or more IEO-etch procedures, the IEO-etch procedures can be performed using one or more of the etch subsystems described herein in FIGS. 2A-2G and FIGS. 3A-3G. In some examples, the first patterned wafer 501b having a plurality of first feature stacks 505b thereon can be etched using the first IEC-etch sequence to create a second patterned wafer 502b having a plurality of the second feature stacks 506b thereon. Alternatively, other patterned wafers may be created.

In some embodiments, when the first IEO-etch procedure is performed a first patterned wafer 501b can be positioned on a wafer holder (220 shown in FIGS. 2A-2G) and/or wafer holder (320 shown in FIGS. 3A-3G) and a first IEO plasma can be created in the IEC process chamber (210 shown in FIGS. 2A-2G) and/or IEC process chamber (310 shown in FIGS. 3A-3G) and a first IEO-etch procedure can be performed.

During the first IEO-etch procedure, first IEO-etch sensor data can be collected using one or more IE-sensors (223 and/or 234 shown in FIGS. 2A-2G) and/or IE-sensors (323 and/or 334 shown in FIGS. 3A-3G), and controller (295 shown in FIGS. 2A-2G) and/or controller (395 shown in FIGS. 3A-3G) can compare the first IEO-etch sensor data to historical IE-sensor data; can store the first IEO-etch sensor data. For example, the first process data can be collected using the process sensors (236 shown in FIGS. 2A-2G) and/or process sensors (336 shown in FIGS. 3A-3G) during the first IEO-etch procedure. In addition, the recipe for the first IEO-etch procedure can be dependent upon the profile data and SWA data for the soft-mask features 551 and/or profile data for the etched GWC features 541.

When the selected first IEC-etch sequence includes additional first IE-related procedures, the additional first IE-related procedures can be performed using one or more of the subsystems (110, 120, 130, 140, 150, 160, and 170) shown in FIG. 1.

In some embodiments, the first IEC-etch sequence can include a first IEO etch procedure for a first hard mask layer, second IEO etch procedure for a FWC layer, and third IEO etch procedure for a second hard mask layer. For example, the first IEO etch procedure can include a Si-ARC layer etching procedure, the second IEO etch procedure can include a width layer etching procedure, and the third IEO etch procedure can include a TEOS layer etch procedure. In some examples, the first IEC-etch sequence can also include ashing procedures, cleaning procedures, and/or CMP procedures. In other examples, the first IEC-etch sequence can include IE-related metrology procedures, IE-sensor wafer measurement procedures, and/or IE-related inspection procedures.

In FIG. 5B', a second patterned wafer 502b comprising a second feature stack 506b is shown that includes a substrate layer 510b, a target layer 520b, a third hard mask layer 530b, and an etched second hard mask layer 540ba. For example, the substrate layer 510b can include a semiconductor material; the target layer 520b can include dielectric or metallic material; the third hard mask layer 530b can include TiN; the etched second hard mask layer 540ba can include etched TEOS material.

The etched second hard mask layer 540ba can include a plurality of etched second hard mask features 545b, and the etched second hard mask features 545b can have a feature width 546b, a feature thickness 547b, and a SWA 548b. For example, the feature width 546b can vary from about 10 nm to about 200 nm, the feature thickness 547b can vary from about 20 nm to about 4000 nm, and the SWA 548b can vary from about 87 degrees to about 95 degrees.

During the first IEO etch procedures, the pattern of soft mask features 575b on the first patterned wafers 501b can be used to create the pattern of etched second hard mask features 545b on the second patterned wafers 502b.

In FIG. 5B, a second IE-select MIMO model 583b is illustrated, and a second IEC-etch sequence can be selected using the second IE-select MIMO model 583b, and the second IE-select MIMO model 583b can create and exchange second select MV data using transfer means 590, can create and exchange second select DV data using transfer means 591, and can create and exchange second select CV data using transfer means 592. For example, the second IE-select MIMO model 583b can create and/or use second IE-related data associated with the first and/or second IEC-etch sequence, and the second IE-related data can be fed forward and/or fed back using transfer means (590, 591, and/or 592).

When the second IE-select MIMO model 583b is executed, a second IEC-etch sequence can be selected using controller (295 shown in FIGS. 2A-2G) and/or controller (395 shown in FIGS. 3A-3G). In some examples, the controllers (295 and/or 395) can use second IE-related library data for the first patterned wafer 501b, the second patterned wafer 502b, and/or the third patterned wafer 503a. The second IE-related library data for the first patterned wafer 501b can include historical IE-related etch sequence data collected using one or more IE-sensors (223 and/or 234 shown in FIGS. 2A-2G) and/or IE-sensors (323 and/or 334 shown in FIGS. 3A-3G), when the first feature stacks 505b were being created on the first patterned wafer 501b. The second IE-related library data for the second patterned wafer 502b can include second historical IE-related etch sequence data collected using one or more IE-sensors (223 and/or 234 shown in FIGS. 2A-2G) and/or IE-sensors (323 and/or 334 shown in FIGS. 3A-3G), when the second feature stacks 506b were previously created on the previously created second patterned wafers 502b. The second IE-related library data for the third patterned wafer 503a can include third historical IE-related etch sequence data collected using one or more IE-sensors (223 and/or 334 shown in FIGS. 2A-2G) and/or IE-sensors (323 and/or 334 shown in FIGS. 3A-3G), when the third feature stacks 507b were previously created on the previously created third patterned wafers 503a.

In FIG. 5B, a second IEC-MIMO model 584b is illustrated, and when the second IEC-MIMO model 584b is executed, the selected second IEC-etch sequence can be performed using one or more second IEO-etch procedures. When the second IEO-etch procedures are performed, one or more sets of second process parameters can be determined using the second IEC-etch sequence. For example, the second IEC-MIMO model 584b can create and exchange second IEC-etch MV data using transfer means 590, can create and exchange second IEC-etch DV data using transfer means 591, and can create and exchange second IEC-etch CV data using transfer means 592 with the other MIMO models (581b, 582b, 583b, and 585b). In addition, the second IEC-MIMO model 584b can create and/or use second process data and/or IE-sensor data associated with the first and/or second IEC-etch sequences, and the second process data and/or IE-sensor data can be fed forward and/or fed back using transfer means (590, 591, and/or 592).

When the selected second IEC-etch sequence includes one or more second IEO-etch procedures, the second IEO-etch procedure can be performed using one or more of the etch subsystems described herein in FIGS. 2A-2G and FIGS. 3A-3G. In some examples, the second patterned wafer 502b having a plurality of second feature stacks 506b thereon can be etched using the second IEC-etch sequence to create a third patterned wafer 503a having a plurality of the third feature stacks 507b thereon. Alternatively, other patterned wafers may be created.

In FIG. 5B', a third patterned wafer 503a comprising a third feature stack 507b is shown that includes a substrate layer 510b, a target layer 520b, and an etched third hard mask layer 530ba having a plurality of etched third hard mask features 535b. For example, the substrate layer 510b can include a semiconductor material; the target layer 520b can include $HfO_2$; the etched third hard mask layer 530ba can include etched TiN material. During the second IEC-etch sequence, the pattern of etched second hard mask features 545b on the second patterned wafers 502b can be used to create the pattern of etched third hard mask features 535b on the third patterned wafers 503a.

The etched third hard mask layer 530ba can include a plurality of etched third hard mask features 535b, and the etched third hard mask features 535ba can have feature widths 536b, feature thicknesses 537b, and a SWA 538b. For example, the etched second hard mask features width 536b can vary from about 10 nm to about 200 nm, and the feature thicknesses 537b can vary from about 20 nm to about 400 nm and the SWA 538b can vary from about 87 degrees to about 95 degrees.

The etched third hard mask layer 530ba can include a plurality of previously-etched third hard mask features 535a, and the previously-etched third hard mask features 535a can have feature widths 536a, feature thicknesses 537a, and feature SWA 538a. For example, the previously-etched third hard mask feature width 536a can vary from about 10 nm to about 200 nm, the feature thicknesses 537a can vary from about 20 nm to about 400 nm and the feature SWA 538a can vary from about 87 degrees to about 95 degrees. Furthermore, a first separation distance 539b can be established between the previously-etched third hard mask features 535a and etched third hard mask features 535b, and first separation distance 539b can vary from about 10 nm to about 200 nm.

In some embodiments, when the second IEO-etch procedure is performed a second patterned wafer 502b can be positioned on a wafer holder (220 shown in FIGS. 2A-2G) and/or wafer holder (320 shown in FIGS. 3A-3G) and a second IEO plasma can be created in the IEC process chamber (210 shown in FIGS. 2A-2G) and/or IEC process chamber (310 shown in FIGS. 3A-3G), and a second IEO-etch procedure can be performed.

During the second IEO-etch procedure, second IE-etch sensor data can be collected using one or more IE-sensors (223 and/or 234 shown in FIGS. 2A-2G) and/or IE-sensors (323 and/or 334 shown in FIGS. 3A-3G), and controller (295 shown in FIGS. 2A-2G) and/or controller (395 shown in FIGS. 3A-3G) can compare the second IE-etch sensor data to historical IE-sensor data; can store the second IE-etch sensor data. For example, second process data can be collected using the process sensors (236 shown in FIGS. 2A-2G) and/or process sensors (336 shown in FIGS. 3A-3G) during the second IE-related etch procedure. In addition, the recipe for the second IEO-etch procedure can be dependent upon the processing parameters and/or profile data for the soft-mask features 575b.

When the selected second IEC-etch sequence includes additional second IE-related procedures, the additional second IE-related procedures can be performed using one or more of the subsystems (110, 120, 130, 140, 150, 160, and 170) shown in FIG. 1.

In some embodiments, the second IEC-etch sequence can include a third hard mask layer etching procedure. For example, the second IEC-etch sequence can include a TiN layer etching procedure. In some examples, the second IEC-etch sequence can also include ashing procedures, cleaning procedure, and/or CMP procedures. In other examples, the second IEC-etch sequence can include IE-related metrology procedures and/or IE-related inspection procedures.

In FIG. 5B, a first output data model 585b is illustrated, and a first set of output data can be analyzed when the first output data model 585b is executed. The first output data can include real-time and/or historical IE-related data. For example, the first output data model 585b can create and exchange third IEC-etch MV data using transfer means 590, can create and exchange third IEC-etch DV data using transfer means 591, and can create and exchange third IEC-etch CV data using transfer means 592 with the other MIMO models (580b, 581b, 582b, 583b, and 584b). In addition, the first output data model 585b can analyze process data and/or IE-sensor data associated with the first and/or second IEC-etch sequences, and the analyzed process data and/or the analyzed IE-sensor data can be fed forward and/or fed back using transfer means (590, 591, and/or 592).

When the first output data model 585b is executed, update procedures can be performed for the first and/or second IEC-etch sequences. For example, update procedures can be performed to update the first and/or second process parameters, IE data, and process data. In addition, update procedures can be performed to update the first and/or second IE-related library data. The first output data model 585b can exchange updated IE-etch MV data using transfer means 590, can exchange updated IE-etch DV data using transfer means 591, and can exchange updated IE-etch CV data using transfer means 592 with the other MIMO models (580b, 581b, 582b, 583b, and 584b). During process development, DOE techniques can be used to examine the preliminary set of models (580b-585b) and to develop a reduced set of MIMO models.

In some embodiments, the second IE-etch sequence can be can include one or more IEO etch procedures that can include a "break through (BT) etching procedure, a Main-Etch (ME) etching procedure, an Over-Etch (OE) etching procedure, and a Titanium-Nitride (TiN) etching procedure. Alternatively, other etching, ashing, or cleaning procedures may be used.

FIGS. 6A and 6A' illustrate exemplary views of a first IE-related process sequence for creating first dual patterned gate structures in accordance with embodiments of the invention. In the illustrated embodiment, three exemplary patterned wafers (601a-603a) are shown having exemplary gate stacks (605a-607a) thereon, but this is not required for the invention. Alternatively, a different number of patterned wafers with different configurations may be used. In some embodiments, the three exemplary patterned wafers (601a, 602a, and 603a) and the associated multi-layer gate stacks (605a, 606a, and 607a) can be created using a first set of IEC-etch sequences that can include IEO-etch procedures that can be performed using one or more of the etch subsystems described herein in FIGS. 2A-2G and FIGS. 3A-3G. Alternatively, other etch subsystems and/or etching procedures may be used.

In FIG. 6A, a first input data model 680a is illustrated, and a first set of input data can be obtained when the first input data model 680a is executed. The first input data can include real-time and/or historical IE-related data.

In FIG. 6A, a first IE-select MIMO model 681a is illustrated, and a first IEC-etch sequence can be selected using the first IE-select MIMO model 681a, and the first IE-select MIMO model 681a can exchange Measured Variable (MV) data using transfer means 690, can exchange Disturbance Variable (DV) data using transfer means 691, and can exchange Controlled Variable (CV) data using transfer means 692. For example, the first IE-select MIMO model 681a can create and/or use first IE-related data associated with the first IEC-etch sequence, and the first IE-related data can be fed forward and/or fed back using transfer means (690, 691, and/or 692).

When the first IE-select MIMO model 681a is executed, a first IEC-etch sequence can be selected using controller (295 shown in FIGS. 2A-2G) and/or controller (395 shown in FIGS. 3A-3G). In some examples, the controllers (295 and/or 395) can use first IE-related library data for the first patterned wafer 601a and/or the second patterned wafer 602a. The first IE-related library data for the first patterned wafer 601a can include historical IEC-etch sequence data collected using one or more IE-sensors (223 and/or 234 shown in FIGS. 2A-2G) and/or IE-sensors (323 and/or 334 shown in FIGS. 3A-3G), when the first gate stacks 605a were being created on the first patterned wafer 601a. The first IE-related library data for the second patterned wafer 602a can include second historical IEC-etch sequence data collected using one or more IE-sensors (223 and/or 234 shown in FIGS. 2A-2G) and/or IE-sensors (323 and/or 334 shown in FIGS. 3A-3G), when the second gate stacks 606a were previously created on the previously created second patterned wafers 602a.

In FIG. 6A', a first patterned wafer 601a comprising a first gate stack 605a is shown that includes a substrate layer 610a, a target layer 620a, a third hard mask layer 630a, a second hard mask layer 640a, a gate-width control (GWC) layer 650a, a first hard mask layer 660a, and a pattern soft mask layer 670a. For example, the substrate layer 610a can include a semiconductor material; the target layer 620a can include dielectric or metallic material; the third hard mask layer 630a can include TiN; the second hard mask layer 640a can include Tetraethyl Orthosilicate, (TEOS) [$Si(OC_2H_5)_4$]; the GWC layer 650a can include width-control material; the first hard mask layer 660a can include Si-ARC material, and the soft mask layer 670a can include radiation-sensitive material, such as photo resist.

The soft mask layer 670a can include a plurality of soft mask features 675a, and the soft mask features 675a can have a feature width 676a, a feature thickness 677a, and a sidewall angle (SWA) 678a. For example, the feature width 676a can vary from about 10 nm to about 200 nm, the feature thickness 677a can vary from about 20 nm to about 4000 nm, and the SWA 678a can vary from about 87 degrees to about 95 degrees.

In FIG. 6A, a first IEC-MIMO model 682a is illustrated, and when the first IEC-MIMO model 682a is executed, the selected first IEC-etch sequence can be performed using one or more of IEO-etch procedures. When IEO-etch procedures are performed, one or more sets of process parameters can be determined using the first IEC-etch sequence. For example, the first IEC-MIMO model 682a can create and exchange first IEC-etch MV data using transfer means 690, can create and exchange first IEC-etch DV data using transfer means 691, and can create and exchange first IEC-etch CV data using transfer means 692 with the other MIMO models (681a,

683a, 684a, and 685a). In addition, the first IEC-MIMO model 682a can include first MV process data, first DV process data, and first CV process data associated with the first IEC-etch sequence, with the first patterned wafer 601a, and/or with the second patterned wafer 602a.

When the selected first IEC-etch sequence includes one or more IEO-etch procedures, the IEO-etch procedures can be performed using one or more of the etch subsystems described herein in FIGS. 2A-2G and FIGS. 3A-3G. In some examples, the first patterned wafer 601a having a plurality of first gate stacks 605a thereon can be etched using the first IEC-etch sequence to create a second patterned wafer 602a having a plurality of the second gate stacks 606a thereon. Alternatively, other patterned wafers may be created.

In some embodiments, when the first IEO-etch procedure is performed a first patterned wafer 601a can be positioned on a wafer holder (220 shown in FIGS. 2A-2G) and/or wafer holder (320 shown in FIGS. 3A-3G) and a first IEO plasma can be created in the IEC process chamber (210 shown in FIGS. 2A-2G) and/or IEC process chamber (310 shown in FIGS. 3A-3G) and a first IEO-etch procedure can be performed.

During the first IEO-etch procedure, first IEO-etch sensor data can be collected using one or more IE-sensors (223 and/or 234 shown in FIGS. 2A-2G) and/or IE-sensors (323 and/or 334 shown in FIGS. 3A-3G), and controller (295 shown in FIGS. 2A-2G) and/or controller (395 shown in FIGS. 3A-3G) can compare the first IEO-etch sensor data to historical IE-sensor data; can store the first IEO-etch sensor data. For example, the first process data can be collected using the process sensors (236 shown in FIGS. 2A-2G) and/or process sensors (336 shown in FIGS. 3A-3G) during the first IEO-etch procedure. In addition, the recipe for the first IEO-etch procedure can be dependent upon the profile data and SWA data for the soft-mask features 651 and/or profile data for the etched GWC features 641.

When the selected first IEC-etch sequence includes additional first IE-related procedures, the additional first IE-related procedures can be performed using one or more of the subsystems (110, 120, 130, 140, 150, 160, and 170) shown in FIG. 1.

In some embodiments, the first IEC-etch sequence can include a first IEO etch procedure for a first hard mask layer, second IEO etch procedure for a GWC layer, and third IEO etch procedure for a second hard mask layer. For example, the first IEO etch procedure can include a Si-ARC layer etching procedure, the second IEO etch procedure can include a width layer etching procedure, and the third IEO etch procedure can include a TEOS layer etch procedure. In some examples, the first IEC-etch sequence can also include ashing procedures, cleaning procedures, and/or CMP procedures. In other examples, the first IEC-etch sequence can include IE-related metrology procedures, IE-sensor wafer measurement procedures, and/or IE-related inspection procedures.

In FIG. 6A', a second patterned wafer 602a comprising a second gate stack 606a is shown that includes a substrate layer 610a, a target layer 620a, a third hard mask layer 630a, and an etched second hard mask layer 640aa. For example, the substrate layer 610a can include a semiconductor material; the target layer 620a can include dielectric or metallic material; the third hard mask layer 630a can include TiN; the etched second hard mask layer 640aa can include etched TEOS material.

The etched second hard mask layer 640aa can include a plurality of etched second hard mask features 645a, and the etched second hard mask features 645a can have a feature width 646a, a feature thickness 647a, and a SWA 648a. For example, the feature width 646a can vary from about 10 nm to about 200 nm, the feature thickness 647a can vary from about 20 nm to about 4000 nm, and the SWA 648a can vary from about 87 degrees to about 95 degrees.

During the first IEO etch procedures, the pattern of soft mask features 675a on the first patterned wafers 601a can be used to create the pattern of etched second hard mask features 645a on the second patterned wafers 602a.

In FIG. 6A, a second IE-select MIMO model 683a is illustrated, and a second IEC-etch sequence can be selected using the second IE-select MIMO model 683a, and the second IE-select MIMO model 683a can create and exchange second select MV data using transfer means 690, can create and exchange second select DV data using transfer means 691, and can create and exchange second select CV data using transfer means 692. For example, the second IE-select MIMO model 683a can create and/or use second IE-related data associated with the first and/or second IEC-etch sequence, and the second IE-related data can be fed forward and/or fed back using transfer means (690, 691, and/or 692).

When the second IE-select MIMO model 683a is executed, a second IEC-etch sequence can be selected using controller (295 shown in FIGS. 2A-2G) and/or controller (395 shown in FIGS. 3A-3G). In some examples, the controllers (295 and/or 395) can use second IE-related library data for the first patterned wafer 601a, the second patterned wafer 602a, and/or the third patterned wafer 603a. The second IE-related library data for the first patterned wafer 601a can include historical IE-related etch sequence data collected using one or more IE-sensors (223 and/or 234 shown in FIGS. 2A-2G) and/or IE-sensors (323 and/or 334 shown in FIGS. 3A-3G), when the first gate stacks 605a were being created on the first patterned wafer 601a. The second IE-related library data for the second patterned wafer 602a can include second historical IE-related etch sequence data collected using one or more IE-sensors (223 and/or 234 shown in FIGS. 2A-2G) and/or IE-sensors (323 and/or 334 shown in FIGS. 3A-3G), when the second gate stacks 606a were previously created on the previously created second patterned wafers 602a. The second IE-related library data for the third patterned wafer 603a can include third historical IE-related etch sequence data collected using one or more IE-sensors (223 and/or 334 shown in FIGS. 2A-2G) and/or IE-sensors (323 and/or 334 shown in FIGS. 3A-3G), when the third gate stacks 607a were previously created on the previously created third patterned wafers 603.

In FIG. 6A, a second IEC-MIMO model 684a is illustrated, and when the second IEC-MIMO model 684a is executed, the selected second IEC-etch sequence can be performed using one or more second IEO-etch procedures. When the second IEO-etch procedures are performed, one or more sets of second process parameters can be determined using the second IEC-etch sequence. For example, the second IEC-MIMO model 684a can create and exchange second IEC-etch MV data using transfer means 690, can create and exchange second IEC-etch DV data using transfer means 691, and can create and exchange second IEC-etch CV data using transfer means 692 with the other MIMO models (681a, 682a, 683a, and 685a). In addition, the second IEC-MIMO model 684a can create and/or use second process data and/or IE-sensor data associated with the first and/or second IEC-etch sequences, and the second process data and/or IE-sensor data can be fed forward and/or fed back using transfer means (690, 691, and/or 692).

When the selected second IEC-etch sequence includes one or more second IEO-etch procedures, the second IEO-etch procedure can be performed using one or more of the etch subsystems described herein in FIGS. 2A-2G and FIGS.

3A-3G. In some examples, the second patterned wafer 602*a* having a plurality of second gate stacks 606*a* thereon can be etched using the second IEC-etch sequence to create a third patterned wafer 603*a* having a plurality of the third gate stacks 607*a* thereon. Alternatively, other patterned wafers may be created.

In FIG. 6A', a third patterned wafer 603*a* comprising a third gate stack 607*a* is shown that includes a substrate layer 610*a*, an etched target layer 620*aa*, and an etched third hard mask layer 630*aa* having a plurality of etched third hard mask structures 635*a*. For example, the substrate layer 610*a* can include a semiconductor material; the etched target layer 620*aa* can include etched $HfO_2$ material; the etched third hard mask layer 630*aa* can include etched TiN material. During the second IEC-etch sequence, the pattern of etched second hard mask features 645*a* on the second patterned wafers 602*a* can be used to create the pattern of etched third hard mask structures 635*a* and the pattern of etched target layer structures 625*a* on the third patterned wafers 603*a*.

The etched third hard mask layer 630*aa* can include a plurality of etched third hard mask structures 635*a*, and the etched third hard mask structures 635*a* can have structure widths 636*a*, structure thicknesses 637*a*, and a structure SWA 638*a*. For example, the etched second hard mask structure width 636*a* can vary from about 10 nm to about 200 nm, and the structure thicknesses 637*a* can vary from about 20 nm to about 400 nm and the SWA 638*a* can vary from about 87 degrees to about 95 degrees. In addition, the etched target layer 620*aa* can include a plurality of etched target layer structures 625*a*, and the etched target layer structures 625*a* can have target structure widths 626*a*, target structure thicknesses 627*a*, and a target structure SWA 628*a*. For example, the etched target structure width 626*a* can vary from about 10 nm to about 200 nm, and the target structure thicknesses 627*a* can vary from about 20 nm to about 400 nm and the target structure SWA 628*a* can vary from about 87 degrees to about 95 degrees.

In some embodiments, when the second IEO-etch procedure is performed a second patterned wafer 602*a* can be positioned on a wafer holder (220 shown in FIGS. 2A-2G) and/or wafer holder (320 shown in FIGS. 3A-3G) and a second IEO plasma can be created in the IEC process chamber (210 shown in FIGS. 2A-2G) and/or IEC process chamber (310 shown in FIGS. 3A-3G), and a second IEO-etch procedure can be performed.

During the second IEO-etch procedure, second IE-etch sensor data can be collected using one or more IE-sensors (223 and/or 234 shown in FIGS. 2A-2G) and/or IE-sensors (323 and/or 334 shown in FIGS. 3A-3G), and controller (295 shown in FIGS. 2A-2G) and/or controller (395 shown in FIGS. 3A-3G) can compare the second IE-etch sensor data to historical IE-sensor data; can store the second IE-etch sensor data. For example, second process data can be collected using the process sensors (236 shown in FIGS. 2A-2G) and/or process sensors (336 shown in FIGS. 3A-3G) during the second IE-related etch procedure. In addition, the recipe for the second IEO-etch procedure can be dependent upon the processing parameters and/or profile data for the soft-mask features 675*a*.

When the selected second IEC-etch sequence includes additional second IE-related procedures, the additional second IE-related procedures can be performed using one or more of the subsystems (110, 120, 130, 140, 150, 160, and 170) shown in FIG. 1.

In some embodiments, the second IEC-etch sequence can include a third hard mask layer etching procedure. For example, the second IEC-etch sequence can include a TiN layer etching procedure. In some examples, the second IEC-etch sequence can also include ashing procedures, cleaning procedure, and/or CMP procedures. In other examples, the second IEC-etch sequence can include IE-related metrology procedures and/or IE-related inspection procedures.

In FIG. 6A, a first output data model 685*a* is illustrated, and a first set of output data can be analyzed when the first output data model 685*a* is executed. The first output data can include real-time and/or historical IE-related data. For example, the first output data model 685*a* can create and exchange third IEC-etch MV data using transfer means 690, can create and exchange third IEC-etch DV data using transfer means 691, and can create and exchange third IEC-etch CV data using transfer means 692 with the other MIMO models (680*a*, 681*a*, 682*a*, 683*a*, and 684*a*). In addition, the first output data model 685*a* can analyze process data and/or IE-sensor data associated with the first and/or second IEC-etch sequences, and the analyzed process data and/or the analyzed IE-sensor data can be fed forward and/or fed back using transfer means (690, 691, and/or 692).

When the first output data model 685*a* is executed, update procedures can be performed for the first and/or second IEC-etch sequences. For example, update procedures can be performed to update the first and/or second process parameters, IE data, and process data. In addition, update procedures can be performed to update the first and/or second IE-related library data. The first output data model 685*a* can exchange updated IE-etch MV data using transfer means 690, can exchange updated IE-etch DV data using transfer means 691, and can exchange updated IE-etch CV data using transfer means 692 with the other MIMO models (680*a*, 681*a*, 682*a*, 683*a*, and 684*a*). During process development, DOE techniques can be used to examine the preliminary set of models (580*a*-585*a*) and to develop a reduced set of MIMO models.

In some embodiments, the second IE-etch sequence can be can include one or more IEO etch procedures that can include a "break through (BT) etching procedure, a Main-Etch (ME) etching procedure, an Over-Etch (OE) etching procedure, and a Titanium-Nitride (TiN) etching procedure. Alternatively, other etching, ashing, or cleaning procedures may be used.

FIGS. 6B and 6B' illustrate exemplary views of a second IE-related process sequence for creating first dual patterned structures in accordance with embodiments of the invention. In the illustrated embodiment, three exemplary patterned wafers (601*b*-603*b*) are shown having exemplary gate stacks (605*b*-607*b*) thereon, but this is not required for the invention. Alternatively, a different number of patterned wafers with different configurations may be used. In some embodiments, the three exemplary patterned wafers (601*b*, 602*ba*, and 603*b*) and the associated multi-layer gate stacks (605*b*, 606*b*, and 607*b*) can be created using a first set of IEC-etch procedures that can be performed using one or more of the etch subsystems described herein in FIGS. 2A-2G and FIGS. 3A-3G. Alternatively, other etch subsystems and/or etching procedures may be used.

In FIG. 6B, a first input data model 680*b* is illustrated, and a first set of input data can be obtained when the first input data model 680*b* is executed. The first input data can include real-time and/or historical IE-related data.

In FIG. 6B, a first IE-select MIMO model 681*b* is illustrated, and a first IEC-etch sequence can be selected using the first IE-select MIMO model 681*b*, and the first IE-select MIMO model 681*b* can exchange Measured Variable (MV) data using transfer means 690, can exchange Disturbance Variable (DV) data using transfer means 691, and can exchange Controlled Variable (CV) data using transfer means 692. For example, the first IE-select MIMO model 681*b* can create and/or use first IE-related data associated with the first IEC-etch sequence, and the first IE-related data can be fed forward and/or fed back using transfer means (690, 691, and/or 692).

When the first IE-select MIMO model 681*b* is executed, a first IEC-etch sequence can be selected using controller (295 shown in FIGS. 2A-2G) and/or controller (395 shown in FIGS. 3A-3G). In some examples, the controllers (295 and/or 395) can use first IE-related library data for the first patterned wafer 601*b* and/or the second patterned wafer 602*b*. The first IE-related library data for the first patterned wafer 601*b* can include historical IEC-etch sequence data collected using one or more IE-sensors (223 and/or 234 shown in FIGS. 2A-2G) and/or IE-sensors (323 and/or 334 shown in FIGS. 3A-3G), when the first gate stacks 605*b* were being created on the first patterned wafer 601*b*. The first IE-related library data for the second patterned wafer 602*b* can include second historical IEC-etch sequence data collected using one or more IE-sensors (223 and/or 234 shown in FIGS. 2A-2G) and/or IE-sensors (323 and/or 334 shown in FIGS. 3A-3G), when the second gate stacks 606*b* were previously created on the previously created second patterned wafers 602*b*.

In FIG. 6B', a first patterned wafer 601*b* comprising a first gate stack 605*b* is shown that includes a substrate layer 610*b*, a target layer 620*b*, a third hard mask layer 630*b*, a second hard mask layer 640*b*, a gate-width control (GWC) layer 650*b*, a first hard mask layer 660*b*, and a pattern soft mask layer 670*b*. For example, the substrate layer 610*b* can include a semiconductor material; the target layer 620*b* can include dielectric or metallic material; the third hard mask layer 630*b* can include TiN; the second hard mask layer 640*b* can include TEOS material; the GWC layer 650*b* can include width-control material; the first hard mask layer 660*b* can include Si-ARC material, and the soft mask layer 670*b* can include radiation-sensitive material, such as photo resist.

The soft mask layer 670*b* can include a plurality of soft mask features 675*b*, and the soft mask features 675*b* can have a feature width 676*b*, a feature thickness 677*b*, and a sidewall angle (SWA) 678*b*. For example, the feature width 676*b* can vary from about 10 nm to about 200 nm, the feature thickness 677*b* can vary from about 20 nm to about 4000 nm, and the SWA 678*b* can vary from about 87 degrees to about 95 degrees.

In FIG. 6B, a first IEC-MIMO model 682*b* is illustrated, and when the first IEC-MIMO model 682*b* is executed, the selected first IEC-etch sequence can be performed using one or more of IEO-etch procedures. When IEO-etch procedures are performed, one or more sets of process parameters can be determined using the first IEC-etch sequence. For example, the first IEC-MIMO model 682*b* can create and exchange first IEC-etch MV data using transfer means 690, can create and exchange first IEC-etch DV data using transfer means 691, and can create and exchange first IEC-etch CV data using transfer means 692 with the other MIMO models (680*b*, 681*b*, 683*b*, 684*b*, and 685*b*). In addition, the first IEC-MIMO model 682*b* can include first MV process data, first DV process data, and first CV process data associated with the first IEC-etch sequence, with the first patterned wafer 601*b*, and/or with the second patterned wafer 602*b*.

When the selected first IEC-etch sequence includes one or more IEO-etch procedures, the IEO-etch procedures can be performed using one or more of the etch subsystems described herein in FIGS. 2A-2G and FIGS. 3A-3G. In some examples, the first patterned wafer 601*b* having a plurality of first gate stacks 605*b* thereon can be etched using the first IEC-etch sequence to create a second patterned wafer 602*b* having a plurality of the second gate stacks 606*b* thereon. Alternatively, other patterned wafers may be created.

In some embodiments, when the first IEO-etch procedure is performed a first patterned wafer 601*b* can be positioned on a wafer holder (220 shown in FIGS. 2A-2G) and/or wafer holder (320 shown in FIGS. 3A-3G) and a first IEO plasma can be created in the IEC process chamber (210 shown in FIGS. 2A-2G) and/or IEC process chamber (310 shown in FIGS. 3A-3G) and a first IEO-etch procedure can be performed.

During the first IEO-etch procedure, first IEO-etch sensor data can be collected using one or more IE-sensors (223 and/or 234 shown in FIGS. 2A-2G) and/or IE-sensors (323 and/or 334 shown in FIGS. 3A-3G), and controller (295 shown in FIGS. 2A-2G) and/or controller (395 shown in FIGS. 3A-3G) can compare the first IEO-etch sensor data to historical IE-sensor data; can store the first IEO-etch sensor data. For example, the first process data can be collected using the process sensors (236 shown in FIGS. 2A-2G) and/or process sensors (336 shown in FIGS. 3A-3G) during the first IEO-etch procedure. In addition, the recipe for the first IEO-etch procedure can be dependent upon the profile data and SWA data for the soft-mask features 651 and/or profile data for the etched GWC features 641.

When the selected first IEC-etch sequence includes additional first IE-related procedures, the additional first IE-related procedures can be performed using one or more of the subsystems (110, 120, 130, 140, 150, 160, and 170) shown in FIG. 1.

In some embodiments, the first IEC-etch sequence can include a first IEO etch procedure for a first hard mask layer, second IEO etch procedure for a FWC layer, and third IEO etch procedure for a second hard mask layer. For example, the first IEO etch procedure can include a Si-ARC layer etching procedure, the second IEO etch procedure can include a width layer etching procedure, and the third IEO etch procedure can include a TEOS layer etch procedure. In some examples, the first IEC-etch sequence can also include ashing procedures, cleaning procedures, and/or CMP procedures. In other examples, the first IEC-etch sequence can include IE-related metrology procedures, IE-sensor wafer measurement procedures, and/or IE-related inspection procedures.

In FIG. 6B', a second patterned wafer 602*b* comprising a second gate stack 606*b* is shown that includes a substrate layer 610*b*, a target layer 620*b*, a third hard mask layer 630*b*, and an etched second hard mask layer 640*ba*. For example, the substrate layer 610*b* can include a semiconductor material; the target layer 620*b* can include dielectric or metallic material; the third hard mask layer 630*b* can include TiN; the etched second hard mask layer 640*ba* can include etched TEOS material.

The etched second hard mask layer 640*ba* can include a plurality of etched second hard mask features 645*b*, and the etched second hard mask features 645*b* can have a feature width 646*b*, a feature thickness 647*b*, and a SWA 648*b*. For example, the feature width 646*b* can vary from about 10 nm to about 200 nm, the feature thickness 647*b* can vary from about 20 nm to about 4000 nm, and the SWA 648*b* can vary from about 87 degrees to about 95 degrees.

During the first IEO etch procedures, the pattern of soft mask features 675*b* on the first patterned wafers 601*b* can be used to create the pattern of etched second hard mask features 645*b* on the second patterned wafers 602*b*.

In FIG. 6B, a second IE-select MIMO model 683*b* is illustrated, and a second IEC-etch sequence can be selected using the second IE-select MIMO model 683*b*, and the second IE-select MIMO model 683*b* can create and exchange second select MV data using transfer means 690, can create and exchange second select DV data using transfer means 691, and can create and exchange second select CV data using transfer means 692. For example, the second IE-select MIMO model 683b can create and/or use second IE-related data associated with the first and/or second IEC-etch sequence, and the second IE-related data can be fed forward and/or fed back using transfer means (690, 691, and/or 692).

When the second IE-select MIMO model 683b is executed, a second IEC-etch sequence can be selected using controller (295 shown in FIGS. 2A-2G) and/or controller (395 shown in FIGS. 3A-3G). In some examples, the controllers (295 and/or 395) can use second IE-related library data for the first patterned wafer 601b, the second patterned wafer 602b, and/or the third patterned wafer 603a. The second IE-related library data for the first patterned wafer 601b can include historical IE-related etch sequence data collected using one or more IE-sensors (223 and/or 234 shown in FIGS. 2A-2G) and/or IE-sensors (323 and/or 334 shown in FIGS. 3A-3G), when the first gate stacks 605b were being created on the first patterned wafer 601b. The second IE-related library data for the second patterned wafer 602b can include second historical IE-related etch sequence data collected using one or more IE-sensors (223 and/or 234 shown in FIGS. 2A-2G) and/or IE-sensors (323 and/or 334 shown in FIGS. 3A-3G), when the second gate stacks 606b were previously created on the previously created second patterned wafers 602b. The second IE-related library data for the third patterned wafer 603a can include third historical IE-related etch sequence data collected using one or more IE-sensors (223 and/or 334 shown in FIGS. 2A-2G) and/or IE-sensors (323 and/or 334 shown in FIGS. 3A-3G), when the third gate stacks 607b were previously created on the previously created third patterned wafers 603.

In FIG. 6B, a second IEC-MIMO model 684b is illustrated, and when the second IEC-MIMO model 684b is executed, the selected second IEC-etch sequence can be performed using one or more second IEO-etch procedures. When the second IEO-etch procedures are performed, one or more sets of second process parameters can be determined using the second IEC-etch sequence. For example, the second IEC-MIMO model 684b can create and exchange second IEC-etch MV data using transfer means 690, can create and exchange second IEC-etch DV data using transfer means 691, and can create and exchange second IEC-etch CV data using transfer means 692 with the other MIMO models (681b, 682b, 683b, and 685b). In addition, the second IEC-MIMO model 684b can create and/or use second process data and/or IE-sensor data associated with the first and/or second IEC-etch sequences, and the second process data and/or IE-sensor data can be fed forward and/or fed back using transfer means (690, 691, and/or 692).

When the selected second IEC-etch sequence includes one or more second IEO-etch procedures, the second IEO-etch procedure can be performed using one or more of the etch subsystems described herein in FIGS. 2A-2G and FIGS. 3A-3G. In some examples, the second patterned wafer 602b having a plurality of second gate stacks 606b thereon can be etched using the second IEC-etch sequence to create a third patterned wafer 603a having a plurality of the third feature stacks 607b thereon. Alternatively, other patterned wafers may be created.

In FIG. 6A, a third patterned wafer 603b comprising a third gate stack 607b is shown that includes a substrate layer 610b, an etched target layer 620ba having a plurality of etched target structures 625b therein, and an etched third hard mask layer 630ba having a plurality of etched third hard mask structures 635b therein. In addition, the third patterned wafer 603b can include a plurality of previously created etched target structures 625a thereon and a plurality of previously created etched third hard mask structures 635a thereon. For example, the substrate layer 610b can include a semiconductor material; the etched target layer 620ba can include etched $HfO_2$ material; the etched third hard mask layer 630ba can include etched TiN material. During the second IEC-etch sequence, the pattern of etched second hard mask features 645b on the second patterned wafers 602b can be used to create the pattern of etched third hard mask structures 635b and the pattern of etched target structures 625b on the third patterned wafers 603a.

The etched third hard mask layer 630ba can include a plurality of etched third hard mask structures 635b, and the etched third hard mask structures 635b can have structure widths 636a, structure thicknesses 637b, and a structure SWA 638b. For example, the etched third hard mask structure width 636b can vary from about 10 nm to about 200 nm, and the structure thicknesses 637b can vary from about 20 nm to about 400 nm and the SWA 638b can vary from about 87 degrees to about 95 degrees. In addition, the etched target layer 620ba can include a plurality of etched target layer structures 625b, and the etched target layer structures 625b can have target structure widths 626b, target structure thicknesses 627b, and a target structure SWA 628b. For example, the etched target structure width 626b can vary from about 10 nm to about 200 nm, and the target structure thicknesses 627b can vary from about 20 nm to about 400 nm and the target structure SWA 628b can vary from about 87 degrees to about 95 degrees.

The etched third hard mask layer 630ba can include a plurality of previously-etched third hard mask structures 635a, and the previously-etched third hard mask structures 635a can have structure widths 636a, structure thicknesses 637a, and a structure SWA 638a. For example, the previously-etched third hard mask structure width 636a can vary from about 10 nm to about 200 nm, the structure thicknesses 637a can vary from about 20 nm to about 400 nm and the SWA 638a can vary from about 87 degrees to about 95 degrees. In addition, the etched target layer 620aa can include a plurality of previously-etched target layer structures 625a, and the previously-etched target layer structures 625a can have previously-etched target structure widths 626a, target structure thicknesses 627a, and a target structure SWA 628a. For example, the previously-etched target structure width 626a can vary from about 10 nm to about 200 nm, the target structure thicknesses 627a can vary from about 20 nm to about 400 nm and the target structure SWA 628a can vary from about 87 degrees to about 95 degrees.

Furthermore, a first separation distance 629b can be established between the previously-etched target layer structures 625a and the etched target structures 625b, and first separation distance 629b can vary from about 10 nm to about 200 nm. A second separation distance 639b can be established between the previously-etched third hard mask structures 635a and the etched third hard mask structure width 636b, and second separation distance 639b can vary from about 10 nm to about 200 nm.

In some embodiments, when the second IEO-etch procedure is performed a second patterned wafer 602b can be positioned on a wafer holder (220 shown in FIGS. 2A-2G) and/or wafer holder (320 shown in FIGS. 3A-3G) and a second IEO plasma can be created in the IEC process chamber (210 shown in FIGS. 2A-2G) and/or IEC process chamber (310 shown in FIGS. 3A-3G), and a second IEO-etch procedure can be performed.

During the second IEO-etch procedure, second IE-etch sensor data can be collected using one or more IE-sensors (223 and/or 234 shown in FIGS. 2A-2G) and/or IE-sensors (323 and/or 334 shown in FIGS. 3A-3G), and controller (295 shown in FIGS. 2A-2G) and/or controller (395 shown in FIGS. 3A-3G) can compare the second IE-etch sensor data to historical IE-sensor data; can store the second IE-etch sensor data. For example, second process data can be collected using the process sensors (236 shown in FIGS. 2A-2G) and/or process sensors (336 shown in FIGS. 3A-3G) during the second IE-related etch procedure. In addition, the recipe for the second IEO-etch procedure can be dependent upon the processing parameters and/or profile data for the soft-mask features 675*b*.

When the selected second IEC-etch sequence includes additional second IE-related procedures, the additional second IE-related procedures can be performed using one or more of the subsystems (110, 120, 130, 140, 150, 160, and 170) shown in FIG. 1.

In some embodiments, the second IEC-etch sequence can include a third hard mask layer etching procedure. For example, the second IEC-etch sequence can include a TiN layer etching procedure. In some examples, the second IEC-etch sequence can also include ashing procedures, cleaning procedure, and/or CMP procedures. In other examples, the second IEC-etch sequence can include IE-related metrology procedures and/or IE-related inspection procedures.

In FIG. 6B, a first output data model 685*b* is illustrated, and a first set of output data can be analyzed when the first output data model 685*b* is executed. The first output data can include real-time and/or historical IE-related data. For example, the first output data model 685*b* can create and exchange third IEC-etch MV data using transfer means 690, can create and exchange third IEC-etch DV data using transfer means 691, and can create and exchange third IEC-etch CV data using transfer means 692 with the other MIMO models (680*b*, 681*b*, 682*b*, 683*b*, and 684*b*). In addition, the first output data model 685*b* can analyze process data and/or IE-sensor data associated with the first and/or second IEC-etch sequences, and the analyzed process data and/or the analyzed IE-sensor data can be fed forward and/or fed back using transfer means (690, 691, and/or 692).

When the first output data model 685*b* is executed, update procedures can be performed for the first and/or second IEC-etch sequences. For example, update procedures can be performed to update the first and/or second process parameters, IE data, and process data. In addition, update procedures can be performed to update the first and/or second IE-related library data. The first output data model 685*b* can exchange updated IE-etch MV data using transfer means 690, can exchange updated IE-etch DV data using transfer means 691, and can exchange updated IE-etch CV data using transfer means 692 with the other MIMO models (680*b*, 681*b*, 682*b*, 683*b*, and 684*b*). During process development, DOE techniques can be used to examine the preliminary set of models (680*b*-685*b*) and to develop a reduced set of MIMO models.

In some embodiments, the second IE-etch sequence can be can include one or more IEO etch procedures that can include a "break through (BT) etching procedure, a Main-Etch (ME) etching procedure, an Over-Etch (OE) etching procedure, and a Titanium-Nitride (TiN) etching procedure. Alternatively, other etching, ashing, or cleaning procedures may be used.

During IEO hardmask (SiARC) etching procedures, the chamber pressure can range from approximately 12 mT to approximately 18 mT; the top power can vary from approximately 450 watts to approximately 550 watts; the lower power can vary from approximately 90 watts to approximately 110 watts; the ESC voltage can be set at approximately 2500 V; the Tetrafluoromethane ($CF_4$) flow rate can vary between approximately 60 sccm and approximately 100 sccm; the Carbon Hydro-Trifluoride ($CHF_3$) flow rate can vary between approximately 40 sccm and approximately 60 sccm; the top chamber temperature can vary from approximately 70 degrees Celsius to approximately 90 degrees Celsius; the chamber wall temperature can vary from approximately 50 degrees Celsius to approximately 70 degrees Celsius; the bottom chamber temperature can vary from approximately 10 degrees Celsius to approximately 30 degrees Celsius; the temperature at the center of the wafer holder can vary from approximately 12 degrees Celsius to approximately 20 degrees Celsius; the temperature at the edge of the wafer holder can vary from approximately 8 degrees Celsius to approximately 12 degrees Celsius; the center backside pressure for the wafer holder can vary from approximately 15 Torr to approximately 25 Torr; the edge backside pressure for the wafer holder can vary from approximately 27 Torr to approximately 33 Torr; and the processing time can vary from approximately 60 seconds to approximately 90 seconds.

During IEO width control (GWL or FWL) etching procedures, the chamber pressure can range from approximately 15 mT to approximately 25 mT; the top power can vary from approximately 450 watts to approximately 550 watts; the lower power can vary from approximately 90 watts to approximately 110 watts; the ESC voltage can be set at approximately 2500 V; the $O_2$ flow rate can vary between approximately 30 sccm and approximately 50 sccm; the $CO_2$ flow rate can vary between approximately 70 sccm and approximately 90 sccm; the HBr flow rate can vary between approximately 25 sccm and approximately 35 sccm; the top chamber temperature can vary from approximately 70 degrees Celsius to approximately 90 degrees Celsius; the chamber wall temperature can vary from approximately 50 degrees Celsius to approximately 70 degrees Celsius; the bottom chamber temperature can vary from approximately 10 degrees Celsius to approximately 30 degrees Celsius; the temperature at the center of the wafer holder can vary from approximately 12 degrees Celsius to approximately 20 degrees Celsius; the temperature at the edge of the wafer holder can vary from approximately 8 degrees Celsius to approximately 12 degrees Celsius; the center backside pressure for the wafer holder can vary from approximately 15 Torr to approximately 25 Torr; the edge backside pressure for the wafer holder can vary from approximately 27 Torr to approximately 33 Torr; and the processing time can vary from approximately 90 seconds to approximately 130 seconds.

During IEO TEOS layer etching procedures, the chamber pressure can range from approximately 35 mT to approximately 45 mT; the top power can vary from approximately 550 watts to approximately 650 watts; the lower power can vary from approximately 90 watts to approximately 110 watts; the ESC voltage can be set at approximately 2500 V; the $CF_4$ flow rate can vary between approximately 40 sccm and approximately 60 sccm; the $CHF_3$ flow rate can vary between approximately 40 sccm and approximately 60 sccm; the $O_2$ flow rate can vary between approximately 3 sccm and approximately 7 seem; the top chamber temperature can vary from approximately 30 degrees Celsius to approximately 90 degrees Celsius; the chamber wall temperature can vary from approximately 50 degrees Celsius to approximately 70 degrees Celsius; the bottom chamber temperature can vary from approximately 30 degrees Celsius to approximately 50 degrees Celsius; the temperature at the center of the wafer holder can vary from approximately 25 degrees Celsius to approximately 35 degrees Celsius; the temperature at the edge of the wafer holder can vary from approximately 8 degrees Celsius to approximately 12 degrees Celsius; the center backside pressure for the wafer holder can vary from approximately 15 Torr to approximately 25 Torr; the edge backside pressure for the wafer holder can vary from approximately 27 Torr to approximately 33 Torr; and the processing time can vary from approximately 50 seconds to approximately 90 seconds.

During IEO TEOS OE etching procedures, the chamber pressure can range from approximately 35 mT to approximately 45 mT; the top power can vary from approximately 550 watts to approximately 650 watts; the lower power can vary from approximately 90 watts to approximately 110 watts; the ESC voltage can be set at approximately 2500 V; the $CF_4$ flow rate can vary between approximately 40 sccm and approximately 60 sccm; the $CHF_3$ flow rate can vary between approximately 40 sccm and approximately 60 sccm; the $O_2$ flow rate can vary between approximately 3 sccm and approximately 7 sccm; the top chamber temperature can vary from approximately 30 degrees Celsius to approximately 90 degrees Celsius; the chamber wall temperature can vary from approximately 50 degrees Celsius to approximately 70 degrees Celsius; the bottom chamber temperature can vary from approximately 30 degrees Celsius to approximately 50 degrees Celsius; the temperature at the center of the wafer holder can vary from approximately 25 degrees Celsius to approximately 35 degrees Celsius; the temperature at the edge of the wafer holder can vary from approximately 8 degrees Celsius to approximately 12 degrees Celsius; the center backside pressure for the wafer holder can vary from approximately 15 Torr to approximately 25 Torr; the edge backside pressure for the wafer holder can vary from approximately 27 Torr to approximately 33 Torr; and the processing time can vary from approximately 5 seconds to approximately 10 seconds.

During IEO BT etching procedures, the chamber pressure can range from approximately 8 mT to approximately 12 mT; the top power can vary from approximately 600 watts to approximately 700 watts; the lower power can vary from approximately 175 watts to approximately 200 watts; the ESC voltage can be set at approximately 2500 V; the $CF_4$ flow rate can vary between approximately 120 sccm and approximately 150 sccm; the top chamber temperature can vary from approximately 70 degrees Celsius to approximately 90 degrees Celsius; the chamber wall temperature can vary from approximately 50 degrees Celsius to approximately 70 degrees Celsius; the bottom chamber temperature can vary from approximately 10 degrees Celsius to approximately 30 degrees Celsius; the wafer holder temperature can vary from approximately 60 degrees Celsius to approximately 70 degrees Celsius; the center backside pressure for the wafer holder can vary from approximately 8 Ton to approximately 12 Torr; the edge backside pressure for the wafer holder can vary from approximately 8 Torr to approximately 12 Torr; and the processing time can vary from approximately 5 seconds to approximately 15 seconds.

During IEO ME etching procedures, the chamber pressure can range from approximately 8 mT to approximately 12 mT; the top power can vary from approximately 120 watts to approximately 150 watts; the ESC voltage can be set at approximately 2500 V; the $O_2$ flow rate can vary between approximately 2 sccm and approximately 6 sccm; the HBr flow rate can vary between approximately 220 sccm and approximately 280 sccm; the top chamber temperature can vary from approximately 70 degrees Celsius to approximately 90 degrees Celsius; the chamber wall temperature can vary from approximately 50 degrees Celsius to approximately 70 degrees Celsius; the bottom chamber temperature can vary from approximately 10 degrees Celsius to approximately 30 degrees Celsius; the wafer holder temperature can vary from approximately 60 degrees Celsius to approximately 70 degrees Celsius; the center backside pressure for the wafer holder can vary from approximately 8 Ton to approximately 12 Torr; the edge backside pressure for the wafer holder can vary from approximately 8 Torr to approximately 12 Torr; and the processing time can vary from approximately 50 seconds to approximately 70 seconds.

During IEO OE etching procedures, the chamber pressure can range from approximately 8 mT to approximately 12 mT; the top power can vary from approximately 120 watts to approximately 150 watts; the lower power can vary from approximately 20 watts to approximately 40 watts; the ESC voltage can be set at approximately 2500 V; the $O_2$ flow rate can vary between approximately 2 sccm and approximately 6 sccm; the HBr flow rate can vary between approximately 220 sccm and approximately 280 sccm; the top chamber temperature can vary from approximately 70 degrees Celsius to approximately 90 degrees Celsius; the chamber wall temperature can vary from approximately 50 degrees Celsius to approximately 70 degrees Celsius; the bottom chamber temperature can vary from approximately 60 degrees Celsius to approximately 80 degrees Celsius; the wafer holder temperature can vary from approximately 60 degrees Celsius to approximately 70 degrees Celsius; the center backside pressure for the wafer holder can vary from approximately 8 Torr to approximately 12 Torr; the edge backside pressure for the wafer holder can vary from approximately 8 Torr to approximately 12 Torr; and the processing time can vary from approximately 20 seconds to approximately 30 seconds.

During IEO TiN etching procedures, the chamber pressure can range from approximately 8 mT to approximately 12 mT; the top power can vary from approximately 180 watts to approximately 220 watts; the lower power can vary from approximately 40 watts to approximately 60 watts; the ESC voltage can be set at approximately 2500 V; the chlorine ($Cl_2$) flow rate can vary between approximately 12 sccm and approximately 18 sccm; the Ar flow rate can vary between approximately 180 sccm and approximately 220 sccm; the top chamber temperature can vary from approximately 70 degrees Celsius to approximately 90 degrees Celsius; the chamber wall temperature can vary from approximately 50 degrees Celsius to approximately 70 degrees Celsius; the bottom chamber temperature can vary from approximately 60 degrees Celsius to approximately 80 degrees Celsius; the wafer holder temperature can vary from approximately 60 degrees Celsius to approximately 70 degrees Celsius; the center backside pressure for the wafer holder can vary from approximately 8 Torr to approximately 12 Torr; the edge backside pressure for the wafer holder can vary from approximately 8 Torr to approximately 12 Torr; and the processing time can vary from approximately 50 seconds to approximately 80 seconds.

During IEO HK etching procedures, the HK chamber pressure can range from approximately 8 mT to approximately 12 mT; the top power can vary from approximately 550 watts to approximately 650 watts; the ESC voltage can be set at approximately 500 V; the Boron Trichloride ($BCl_3$) flow rate can vary between approximately 120 sccm and approximately 180 sccm; the top chamber temperature can vary from approximately 70 degrees Celsius to approximately 90 degrees Celsius; the chamber wall temperature can vary from approximately 40 degrees Celsius to approximately 60 degrees Celsius; the bottom chamber temperature can vary from approximately 60 degrees Celsius to approximately 80 degrees Celsius; and the processing time can vary from approximately 30 seconds to approximately 40 seconds.

During IEO ashing procedures, the chamber pressure can range from approximately 125 mT to approximately 175 mT; the top power can vary from approximately 350 watts to approximately 450 watts; the lower power can vary from approximately 20 watts to approximately 30 watts; the ESC voltage can be set at approximately 2500 V; the $O_2$ flow rate can vary between approximately 430 sccm and approximately 470 sccm; the top chamber temperature can vary from approximately 30 degrees Celsius to approximately 90 degrees Celsius; the chamber wall temperature can vary from approximately 50 degrees Celsius to approximately 70 degrees Celsius; the bottom chamber temperature can vary from approximately 70 degrees Celsius to approximately 80 degrees Celsius; the temperature at the center of the wafer holder can vary from approximately 70 degrees Celsius to approximately 80 degrees Celsius; the temperature at the edge of the wafer holder can vary from approximately 8 degrees Celsius to approximately 12 degrees Celsius; the center backside pressure for the wafer holder can vary from approximately 15 Torr to approximately 25 Torr; the edge backside pressure for the wafer holder can vary from approximately 27 Torr to approximately 33 Torr; and the processing time can vary from approximately 150 seconds to approximately 210 seconds.

During IE-etch MIMO model development, the number of feed forward and feedback paths (675, 680, and 685) actually used in the IE-etch MIMO can be optimized. DOE techniques can be used to create and/or examine the IE-etch MIMO models (660-666) and to develop a reduced set of feed forward and feedback paths/variables. One or more of the four exemplary patterned wafers (601-604) and one or more of the IE-etch MIMO models (660-666) can be used during model development and DOE procedures. Recipe data and/or process data for one or more of the four exemplary patterned wafers (601-604) and modeling data for one or more of the IE-etch MIMO models (660-666) can be stored in libraries and used during IE-etch MIMO modeling procedures.

Figure 7:
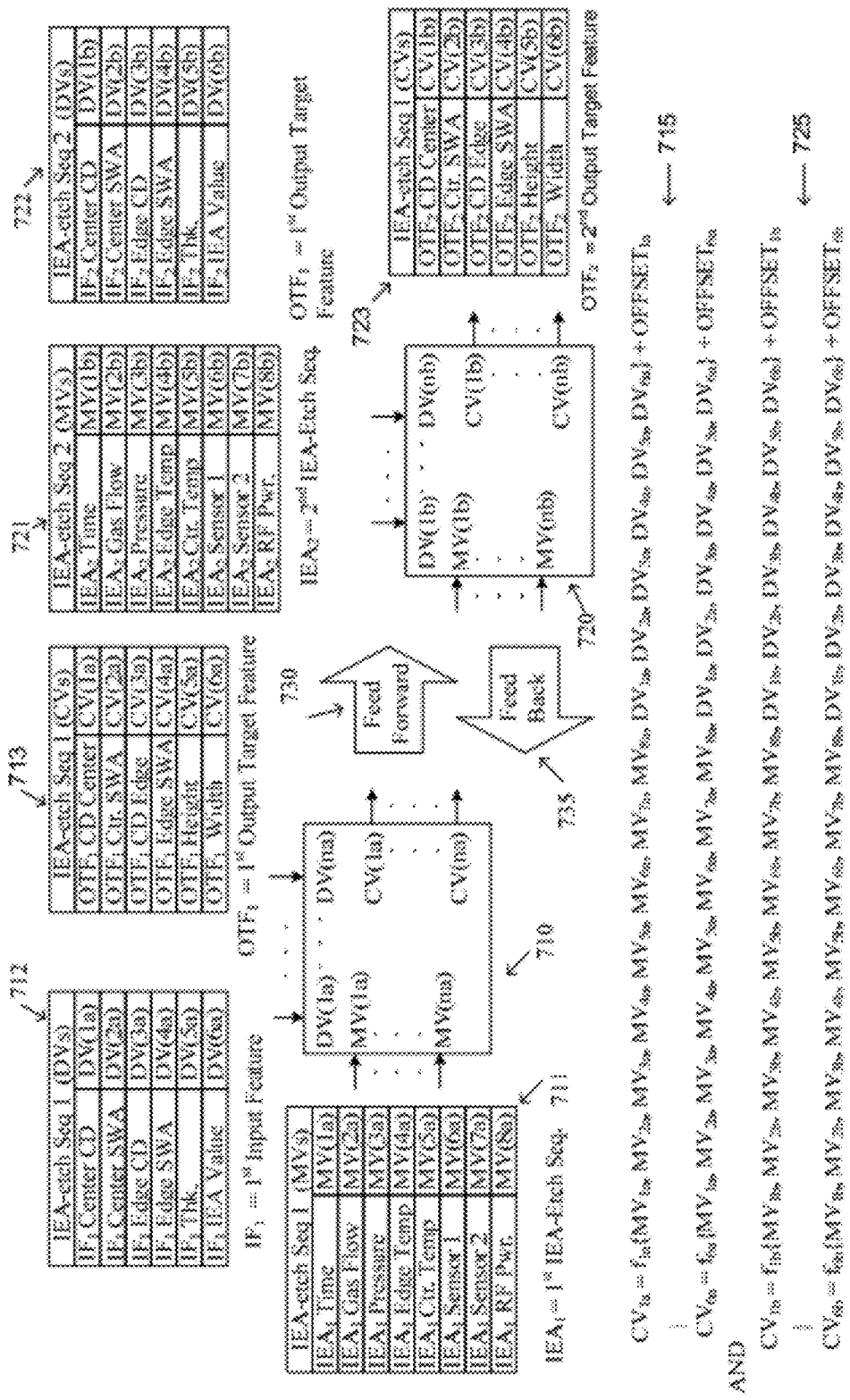
FIG. 7 illustrates an exemplary block diagram for a two-part Ion Energy Controlled Multi-Input/Multi-Output (IEC-MIMO) model in accordance with embodiments of the invention.

FIG. 7 illustrates an exemplary block diagram for a two-part Ion Energy Controlled Multi-Input/Multi-Output (ICE-MIMO) model in accordance with embodiments of the invention.

A first generalized ICE-MIMO model 710 is shown that can be associated with a first IE-etch ($IE_1$) sequence and that includes a first set of manipulated variables MVs(1a-na), a first set of disturbance variables DVs(1a-na), and a first set of controlled variables CVs(1a-na). A first set of exemplary MVs 711 is shown that includes eight manipulated variables $\{(MV_{1a})\text{-}(MV_{8a})\}$ that can be associated with the first IEC-MIMO model 710. Alternatively, a different number of different manipulated variables may be associated with the first IEC-MIMO model 710. A first set of exemplary DVs 712 is shown that includes six disturbance variables $\{(DV_{1a})\text{-}(DV_{6a})\}$ that can be associated with the first IEC-MIMO model 710. Alternatively, a different number of different disturbance variables may be associated with the first IEC-MIMO model 710. A first set of exemplary CVs 713 is shown that includes six controlled variables $\{(CV_{1a})\text{-}(CV_{6a})\}$ that can be associated with the first IEC-MIMO model 710. Alternatively, a different number of different controlled variables may be associated with the first IEC-MIMO model 710. In addition, a first set of exemplary equations 715 is shown that can be associated with the first IEC-MIMO model 710. Alternatively, other equations may be associated with the first IEC-MIMO model 710.

A second generalized IEC-MIMO model 720 is shown that can be associated with a second IE-etch ($IE_2$) sequence and that includes a second set of manipulated variables MVs(1b-nb), a second set of disturbance variables DVs(1b-nb), and a second set of controlled variables CVs(1b-nb). A second set of exemplary MVs 721 is shown that includes eight manipulated variables $\{(MV_{1b})\text{-}(MV_{8b})\}$ that can be associated with the second IEC-MIMO model 720. Alternatively, a different number of different manipulated variables may be associated with the second IEC-MIMO model 720. A second set of exemplary DVs 722 is shown that includes six disturbance variables $\{(DV_{1b})\text{-}(DV_{6b})\}$ that can be associated with the second IEC-MIMO model 720. Alternatively, a different number of different disturbance variables may be associated with the second IEC-MIMO model 720. A second set of exemplary CVs 723 is shown that includes six controlled variables $\{(CV_{1b})\text{-}(CV_{6b})\}$ that can be associated with the second IEC-MIMO model 720. Alternatively, a different number of different controlled variables may be associated with the second IEC-MIMO model 720. In addition, a second set of exemplary equations 725 is shown that can be associated with the second IEC-MIMO model 720. Alternatively, other equations may be associated with the second IEC-MIMO model 720.

One or more of the variables (711, 712, or 713) associated with the first IEC-MIMO model 710 can be fed forward 730 to the second IEC-MIMO model 720, and one or more of the variables (721, 722, or 723) associated with the second IEC-MIMO model 720 can be fed back 735 to the first IEC-MIMO model 710.

Figure 8:
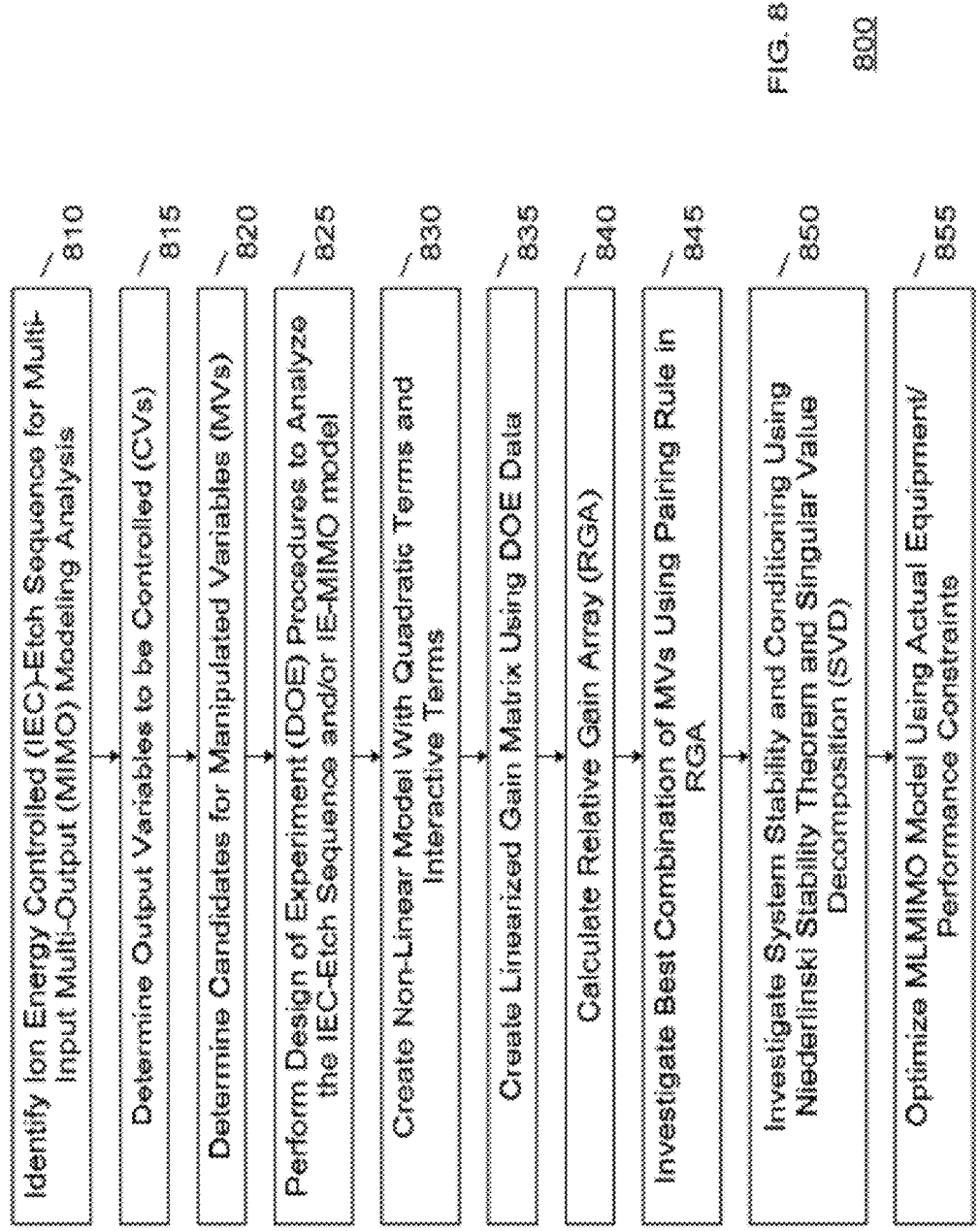
FIG. 8 illustrates an exemplary flow diagram for a procedure for developing an Ion Energy Controlled Multi-Input/Multi-Output (IEC-MIMO) model in accordance with embodiments of the invention.

FIG. 8 illustrates an exemplary flow diagram for a procedure for developing an Ion Energy Multi-Input/Multi-Output (IEC-MIMO) model for an Ion Energy Controlled (IEC)-etch sequence in accordance with embodiments of the invention. In the illustrated embodiment, a procedure 800 is shown having a number of steps. Alternatively, a different number of alternate steps may be used.

In 810, one or more Ion Energy Controlled (IEC)-etch sequences can be identified as candidates for an IEC-MIMO modeling analysis procedure. In some examples, one or more IEC-etch sequences and associated IEC-MIMO models can be established to create one or more patterned wafers (501*a*, 502*a*, and 503*a*, FIG. 5A') or (501*b*, 502*b*, and 503*b*, FIG. 5B') or (601*a*, 602*a*, and 603*a*, FIG. 6A') or (601*b*, 602*b*, and 603*b*, FIG. 6B').

In 815, a first set of controlled outputs variables (CVs) and the ranges associated with the CVs can be determined. One or more of the CVs can be specified by an end user or a customer. The CVs can include one or more critical dimensions (CDs) and/or one or more side wall angles associated with one or more of the feature stacks (505*a*, 506*a*, and 507*a*) shown in FIG. 5A' or feature stacks (505*b*, 506*b*, and 507*b*) shown in FIG. 5B' or with one or more of the gate stacks (605*a*, 606*a*, and 607*a*) shown in FIG. 6A' or with one or more of the gate stacks (605*b*, 606*b*, and 607*b*) shown in FIG. 6B'. In some examples, the first and second IEC-etch sequences can be performed to create pFET devices, nFET devices, Tri-gate devices, and FinFET devices.

In 820, a first set of candidates can be determined for the manipulated variables (MVs) associated with the IEC-MIMO using one or more candidate Ion Energy Optimized (IEO)-etch procedures/recipes. The MVs can include WiW manipulated variables (WiW-MVs), and the WiW-MVs can include "fast" MVs that can be controlled while a wafer is being processed. The MVs can include W2W manipulated variables (W2W-MVs), and the W2W-MVs can include "slow" MVs that can be controlled when a wafer lot is being processed. The ranges for the MVs can be examined for each step in a candidate recipe.

When a two-zone wafer holder with a fast response time is used, the center temperature and the edge temperature for the wafer holder can be used as (WiW-MVs) and can be changed on a step by step basis. When a RF source with a fast response time is used with a split upper electrode and power splitter, the center RF power and the edge RF power for the plasma can be used as (WiW-MVs) and can be changed on a step by step basis. When a low temperature chiller (−10 degrees C.) is used, there can be a larger temperature difference from center to edge. In addition, pressure, time, and gas flows can be used as MVs.

The disturbance variables (DVs) can include CD and SWA values for a first input feature ($IF_1$) at the center and edge, the control layer CD and SWA at the center and edge, the feature thicknesses at the center and edge, the chemical and etch rate properties of the different layers, the maintenance events on chamber, the chamber-to-chamber data, the input IE values, and other stack data.

In 825, Design of Experiment (DOE) procedures can be performed to analyze the IEC-etch sequence and/or the IEC-MIMO model. Using IE-sensor wafers and/or IE-sensor data from DOE wafers, IEC and/or IEO related experiments can be performed to establish statistical models that can connect MVs with each CV. When the number of experiments increases, a more accurate model can be obtained, but at the expense of additional materials and time. Therefore, cost and availability can limit the number of sequences performed using IE-sensor wafers and/or the number of DOE wafers processed in IEC processing chambers. A critical factor for DOE procedures is the format of the predicted model. One or more model types can be selected, ranges can be provided for the CVs and/or MVs, and statistical software, such as JMP® (a statistical software from the SAS Institute) can be used to establish one or more of the DOE tables). The DOE data can be used to establish candidate MVs, CVs, and DVs that can be associated with a first, second, and/or third IEC-etch sequences. In other analysis procedures, other MVs, DVs, and CVs can be used. In some embodiments, the chamber state data for the etching chambers and the IM chambers can be used as manipulated variables. Alternatively, the process modeling may assume that the chamber state is stable between wafers and/or lots.

In some examples, the IEC-etch sequence can include one or more IEO etch procedures that can include a Si-ARC layer etching procedure, a GWC layer etching procedure, a TEOS layer etching procedure, a TEOS Over-Etch (OE) etching procedure, and an ashing procedure. In other examples, the IEC-etch sequence can include a "Break-Though" (BT) etching procedure, a main etch (ME) etching procedure, an OverEtch (OE) etching procedure, a Titanium-Nitride (TiN) etching procedure, and a HK etching procedure. The DOE data obtained for the IEC-etch sequences can include IE-sensor data, process sensor data, and IE-sensor wafer data.

In 830, after performing the first IEC-etch sequences and/or the second IEC-etch sequences required to populate one or more DOE tables, nonlinear models with quadratic and interaction terms can be created by using a least squares technique and statistical software. In some models, terms can be deleted that have extremely small coefficients associated with them.

In 835, one or more linear gain matrices (G) can be created using the DOE data. For example, a Relative Gain Array (RGA) matrix can be created using:

$$\lambda ij = \frac{\left[\frac{\partial CV_i}{\partial MV_j}\right]_{MV_{k,k\neq j}}}{\left[\frac{\partial CV_i}{\partial MV_j}\right]_{CV_{k,k\neq j}}} = \frac{\text{Gain(open} - \text{loop)}}{\text{Gain(closed} - \text{loop)}}$$

for i=1,2, . . . , n and j=1,2, . . . , n The symbol ($\partial CV_i/\partial MV_j)_{MV}$ denotes a partial derivative that is evaluated with all of the manipulated variables except $MV_j$ held constant, and this term is the open-loop gain between $CV_i$ and $MV_j$. In addition, the symbol ($\partial CV_i/\partial MV_j)_{CV}$ can be interpreted as a closed loop gain that indicates the effect of $MV_j$ and $CV_i$ when all of the control loops are closed.

When a non-square matrix is obtained, some of the MVs or CVs may be eliminated to create a square matrix. In addition, when there are more MV's than CVs, the non-square matrix can be analyzed using a non-square RGA (NRGA). For example $$\text{NRGA}=G \otimes (G^+)^T$$

and the pseudo-inverse, $G^+$, is used instead of the normal inverse, $G^{-1}$. NRGA provides several criteria for the selection of a square system, but their criteria are not always valid in some non-square systems, so all combinations of square pairing of subsystems might need considered. To compare one subsystem with others RGA pairing rules can be used as a metric. This creates sub combinations that can then be compared for best square matrix.

In 840, one or more RGAs can be calculated using one or more of the linear gain matrices (G). For example, when square matrices are used, $$\text{RGA}=G \otimes (G^{-1})^T$$

where G is the gain matrix and $G^{-1}$ is the inverse gain matrix.

In 845, pairing rules in the RGA can be used to investigate the best combinations of MVs and CVs. RGA analysis can be used for measured model parameter selection, and CV-MV pairs can be selected such that their sum is closest to one. In addition, paring on negative elements can be avoided. In addition, the RGA analysis can be used to determine a number of candidate models and to identify the best case solution. When there are more CVs than MVs, RGA analysis can be used for selecting the most controllable CV (sensitivity analysis of CVs to MVs).

In 850, the system stability and conditioning can be determined. For example, the Niederlinski Stability Theorem states that a closed loop system resulting from diagonal pairing is unstable if:

$$NST = \frac{\det(G)}{\prod_{i=1}^{n} g_{ii}} < 0$$

where NST is the Niederlinski Index, G is the gain matrix, det(G) is the determinant of the gain matrix (G), and $g_{ii}$ is the diagonal elements of the gain matrix, In addition, a condition number (CN) can be determined using the ratio between the maximum and minimum singular values. Additional information concerning RGA analysis may be found in a book (ISBN 978047001168-3) entitled "Multivariable Feedback Control: Analysis and Design" by Sigurd Skogestad and Ian Postlethwaite from which pages (75-86) and pages (431-449) are incorporated herein in their entirety. For example, when CN is greater than fifty, the system is nearly singular and will have poor control performance.

In 855, the IEC-MIMO model can be optimized using actual equipment and/or performance constraints. In some examples, the measurement locations can be examined and selected to optimize performance, the number of pre- and/or post measurement procedure can be established to optimize performance, and the multi-chamber sequences can be examined to optimize throughput. The feedback can be optimized by tuning the EWMA filters. The time constants for the MVs can be determined, and their update frequency can be based on Lot-to-Lot (L2L), W2W, WiW, and process step values. In addition, process center points, CV center points, and MV center points can be examined to optimize performance. Historical data can be used to perform simulations.

The wafers can include one or more layers that can include semiconductor material, carbon material, dielectric material, glass material, ceramic material, metallic material, oxidized material, mask material, or planarization material, or a combination thereof.

In other embodiments, one or more IE-sensor wafers can be processed to verify an IEC-MIMO model and/or to verify an IEC-etch sequence. When an IEC-etch sequence or IEC-MIMO model is verified, one or more verified metal-gate structures can be created on a test wafer, and when the test wafer is examined, a test reference periodic structure can be used. During the examination, examination data can be obtained from the test reference periodic structure. A best estimate structure and associated best estimate data can be selected from the IEC-MIMO library that includes verified gate structures, target features, and associated data. One or more differences can be calculated between the test reference periodic structure and the best estimate structure from the library, the differences can be compared to matching criteria, creation criteria, or product requirements, or any combination thereof. When matching criteria are used, the test reference periodic structure can be identified as a member of the IEC-MIMO library, and the test wafer can be identified as a reference "golden" wafer if the matching criteria are met or exceeded. When creation criteria are used, the test reference periodic structure can be identified as a new member of the IEC-MIMO library, and the test wafer can be identified as a verified reference wafer if the creation criteria are met. When product requirement data is used, the test reference periodic structure can be identified as a verified structure, and the test wafer can be identified as verified production wafer if one or more product requirements are met. Corrective actions can be applied if one or more of the criteria or product requirements are not met. IEC-MIMO confidence data and/or risk data can be established for the test reference structure using the test reference structure data and the best estimate structure data. For example, the IEC-MIMO evaluation library data can include goodness of fit (GOF) data, creation rules data, measurement data, inspection data, verification data, map data, confidence data, accuracy data, process data, or uniformity data, or any combination thereof.

When the gate-related structures and/or the target feature structures are produced and/or examined, accuracy and/or tolerance limits can be used. When these limits are not correct, refinement procedures can be performed. Alternatively, other procedures can be performed, other sites can be used, or other wafers can be used. When a refinement procedure is used, the refinement procedure can utilize bilinear refinement, Lagrange refinement, Cubic Spline refinement, Aitken refinement, weighted average refinement, multi-quadratic refinement, bi-cubic refinement, Turran refinement, wavelet refinement, Bessel's refinement, Everett refinement, finite-difference refinement, Gauss refinement, Hermite refinement, Newton's divided difference refinement, osculating refinement, or Thiele's refinement algorithm, or a combination thereof.

Figure 9:
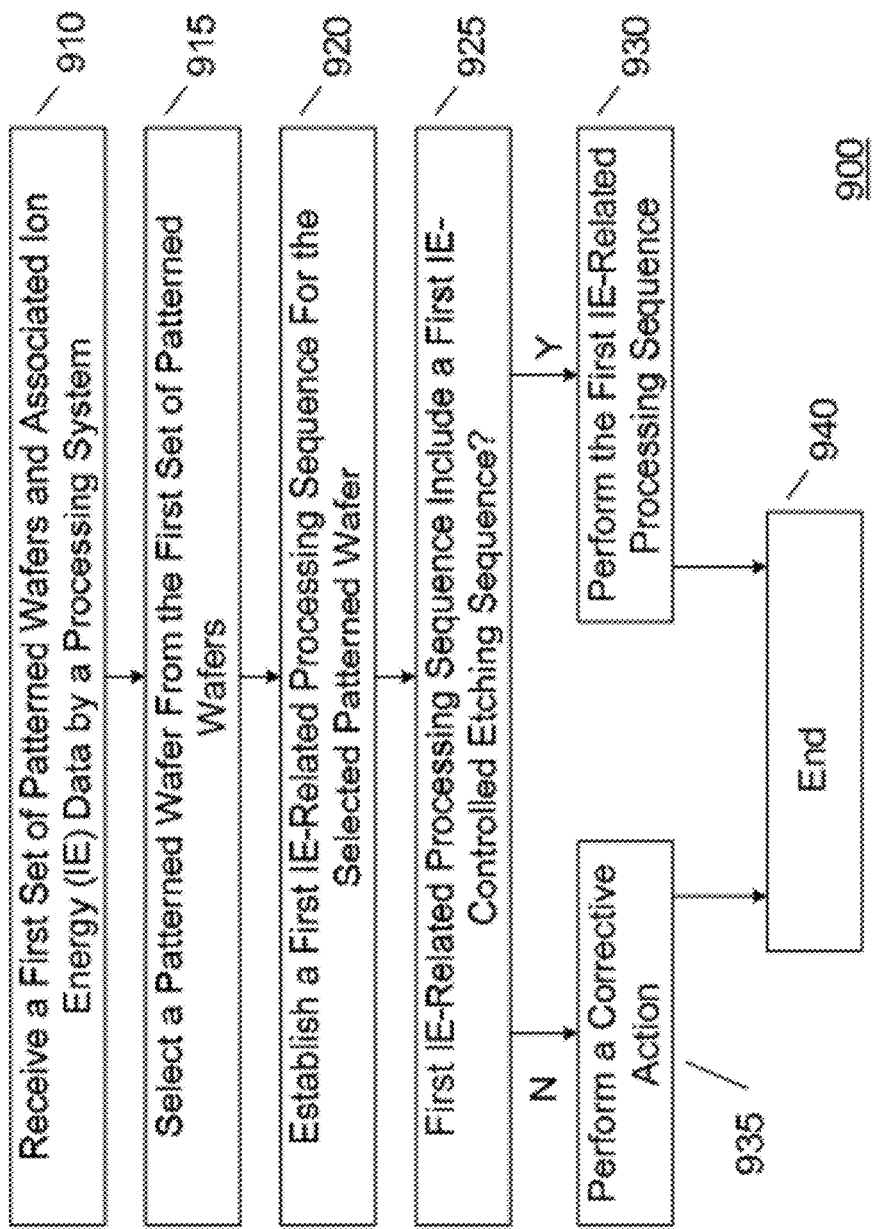
FIG. 9 illustrates a simplified flow diagram of a method for processing wafers using an IE-related process sequence in accordance with embodiments of the invention.

FIG. 9 illustrates a simplified flow diagram of a method for processing wafers using an IE-related process sequence in accordance with embodiments of the invention.

In 910, a first set of patterned wafers (501*a*, or 601*a*) and associated Ion Energy (IE) data can be received by a processing system, and each patterned wafer (501*a*, or 601*a*) can include a first patterned soft-mask layer (570*a*, or 670*a*) and a plurality of additional layers. The first patterned soft-mask layer (570*a*, or 670*a*) can include a plurality of gate-related soft-mask features and at least one first periodic evaluation structure (not shown). The wafer data can include real-time integrated metrology (IM) data for the at least one periodic structure in the first patterned soft-mask layer.

In 915, a patterned wafer can be selected from the first set of patterned wafers.

In 920, a first Ion Energy (IE)-related process sequence can be established for the selected patterned wafer using the IE data.

In 925, a first query can be performed to determine if the first IE-related process sequence includes a first Ion Energy Controlled (IEC)-etch sequence. When the first IE-related process sequence includes a first IEC-etch sequence, procedure 900 can branch to 930 and continue as shown in FIG. 9. When the first IE-related process sequence does not include a first IEC-etch sequence, procedure 900 can branch to 935 and continue as shown in FIG. 9.

In 930, the first IEC-etch sequence can be performed when the first IE-related process sequence includes the first IEC-etch sequence, and a second set of patterned wafers can be created when the first IEC-etch sequence is performed using the first set of patterned wafers.

In 935, at least one first corrective action can be performed when the first IE-related process sequence does not include the first IEC-etch sequence.

In some embodiments, procedure 900 can end in 940.

In other embodiments, another query can be performed to determine if the first IEC-etch sequence includes a first IEO-etch procedure, and the first IEO-etch procedure can be performed when the first IEC-etch sequence includes the first IEO-etch procedure. For example, the first IEO-etch procedure can use a first etch subsystem having a first IEC process chamber configured therein and a first MIMO controller coupled thereto. In addition, a first corrective action can be performed when the IEC-etch sequence does not include the first IEO-etch procedure.

When the first IEC-etch sequence includes a second IEO-etch procedure, the second IEO-etch procedure can be performed. For example, the second IEO-etch procedure can use a second etch subsystem having a second IEC process chamber configured therein and a second MIMO controller coupled thereto. In addition, a first validation procedure can be performed when the IEC-etch sequence does not include the second IEO-etch procedure.

During some examples, performing the second IEO-etch procedure can comprise: selecting an etched patterned wafer from the first set of etched patterned wafers; positioning the selected etched patterned wafer on a second wafer holder in the second IEC process chamber; creating a second IEO plasma in the second IEC process chamber; processing the selected etched patterned wafer using the second IEO plasma; and obtaining second IE-sensor data while the selected etched patterned wafer is processed, wherein a second IE-sensor is coupled to the second IEC process chamber and is configured to obtain the second IE-sensor data.

In some embodiments, the methods of the invention can further comprise determining if the first IE-related process sequence includes a second IEC-etch sequence; performing the second IEC-etch sequence when the first IE-related process sequence includes the second IEC-etch sequence; and performing a validation procedure when the first IE-related process sequence does not include the second IEC-etch sequence. For example, a third set of patterned wafers can be created when the first IEC-etch sequence and the second IEC-etch sequence are performed using the first set of patterned wafers.

One or more queries can be performed to determine if the first IEC-etch sequence includes a new first IEO-etch procedure. When a new first IEO-etch procedure is performed, the new first IEO-etch procedure can use a new first etch subsystem having a new first IEC process chamber configured therein and a new first MIMO controller coupled thereto. When the IEC-etch sequence does not include the new first IEO-etch procedure, a new first validation procedure can be performed.

In addition, performing the new first IEO-etch procedure can include selecting a new patterned wafer from a set of patterned wafers; positioning the new selected patterned wafer on a new wafer holder in the new IEC process chamber; creating a new IEO plasma in the new IEC process chamber; processing the new selected patterned wafer using the new IEO plasma; and obtaining new IE-sensor data while the new selected patterned wafer is processed, wherein a new IE-sensor is coupled to the new IEC process chamber and is configured to obtain the new IE-sensor data.

Other queries can be performed to determine if the second IEC-etch sequence includes a new second IEO-etch procedure, and the new second IEO-etch procedure can be performed when the second IEC-etch sequence includes the new second IEO-etch procedure. For example, the new second IEO-etch procedure can use a new second etch subsystem having a new second IEC process chamber configured therein and a new second MIMO controller coupled thereto. When the second IEC-etch sequence does not include the new second IEO-etch procedure, a new second validation procedure can be performed.

When the second IEO-etch procedure is performed, an etched second patterned wafer can be selected from the first set of etched second patterned wafers; the selected etched second patterned wafer can be positioned on a new second wafer holder in the new second IEC process chamber; a new second IEO plasma can be created in the new second IEC process chamber; the selected second etched patterned wafer can be processed using the new second IEO plasma; and new second IE-sensor data can be obtained while the selected second etched patterned wafer is processed. For example, a new second IE-sensor can be coupled to the new second IEC process chamber and can be configured to obtain the new second IE-sensor data.

In other embodiments, at least one additional query can be performed to determine if the first IE-related process sequence includes a second IEC-etch sequence and a third IEC-etch sequence. The second IEC-etch sequence and the third IEC-etch sequence can be performed when the first IE-related process sequence includes the second IEC-etch sequence and the third IEC-etch sequence. For example, a fourth set of patterned wafers can be created when the first IEC-etch sequence, the second IEC-etch sequence, and the third IEC-etch sequence are performed using the first set of patterned wafers. One or more validation procedure can be performed when the first IE-related process sequence does not include the second IEC-etch sequence and the third IEC-etch sequence.

When the second IEC-etch sequence includes a new second IEO-etch procedure, the new second IEO-etch procedure can be performed using a new second etch subsystem having a new second IEC process chamber configured therein and a new second MIMO controller coupled thereto. When the second IEC-etch sequence does not include the new second IEO-etch procedure, a new second validation procedure can be performed.

When the third IEC-etch sequence includes a new third IEO-etch procedure, the new third IEO-etch procedure can use a new third etch subsystem having a new third IEC process chamber configured therein and a new third MIMO controller coupled thereto. When the third IEC-etch sequence does not include the new third IEO-etch procedure, a new third validation procedure can be performed.

In still other embodiments, the methods of the invention can further comprise creating first simulation data for the first IEC-etch sequence using a first IEC-MIMO model. For example, the first IEC-MIMO model includes a first number ($N_a$) of first Controlled Variables ($CV_{1a}, CV_{2a}, \ldots CV_{Na}$), a first number ($M_a$) of first Manipulated Variables ($MV_{1a}, MV_{2a}, \ldots MV_{Ma}$), and a first number ($L_a$) of first Disturbance Variables ($DV_{1a}, DV_{2a}, \ldots DV_{La}$), wherein ($L_a, M_a,$ and $N_a$) are integers greater than one. First IE-sensor data can be obtained during the first IEC-etch sequence; first difference data can be established by comparing the first simulation data to the first IE-sensor data; the first IEC-etch sequence can be verified when the first difference data is less than or equal to first threshold data; and the first simulation data and/or the first IE-sensor data can be stored when the first difference data is greater than the first threshold data.

In addition, second simulation data can be created for the second IEC-etch sequence using a second IEC-MIMO model for the second IEC-etch sequence. The second IEC-MIMO model can include a second number ($N_b$) of second Controlled Variables ($CV_{1b}, CV_{2b}, \ldots CV_{Nb}$), a second number ($M_b$) of second Manipulated Variables ($MV_{Vb}, MV_{2b}, \ldots MV_{Mb}$), and a second number ($L_b$) of second Disturbance Variables ($DV_{1b}, DV_{2b}, \ldots DV_{Lb}$), where ($L_b, M_b,$ and $N_b$) are integers greater than one.

When evaluation data is obtained for at least one of the sets of patterned wafers (501a, 502a, and 503a, FIG. 5A') or (501b, 502b, and 503b, FIG. 5B') or (601a, 602a, and 603a, FIG. 6A') or (601b, 602b, and 603b, FIG. 6B'), one or more queries can be performed to determine if the evaluation data is within one or more limits. When the evaluation data is within one or more of the limits, the set of patterned wafers can be identified as verified wafers. When the evaluation data is not within one or more of the limits, one or more corrective actions can be performed.

Furthermore, third simulation data can be created for the third IEC-etch sequence using a third IEC-MIMO model for the third IEC-etch sequence. The third IEC-MIMO model can include a third number ($N_c$) of third Controlled Variables ($CV_{1c}, CV_{2c}, \ldots CV_{Nc}$), a third number ($M_c$) of third Manipulated Variables ($MV_{1c}, MV_{2c}, \ldots MV_{Mc}$), and a third number ($L_c$) of third Disturbance Variables ($DV_{1c}, DV_{2c}, \ldots DV_{Lc}$), where ($L_c, M_c,$ and $N_c$) are integers greater than one.

When IE-related data is collected, a number of verification wafers and/or IE-sensor wafers can be used and candidate disturbance variables can be identified. During data collection, the variations associated with one or more CVs can be minimized, and the collected data can be used for a simulation. The simulation can execute the same sequence as the IEO etch procedures used in production. For example, one or more of the processed wafers can be measured in an integrated metrology chamber and the IM data can include CD and SWA data from multiple sites in a patterned masking layer on each incoming wafer. In addition, IE-sensor data, process sensor data, and/or other sensor data can be received and analyzed. Grating density and transistor type should be selected to correlate to the most critical chip level performance metric (such as P or N channel transistor type) because each of the transistor structures can have some variations that can be related to the etch profile control needs.

Figure 10:
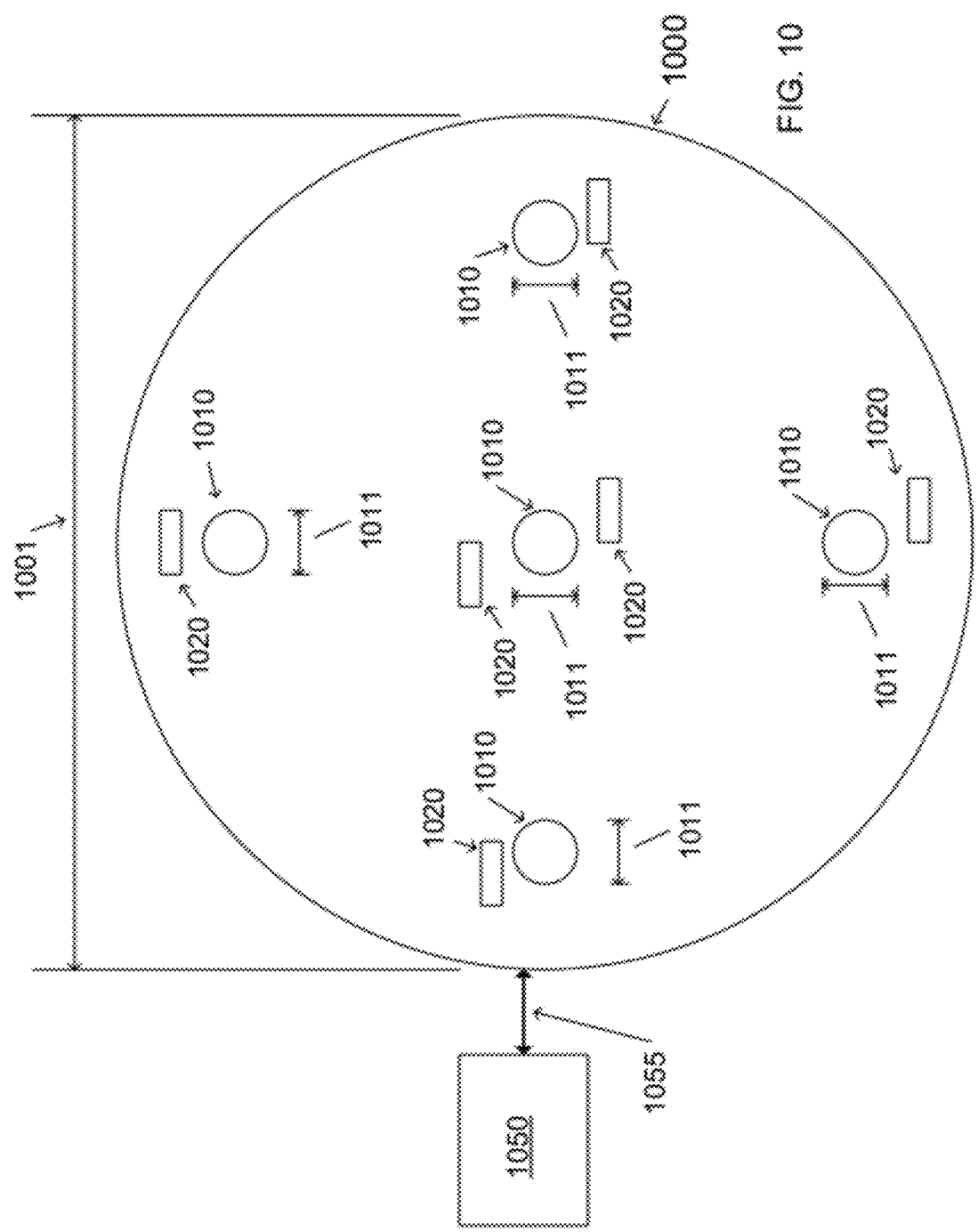
FIG. 10 illustrates an exemplary block diagram for an Ion Energy (IE) sensor wafer in accordance with embodiments of the invention.

FIG. 10 illustrates an exemplary block diagram for an Ion Energy (IE) sensor wafer in accordance with embodiments of the invention. In the illustrated embodiment, a simplified top view of IE-sensor wafer 1000 is shown. The IE-sensor wafer 1000 can have a first diameter 1001 of about 300 millimeters (mm) Alternatively, the diameter 1001 can be smaller or larger.

The IE-sensor wafer 1000 can include one or more ion energy analyzers 1010 configured at one or more first locations within the IE-sensor wafer 1000. For example, the IE-sensor wafer 1000 and methods for using it can be as described in U.S. Pat. No. 7,777,179, entitled "Two-Grid Ion Energy Analyzer and Methods of Manufacturing and Operating", by Chen, et al., issued on Aug. 17, 2010, and this patent is incorporated in its entirety herein by reference. In addition, the IE-sensor wafers and methods for using can be as described in U.S. Pat. No. 7,875,859, entitled "Ion Energy Analyzer and Methods of Manufacturing and Operating", by Chen, et al., issued on Jan. 25, 2011, and this patent is incorporated in its entirety herein by reference. Furthermore, co-pending U.S. Provisional Patent application Ser. No. 61/468, 187, entitled "Ion Energy Analyzer and Methods of Manufacturing and Operating", provides additional information, and this provisional patent application is incorporated in its entirety herein by reference. A top view of the ion energy analyzers 1010 are shown, and the ion energy analyzers 1010 can include at least one circular opening having a second diameter 1011. The second diameter 1011 can vary from about 10 mm to about 50 mm.

A controller 1050 is shown in FIG. 10, and a signal bus 1055 can be used to electrically couple the controller 1050 to the IE-sensor wafer 1000. For example, the controller 1050 can exchange IE-related data with one or more of the ion energy analyzers 1010 using the signal bus 1055.

In some embodiments, the ion energy analyzer 1010 can be used for determining the ion energy distribution (IED) of ions incident on a radio frequency (RF) biased wafer/substrate immersed in plasma. The ion energy analyzer 1010 can include an entrance grid (not shown) exposed to the plasma, an electron rejection grid (not shown) disposed proximate to the entrance grid, and an ion current collector (not shown) disposed proximate to the electron rejection grid. The ion current collector can be coupled to an ion selection voltage source, configured in the controller 1050, and configured to positively bias the ion current collector by an ion selection voltage, and the electron rejection grid can be coupled to an electron rejection voltage source, configured in the controller 1050, and configured to negatively bias the electron rejection grid by an electron rejection voltage. In addition, an ion current meter, configured in the controller 1050, can be coupled to the ion current collector to measure the ion current.

A plurality of test chips 1020 can be removably coupled at one or more second locations on the top surface of the IE-sensor wafer 1000, and the second locations can be proximate to the first locations. For example, the test chips 1020 can include one or more of the feature stacks (505a, 506a, 507a, 505b, 506b, 507b) or one or more of the gate stacks (605a, 606a, 607a, 605b, 606b, 607b).

Figure 11:
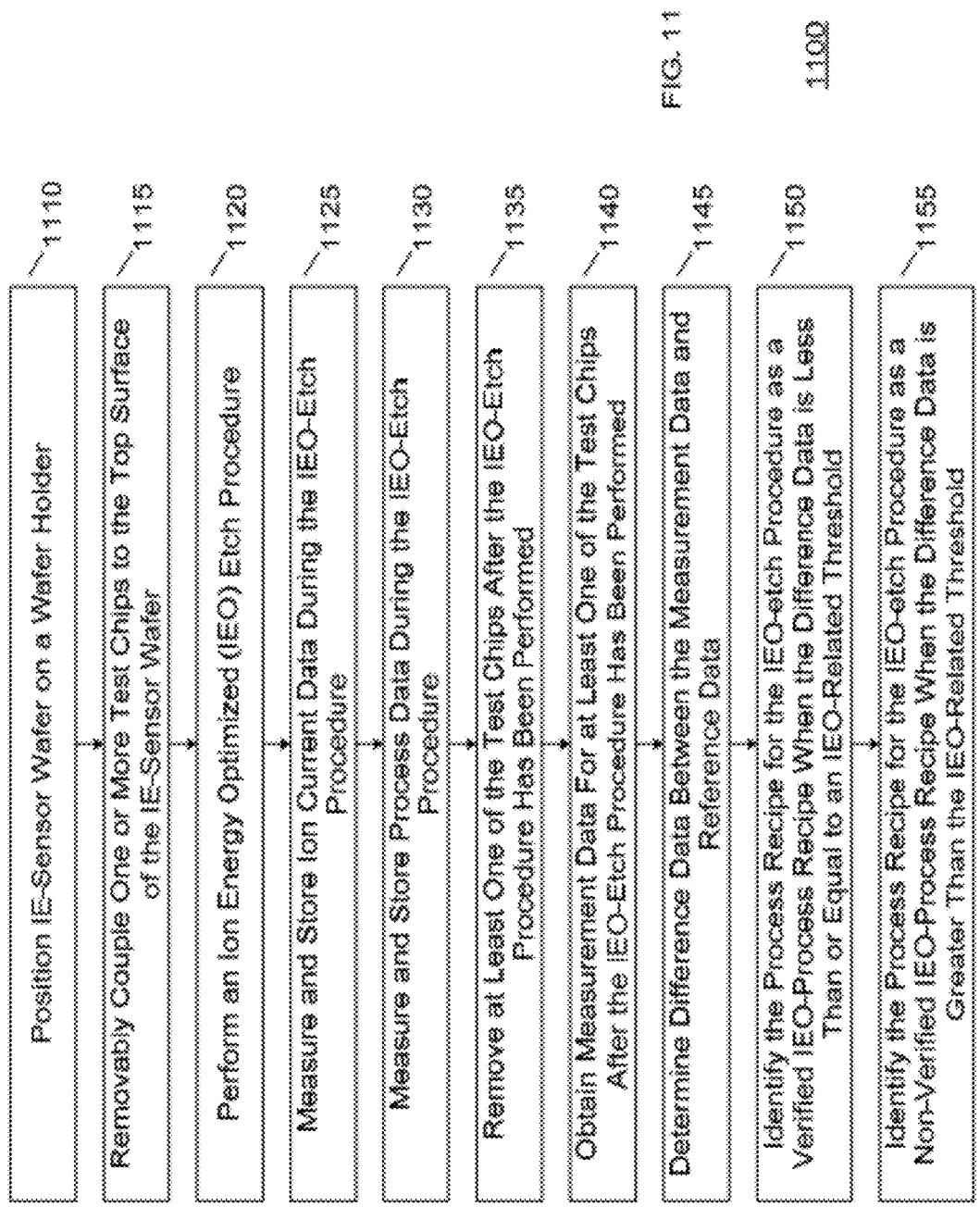
FIG. 11 illustrates a method for using an IE-sensor wafer in accordance with embodiments of the invention.

FIG. 11 illustrates a method for using an IE-sensor wafer in accordance with embodiments of the invention.

In 1110, an IE-sensor wafer 1000 can be positioned on a wafer holder (220, FIG. 2 or 320, FIG. 3) in a IEC-process chamber (210, FIG. 2 or 310, FIG. 3) configured in a IEC etching subsystem shown in FIGS. 2A-2G or FIGS. 3A-3G.

In 1115, one or more test chips 1020 can be removably coupled at one or more second locations on the top surface of the IE-sensor wafer 1000, and the second locations can be proximate to the first locations. For example, the test chips 1020 can include one or more of the feature stacks (505a, 506a, 507a, 505b, 506b, 507b) or one or more of the gate stacks (605a, 606a, 607a, 605b, 606b, 607b).

In 1120, an (Ion Energy Optimized) IEO-etch procedure can be performed in which an (Ion Energy Optimized) IEO-plasma is created in at least one of the IEC-process chambers (210, FIG. 2 or 310, FIG. 3).

In 1125, when the ion energy analyzers 1010 configured in the IE-sensor wafer 1000 comprise ion current collectors the ion current received by the ion current collector can be measured by the controller 1050, and the ion current can stored as a function of the ion selection voltage on the ion selection grid. For example, the ion current collector can provide a dual function of receiving ion current for measurement and selecting the ions that contribute to the received ion current.

When the ion energy analyzer 1010 includes an entrance grid, the entrance grid can be exposed to plasma at a floating DC potential. When the ion energy analyzer 1010 includes an electron rejection grid proximate to the entrance grid, the electron rejection grid can be biased with a negative DC voltage to reject electrons from the plasma. When the ion energy analyzer 1010 includes an ion current collector proximate to the electron rejection grid, the ion current collector can be biased with a positive DC voltage, from the controller 1050, to discriminate between ions reaching the ion current collector. When the IEO-plasma is created, one or more selected ion currents at the ion current collector can be measured by the controller 1050. For example, the selected ion current can be stored, by the controller 1050, as a function of the positive DC voltage on the ion current collector, and the positive DC voltage on the ion current collector can be varied. Then, the stored ion current data as a function of the ion selection voltage may be integrated, by the controller 1050, to determine an IED to associate with the test circuit.

In 1130, process data can be measured and stored during the IEO-etch procedure. For example, one or more process sensors (236, FIG. 2) or (336, FIG. 3) can be coupled to IEC process chamber (210, FIG. 2) or (310, FIG. 3) to obtain performance data, and controller 1050 can be coupled to the process sensors (236, FIG. 2) or (336, FIG. 3) to receive and analyze the performance data.

In 1135, one or more of the test chips 1020 can be removed from the IE-sensor wafer after the IEO-etch procedure has been performed.

In 1140, measurement data can be obtained for one or more of the test chips 1020 after the test chip 1020 has been removed from the IE-sensor wafer and the IEO-etch procedure has been performed. For example, Critical Dimension—Scanning Electron Microscopy (CD-SEM) data can be obtained, ODP data can be obtained, and Transmission Electron Microscopy (TEM) data can be obtained.

In 1145, IE-related difference data can be determined using the measurement data and IE-related reference data. For example, the IE-related reference can be obtained from an IE-related data library.

In 1150, the process recipe associated with the IEO-etch procedure can be identified as a verified IEO-process recipe when the difference data is less than or equal to an IEO-related threshold.

In 1155, the process recipe associated with the IEO-etch procedure can be identified as a non-verified IEO-process recipe when the difference data is greater than the IEO-related threshold.

FIG. 12 illustrates a first set of Ion Energy Distribution (IED) data in accordance with embodiments of the invention. In the illustrated embodiment, first Ion Energy Distribution (IED) data 1200 is shown in which the measured IED (A/eV) data 1201 and the reference IED (A/eV) data 1202 are plotted versus the Energy (eV) for a first IEO etch procedure. A first measured upper data point 1202, a second measured upper data point 1204, and a third measured upper data point 1206 are shown for the first measured IED graph 1201, and one or more of the measured upper data points (1202, 1204, and 1206) can be used to characterize the first IEO etch procedure. For example, first error values can be calculated between the measured upper data points (1202, 1204, and 1206) on the measured IED graph 1201 and the corresponding points on the reference graph 1202, and one or more of the first error values can be used to optimize and/or characterize the first IEO etch procedure. A first measured lower data point 1212, a second measured lower data point 1214, and a third measured lower data point 1216 are shown for the first measured IED graph 1201, and one or more of the measured lower data points (1212, 1214, and 1216) can be used to characterize the first IEO etch procedure. In addition, additional first error values can also be calculated between the measured lower data points (1212, 1214, and 1201) on the measured IED graph 1201 and the corresponding points on the reference graph 1202, and one or more of the additional first error values can be used to optimize and/or characterize the first IEO etch procedure.

A measured lower difference value 1222 and a measured upper difference value 1255 are shown for the first IED graph 1200, and one or more of the measured difference values (1222 and 1250) can be used to characterize the first IEO etch procedure. For example, second error values can be calculated between the measured difference values (1222 and 1250) on the measured IED graph 1201 and the corresponding difference values (not shown) on the reference graph 1202 and one or more of the second error values can be used to optimize and/or characterize the first IEO etch procedure.

A first measured peak data point 1231, a second measured peak data point 1232, and a measured peak separation value 1235 are shown for the first IED graph 1200, and one or more of the measured peak data points (1231 and 1232) and/or the measured peak separation value 1235 can be used to characterize the first IEO etch procedure. For example, third error values can be calculated between the measured peak data points (1231 and 1232) on the measured IED graph 1201 and the corresponding points on the reference graph 1202, and one or more of the third error values can be used to optimize and/or characterize the first IEO etch procedure. Additional third error values can be calculated between the measured peak separation value 1235 on the measured IED graph 1201 and the corresponding peak separation values on the reference graph 1202, and one or more of the additional third error values can be used to optimize and/or characterize the first IEO etch procedure.

A first measured valley data point 1250 is shown for the first IED graph 1200, and one or more of the measured valley data point 1250 can be used to characterize the first IEO etch procedure. For example, fourth error values can be calculated between the measured valley data points 1250 on the measured IED graph 1201 and the corresponding valley points on the reference graph 1202, and one or more of the fourth error values can be used to optimize and/or characterize the first IEO etch procedure.

In addition, average values can be calculated, threshold values can be calculated, and/or limit values can be calculated for the data points (1202, 1204, 1206, 1212, 1214, and 1216), the difference values (1222, 1224, and 1226), and the peak data points (1232, 1234, and 1236).

The CD DV can be a critical DV and can have associated DVs that modify the measurement due to the mechanisms at work during the IEC-etch sequences. SWA can be a primary modifier that increases in sensitivity as the angle become less than ninety degrees. In addition, the middle CD can be used if it gives the most accurate correlation to the final CD. Middle CD performs the best in simple terms because it averages the variation of the top and bottom CD measurements.

A second modifier of CD can be the BARC thickness variation across the wafer and water-to-wafer. BARC thickness can affect CD if the thickness is non-uniform because during the BARC etch the resist is continuing to be etched. A thinner BARC can give a shorter etch time, and thicker BARC can give a longer etch time, and a longer etch time will result in a smaller CD. Therefore, BARC non-uniformity can directly result in increased center to edge CD variation that will need to be modeled for control during the partial and final etch.

In addition, process sensor and IE-sensor data can be used for DVs indicating a predicted plasma chamber state. For example, when lots (wafers) are being processed without using conditioning wafers, the chamber state can be affected by drift. Variations that contribute to chamber state feed forward DV can include events such as chamber cleans, parts replacements, chemical changes, idle time, conditioning wafers, chamber pause, manual adjustments, wafer material changes, and product density changes. The process sensor and IE-sensor data can be filtered and/or qualified. For example, the measurement DVs can be filtered using a box and whisker algorithm that eliminates sites that do not statistically appear to be of the same population, and the remaining sites can be averaged to represent the physical area of the wafer.

IEO-process recipes can be defined for the IEC-etch sequence using one or more of the MVs established during the IEC-MIMO model optimization, and the current process recipes can be adjusted using the new values for the MVs. Nonlinear optimization can be used to treat nonlinear relationships and constraints associated with etch processes to maximize performance of the IEC-etch sequence by adjusting the recipes after each run.

The IM data can be fed forward to one or more optimization controllers to calculate the value of manipulated variables (MV). The nonlinear model formulas associated with each controlled variable (CV) can be used with each CV target value. A quadratic objective function can utilize weighting factors to prioritize each CV term in the objective function, and an optimizer in the IEC-MIMO can be used to determine etch recipe by minimizing or maximizing the objective function with the constraints of MVs using nonlinear programming.

In some examples, one or more of the wafers can be processed using the adjusted recipes. For example, the adjusted recipes can include optimized MVs from the optimizer for the IEC-etch sequence. Then, measurement data can be obtained for one or more of the processed wafers. For example, measurements can be made at one or more sites on the wafer. The output CVs can be measured using the IM tool after the poly-etch sequence is performed and/or after the metal-gate-etch sequence is performed. The data obtained from the IEC-etch sequence can be filtered and/or qualified. In addition, a process error can be calculated for the IEC-etch sequence. For example, errors (actual outputs minus model outputs) can be calculated for each CV. Next, feedback data items can be calculated for the IEC-etch sequence, and errors can be used to update the IEC-MIMO model CVs offsets using an exponentially weighted moving average (EWMA) filter. Then, new model offsets can be updated for the IEC-etch sequence and these offset values can be provided to the optimization controller to be used for compensating the disturbance for next run. For example, this offset can be used until a new update is calculated, and this procedure can be performed until the final patterned wafer is processed.

When send-ahead wafer are used, IM data can be obtained at intermediate points in the IEC-etch sequence. When new and/or additional measurement data, inspection data, and/or evaluation data is required, additional IM data can be obtained from one or more sites on the wafer. For example, measurement structures, such as periodic gratings, periodic arrays, and/or other periodic structures, on a wafer can be measured at one or more sites.

In some embodiments, the historical and/or real-time data can include IE maps, wafer-related maps, process-related maps, damage-assessment maps, reference maps, measurement maps, prediction maps, risk maps, inspection maps, verification maps, evaluation maps, particle maps, and/or confidence map(s) for one or more wafers. In addition, some IEO-etch procedures may use wafer maps that can include one or more Goodness Of Fit (GOF) maps, one or more thickness maps, one or more gate-related maps, one or more Critical Dimension (CD) maps, one or more CD profile maps, one or more material related maps, one or more structure-related maps, one or more sidewall angle maps, one or more differential width maps, or a combination thereof.

When wafer maps are created and/or modified, values may not be calculated and/or required for the entire wafer, and a wafer map may include data for one or more sites, one or more chip/dies, one or more different areas, and/or one or more differently shaped areas. For example, a processing chamber may have unique characteristics that may affect the quality of the processing results in certain areas of the wafer. In addition, a manufacturer may allow less accurate process and/or evaluation data for chips/dies in one or more regions of the wafer to maximize yield. When a value in a map is close to a limit, the confidence value may be lower than when the value in a map is not close to a limit. In addition, the accuracy values can be weighted for different chips/dies and/or different areas of the wafer. For example, a higher confidence weight can be assigned to the accuracy calculations and/or accuracy data associated with one or more of the previously used evaluation sites.

In addition, process result, measurement, inspection, verification, evaluation, and/or prediction maps associated with one or more processes may be used to calculate a confidence map for a wafer. For example, values from another map may be used as weighting factors.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

Thus, the description is not intended to limit the invention and the configuration, operation, and behavior of the present invention has been described with the understanding that modifications and variations of the embodiments are possible, given the level of detail present herein. Accordingly, the preceding detailed description is not mean or intended to, in any way, limit the invention—rather the scope of the invention is defined by the appended claims.

What is claimed:

1. A method for processing a wafer comprising:
receiving, by a processing system, a first set of patterned wafers and associated Ion Energy (IE) data, each patterned wafer having a first patterned soft-mask layer and a plurality of additional layers thereon;
selecting a first patterned wafer from the first set of patterned wafers;
establishing a first Ion Energy (IE)-related process sequence for the selected patterned wafer using the IE data;
determining if the first IE-related process sequence includes a first Ion Energy Controlled (IEC)-etch sequence;
performing the first IEC-etch sequence when the first IE-related process sequence includes the first IEC-etch sequence, wherein a second set of patterned wafers are created when the first IEC-etch sequence is performed using the first set of patterned wafers;
performing at least one corrective action when the first IE-related process sequence does not include the first IEC-etch sequence; and
determining if the first IE-related process sequence includes a second IEC-etch sequence and a third IEC-etch sequence;
performing the second IEC-etch sequence and the third IEC-etch sequence when the first IE-related process sequence includes the second IEC-etch sequence and the third IEC-etch sequence, wherein a fourth set of patterned wafers are created when the first IEC-etch sequence, the second IEC-etch sequence, and the third IEC-etch sequence are performed using the first set of patterned wafers; and
performing a validation procedure when the first IE-related process sequence does not include the second IEC-etch sequence and the third IEC-etch sequence.

2. The method of claim 1, further comprising:
determining if the first IEC-etch sequence includes a first Ion Energy Optimized (IEO)-etch procedure;
performing the first IEO-etch procedure when the first IEC-etch sequence includes the first IEO-etch procedure, wherein the first IEO-etch procedure uses a first etch subsystem having a first Ion Energy Controlled (IEC) process chamber configured therein and a first Multi-Input/Multi-Output (MIMO) controller coupled thereto; and
performing a first corrective action when the IEC-etch sequence does not include the first IEO-etch procedure.

3. The method of claim 2, wherein performing the first IEO-etch procedure comprises:
selecting a patterned wafer from the first set of patterned wafers;
positioning the selected patterned wafer on a first wafer holder in the first IEC-process chamber;
creating a first Ion Energy Optimized (IEO) plasma in the first IEC-process chamber;
processing the selected patterned wafer using the first IEO plasma; and obtaining first IE-sensor data while the selected patterned wafer is processed, wherein a first Ion Energy (IE) sensor is coupled to the first IEC-process chamber and is configured to obtain the first IE-sensor data.

4. The method of claim 3, further comprising:
determining if the first IEC-etch sequence includes a second IEO etch procedure;
performing the second IEO etch procedure when the first IEC-etch sequence includes the second IEO etch procedure, wherein the second IEO etch procedure uses a second etch subsystem having a second IEC-process chamber configured therein and a second MIMO controller coupled thereto; and
performing a first validation procedure when the IEC-etch sequence does not include the second IEO etch procedure.

5. The method of claim 4, wherein performing the second IEO etch procedure comprises:
selecting an etched patterned wafer from a first set of etched patterned wafers;
positioning the selected etched patterned wafer on a second wafer holder in the second IEC-process chamber;
creating a second IEO plasma in the second IEC-process chamber;
processing the selected etched patterned wafer using the second IEO plasma; and
obtaining second IE-sensor data while the selected etched patterned wafer is processed, wherein a second IE-sensor is coupled to the second IEC-process chamber and is configured to obtain the second IE-sensor data.

6. The method of claim 3, wherein creating the first IEO plasma comprises:
establishing a first chamber pressure in the first Ion Energy Controlled (IEC) process chamber, wherein the first chamber pressure ranges from approximately 12 mT to approximately 18 mT;
establishing a first edge temperature and a first center temperature for the first wafer holder for a first time, the first center temperature being between about 12 degrees Celsius and about 20 degrees Celsius, the first edge temperature being between about 8 degrees Celsius and about 12 degrees Celsius during the first time;
establishing a first edge backside pressure and a first center backside pressure using a dual backside gas system in the first wafer holder, the first center backside pressure being between about 15 Torr and about 25 Torr, the first edge backside pressure being between about 27 Torr and about 33 Torr;
providing a first process gas into the first IEC process chamber during the first time, wherein the first process gas includes $CF_4$ and $CHF_3$, a $CF_4$ flow rate varying between about 60 sccm and about 100 sccm and a first $CHF_3$ flow rate varying between about 40 sccm and about 60 sccm, wherein a gas plenum in the first IEC process chamber is configured to provide the first process gas to one or more areas of a processing region (249, 349);
providing a first radio frequency (RF) power to a center region in the first IEC process chamber and providing a second RF power to an edge region in the first IEC process chamber using a first power splitter coupled to two upper electrodes in the first IEC process chamber, wherein a first RF source is coupled to the first power splitter, the first RF source operating in a frequency range from about 0.1 MHz, to about 200 MHz, the first RF power ranging from about 450 watts to about 550 watts and the second RF power ranging from about 10 watts to about 100 watts during the first time; and
providing a lower radio frequency (RF) power to a lower electrode in the first wafer holder using an RF generator and an impedance match network, the RF generator operating in a first frequency range from about 0.1 MHz, to about 200 MHz, the lower RF power ranging from about 450 watts to about 550 watts and the lower RF power ranging from about 90 watts to about 110 watts during the first time.

7. The method of claim 1, further comprising:
determining if the first IE-related process sequence includes a second IEC-etch sequence;
performing the second IEC-etch sequence when the first IE-related process sequence includes the second IEC-etch sequence, wherein a third set of patterned wafers are created when the first IEC-etch sequence and the second IEC-etch sequence are performed using the first set of patterned wafers; and
performing a validation procedure when the first IE-related process sequence does not include the second IEC-etch sequence.

8. The method of claim 7, further comprising:
determining if the second IEC-etch sequence includes a new first Ion Energy Optimized (IEO) etch procedure;
performing the new first IEO etch procedure when the second IEC-etch sequence includes the new first IEO etch procedure, wherein the new first IEO etch procedure uses a new first etch subsystem having a new first IEC-process chamber configured therein and a new first MIMO controller coupled thereto; and
performing a new first validation procedure when the second IEC-etch sequence does not include the new first IEO etch procedure.

9. The method of claim 8, wherein performing the new first IEO etch procedure comprises:
selecting a second patterned wafer from a second set of patterned wafers;
positioning the selected second patterned wafer on a second wafer holder in the second IEC-process chamber;
creating a second IEO plasma in the second IEC-process chamber;
processing the selected second patterned wafer using the second IEO plasma; and
obtaining second IE-sensor data while the selected second patterned wafer is processed, wherein a second IE-sensor is coupled to the second IEC-process chamber and is configured to obtain the second IE-sensor data.

10. The method of claim 9, further comprising:
determining if the second IEC-etch sequence includes a new second IEO etch procedure;
performing the new second IEO etch procedure when the second IEC-etch sequence includes the new second IEO etch procedure, wherein the new second IEO etch procedure uses a new second etch subsystem having a new second IEC-process chamber configured therein and a new second MIMO controller coupled thereto; and
performing a new second validation procedure when the second IEC-etch sequence does not include the new second IEO etch procedure.

11. The method of claim 10, wherein performing the second IEO etch procedure comprises:
selecting an etched second patterned wafer from a first set of etched second patterned wafers;
positioning the selected etched second patterned wafer on a new second wafer holder in the new second IEC-process chamber;

creating a new second IEO plasma in the new second IEC-process chamber;

processing the selected second etched patterned wafer using the new second IEO plasma; and obtaining new second IE-sensor data while the selected second etched patterned wafer is processed, wherein a new second IE-sensor is coupled to the new second IEC-process chamber and is configured to obtain the new second IE-sensor data.

12. The method of claim 1, further comprising:

determining if the second IEC-etch sequence includes a new first IEO-etch procedure;

performing the new first IEO-etch procedure when the second IEC-etch sequence includes the new first IEO-etch procedure, wherein the new first IEO-etch procedure uses a new first etch subsystem having a new Ion Energy Controlled (IEC)-process chamber configured therein and a new first MIMO controller coupled thereto; and performing a new first validation procedure when the second IEC-etch sequence does not include the first IEO-etch procedure.

13. The method of claim 1, further comprising:

determining if the third IEC-etch sequence includes a new first IEO-etch procedure;

performing the new first IEO-etch procedure when the third IEC-etch sequence includes the new first IEO-etch procedure, wherein the new first IEO-etch procedure uses a new first etch subsystem having a new Ion Energy Controlled (IEC)-process chamber configured therein and a new first MIMO controller coupled thereto; and performing a new first validation procedure when the second IEC-etch sequence does not include the first IEO-etch procedure.

14. The method of claim 1, further comprising:

creating first simulation data for the first IEC-etch sequence using a first Ion Energy Controlled Multi-Input/Multi-Output (IEC-MIMO) model, wherein the first IEC-MIMO includes a first number ($N_a$) of first Controlled Variables ($CV_{1a}, CV_{2a}, \ldots CV_{Na}$), a second number ($M_a$) of first Manipulated Variables ($MV_{1a}, MV_{2a}, \ldots MV_{Ma}$), and a third number ($L_a$) of first Disturbance Variables ($DV_{1a}, DV_{2a}, \ldots DV_{La}$), wherein ($L_a$, $M_a$, and $N_a$) are integers greater than one;

obtaining first IE-sensor data during the first IEC-etch sequence, wherein a first Ion Energy (IE) sensor is coupled to a first Ion Energy Controlled (IEC)-process chamber;

establishing first difference data by comparing the first simulation data to the first IE-sensor data;

verifying the first IEC-etch sequence when the first difference data is less than or equal to first threshold data; and storing the first simulation data and/or the first IE-sensor data when the first difference data is greater than the first threshold data.

15. The method of claim 14, further comprising;

determining risk data for the first IEC-etch sequence using the first difference data;

identifying the first IEC-etch sequence as a verified sequence when the risk data is less than a first risk limit; and identifying the first IEC-etch sequence as a non-verified sequence when the risk data is not less than the first risk limit.

16. The method of claim 1, wherein the first IEC-etch sequence comprises an Ion Energy Optimized (IEO) hard mask etching procedure and an IEO width control etching procedure.

17. The method as claimed in claim 1, wherein the first set of patterned wafers include pFET structures, nFET structures, Tri-gate structures, and FinFET structures.

18. A method for processing a wafer using an Ion Energy (IE) controlled processing chamber, the method comprising:

positioning an Ion Energy (IE) sensor wafer on a wafer holder in the IEC processing chamber;

removably coupling one or more test chips to a top surface of the IE-sensor wafer;

performing an Ion Energy Optimized (IEO) etch procedure in the IEC processing chamber;

measuring ion energy data and process data during the IEO etch procedure;

removing at least one of the test chips after the IEO etch procedure has been performed;

obtaining measurement data for one or more of the test chips;

determining difference data between the measurement data and reference data;

identifying a process recipe for IEO etch procedure as a verified IEO process recipe when the difference data is less than or equal to an IEO-related threshold; and identifying the process recipe for IEO etch procedure as a non-verified IEO process recipe when the difference data is greater than the IEO-related threshold.

* * * * *